(12) United States Patent
Kubota et al.

(10) Patent No.: US 10,775,681 B2
(45) Date of Patent: Sep. 15, 2020

(54) ULTRASONIC MOTOR, DRIVE CONTROL SYSTEM, OPTICAL APPARATUS, AND VIBRATOR

(71) Applicant: CANON KABUSHIKI KAISHA, Tokyo (JP)

(72) Inventors: Makoto Kubota, Yokohama (JP); Akira Uebayashi, Tokyo (JP); Tatsuo Furuta, Machida (JP); Shinya Koyama, Tokyo (JP); Jumpei Hayashi, Yokohama (JP); Hidenori Tanaka, Tokyo (JP)

(73) Assignee: Canon Kabushiki Kaisha, Tokyo (JP)

( * ) Notice: Subject to any disclaimer, the term of this patent is extended or adjusted under 35 U.S.C. 154(b) by 112 days.

(21) Appl. No.: 15/346,992

(22) Filed: Nov. 9, 2016

(65) Prior Publication Data
US 2017/0153531 A1    Jun. 1, 2017

(30) Foreign Application Priority Data
Nov. 27, 2015    (JP) ................. 2015-231915

(51) Int. Cl.
G03B 13/34    (2006.01)
G02B 7/08    (2006.01)
(Continued)

(52) U.S. Cl.
CPC ............ G03B 13/34 (2013.01); G02B 7/04 (2013.01); G02B 7/08 (2013.01); H01L 41/042 (2013.01);
(Continued)

(58) Field of Classification Search
CPC . G02B 7/04; G02B 7/08; G02B 7/102; G02B 7/023; G02B 7/10; H02K 41/0356; G11B 7/0932; G11B 7/0935
(Continued)

(56) References Cited

U.S. PATENT DOCUMENTS 5,099,167 A    3/1992    Kimura et al.
5,128,580 A    7/1992    Maeno et al.
(Continued)

FOREIGN PATENT DOCUMENTS

JP    5322431 B2    10/2013
JP    5344456 B2    11/2013
(Continued)

OTHER PUBLICATIONS

Xue, et al., "Elastic, piezoelectric, and dielectric properties of Ba(Zr0.2Ti0.8)O3-50(Ba0.7Ca0.3)TiO3 Pb-free ceramic at the morphotropic phase boundary", AIP Journal of Applied Physics, vol. 109, 2011, pp. 054110-1 to 054110-6.
(Continued)

*Primary Examiner* — Joseph P Martinez
*Assistant Examiner* — Vipin Patel
(74) *Attorney, Agent, or Firm* — Venable LLP

(57) ABSTRACT

Provided is an ultrasonic motor including an annular vibrator and an annular moving member that is brought into pressure-contact with the vibrator. The vibrator includes an annular vibrating plate and an annular piezoelectric element. The piezoelectric element includes an annular lead-free piezoelectric ceramic piece, a common electrode arranged on one surface of the piezoelectric ceramic piece, and a plurality of electrodes arranged on the other surface of the piezoelectric ceramic piece. The plurality of electrodes include two drive phase electrodes, one or more non-drive phase electrodes, and one or more detection phase electrodes. A second surface of the vibrating plate includes a plurality of groove regions extending radially, and the depths of the groove regions change in a circumferential direction along a curve obtained by superimposing one or more sine waves on one another. The ultrasonic motor exhibits a
(Continued)

sufficient drive speed while suppressing generation of an unnecessary vibration wave.

24 Claims, 14 Drawing Sheets

(51) Int. Cl.
    *G02B 7/04*     (2006.01)
    *H01L 41/04*     (2006.01)
    *H01L 41/047*     (2006.01)
    *H01L 41/09*     (2006.01)
    *H01L 41/16*     (2006.01)
    *H01L 41/187*     (2006.01)

(52) U.S. Cl.
    CPC ............ *H01L 41/047* (2013.01); *H01L 41/09* (2013.01); *H01L 41/16* (2013.01); *H01L 41/1878* (2013.01)

(58) Field of Classification Search
    USPC .................................................. 359/822–826
    See application file for complete search history.

(56) References Cited

U.S. PATENT DOCUMENTS

| | | | |
|---|---|---|---|
| 5,155,407 A | 10/1992 | Kimura et al. | |
| 5,241,234 A | 8/1993 | Seki et al. | |
| 5,274,294 A | 12/1993 | Kimura et al. | |
| 5,455,478 A | 10/1995 | Kimura et al. | |
| 5,583,390 A | 12/1996 | Seki et al. | |
| 6,229,245 B1* | 5/2001 | Kitani ..................... | H02N 2/14 |
| | | | 310/316.02 |
| 6,288,475 B1* | 9/2001 | Ito .......................... | H02N 2/147 |
| | | | 310/323.01 |
| 8,182,713 B2 | 5/2012 | Xiaobing et al. | |
| 8,391,701 B1 | 3/2013 | Wu | |
| 8,604,667 B2 | 12/2013 | Iino et al. | |
| 9,144,971 B2 | 9/2015 | Watanabe et al. | |
| 9,166,140 B2 | 10/2015 | Tanaka et al. | |
| 9,306,150 B2 | 4/2016 | Tanaka et al. | |
| 2005/0122862 A1* | 6/2005 | Shin ....................... | G11B 7/1353 |
| | | | 369/44.41 |
| 2014/0343387 A1 | 11/2014 | Pugh et al. | |
| 2015/0015121 A1 | 1/2015 | Watanabe et al. | |
| 2015/0015642 A1* | 1/2015 | Tanaka ................ | H01L 41/0973 |
| | | | 347/44 |
| 2015/0326147 A1 | 11/2015 | Shimizu et al. | |
| 2016/0118914 A1 | 4/2016 | Ifuku et al. | |
| 2017/0153410 A1* | 6/2017 | Hayashi ..................... | G02B 7/04 |
| 2017/0155031 A1* | 6/2017 | Furuta ....................... | G02B 7/04 |

FOREIGN PATENT DOCUMENTS

| | | |
|---|---|---|
| TW | 201223115 A1 | 6/2012 |
| TW | M445304 U1 | 1/2013 |
| TW | 201321826 A1 | 6/2013 |
| TW | 201436446 A | 9/2014 |
| TW | 201502078 A | 1/2015 |
| TW | 201514572 A | 4/2015 |

OTHER PUBLICATIONS

Nagakura et al., Iwanami Dictionary of Physics and Chemistry, definitions of "perovskite" and "perovskite structure", Fifth Edition, Feb. 20, 1998, 3 pages.

Taiwan IPO Office Action and Search Report dated May 15, 2017, in Taiwan Patent Application No. 105137099.

* cited by examiner

101a 1011  1012
   101

ULTRASONIC MOTOR, DRIVE CONTROL SYSTEM, OPTICAL APPARATUS, AND VIBRATOR

BACKGROUND OF THE INVENTION

Field of the Invention

The present invention relates to an ultrasonic motor, to a drive control system and an optical apparatus that use the ultrasonic motor, and further, to a vibrator to be used in the ultrasonic motor.

Description of the Related Art

A vibration-type (vibrational wave) actuator includes a vibrator configured to excite vibration in an elastic body having an annular shape, an elliptical oval shape, a bar shape, or the like, which is joined to an electromechanical energy converting element, e.g., a piezoelectric element, by applying an electric signal, e.g., alternating voltage to the electromechanical energy converting element. The vibration-type actuator is used, for example, as an ultrasonic motor configured to relatively move an elastic body (moving member) that is brought into pressure-contact with the vibrator to the vibrator (static member) through use of the drive force of the vibration excited in the vibrator.

Now, an overview of the structure and drive principle of an annular ultrasonic motor that is a typical usage form of the vibration-type actuator is described. In the following description, the term "annular" is intended to mean that an annular article or element can be schematically regarded as a configuration in which a disc having a predetermined thickness includes a circular through hole concentrically. In this case, the dimension of the annular article or element corresponding to the thickness of the disc is referred to as "thickness" of the article or element, and surfaces of the annular article or element corresponding to both surfaces of the disc that hold the thickness of the disc are individually or generically referred to as "surfaces" of the article or element.

The annular ultrasonic motor includes an annular vibrator and an annular moving member that is brought into pressure-contact with the vibrator. The moving member is formed of an elastic body, and a metal is generally used as a material for the moving member. The vibrator includes an annular vibrating plate and an annular piezoelectric element arranged on one surface of the vibrating plate. The vibrating plate is formed of an elastic body, and a metal is generally used as a material for the vibrating plate. The piezoelectric element includes, on one surface of an annular piezoelectric ceramics, an electrode divided into a plurality of regions along the circumferential direction of the annular ring and one common electrode on the other surface thereof. A lead zirconate titanate-based material is generally used as a material for the piezoelectric ceramics.

The electrode divided into a plurality of regions includes two regions forming drive phase electrodes, at least one region forming a detection phase electrode, and a region forming a non-drive phase electrode, which is arranged as necessary. Wiring configured to input electric power for applying an electric field to a corresponding region of the annular piezoelectric ceramics that is brought into contact with each drive phase electrode is arranged in each drive phase electrode, and the wiring is connected to a power source unit.

A circle that passes through an arbitrary position on the surface of the annular piezoelectric element and shares the center with the annular ring is assumed, and the length of one arc obtained by dividing the circumference of the circle by n (n is a natural number) is represented by $\lambda$, and the circumferential length of the circle is represented by $n\lambda$. A region of the piezoelectric ceramics corresponding to the region forming each drive phase electrode is subjected to polarization treatment in advance by applying an electric field to the piezoelectric ceramics in a thickness direction thereof alternately in an opposite direction at a pitch of $\lambda/2$ along the circumferential direction. Therefore, when an electric field in the same direction is applied to the piezoelectric ceramics in the thickness direction with respect to all the regions, the expansion and contraction polarity of the piezoelectric ceramics in the regions is reversed alternately at a pitch of $\lambda/2$. The two regions forming the respective drive phase electrodes are arranged at a distance of an odd multiple of $\lambda/4$ in the circumferential direction. In general, two regions (spacing regions) that separate the two drive phase electrodes from each other include non-drive phase electrodes that are short-circuited to a common electrode so that piezoelectric vibration is not caused spontaneously, with the result that an electric field is not applied to the piezoelectric ceramics in those regions. In general, a detection phase electrode is arranged in the spacing region as described later.

When an alternating voltage is applied to only one of the drive phase electrodes of such an ultrasonic motor, a first standing wave having a wavelength $\lambda$ is generated over the entire circumference of the vibrator. When an alternating voltage is applied to only the other drive phase electrode, a second standing wave is generated similarly, but the position of the wave is rotated and moved by $\lambda/4$ in the circumferential direction with respect to the first standing wave. Meanwhile, when alternating voltages, which have the same frequency and a temporal phase difference of $\pi/2$, are applied to the respective drive phase electrodes, a propagating wave (wave number along the annular ring: n and wavelength: $\lambda$) of bending vibration (vibration having an amplitude perpendicular to the surface of the vibrator), which propagates in the circumferential direction over the entire circumference, is generated in the vibrator as a result of the synthesis of both the standing waves.

When the propagating wave of the bending vibration (hereinafter sometimes simply referred to as "bending vibration wave") is generated, each point on the surface of the vibrating plate forming the vibrator undergoes an elliptical motion. Therefore, the moving member that is brought into contact with the surface rotates due to friction force (drive force) in the circumferential direction from the vibrating plate. The rotation direction can be reversed by switching, between positive and negative, a phase difference of the alternating voltage applied to each drive phase electrode. Further, the rotation speed can be controlled by changing the frequency and amplitude of the alternating voltage applied to each drive phase electrode.

The generated bending vibration wave can be detected with the detection phase electrode arranged in the spacing region. That is, the distortion of deformation (vibration) generated in the piezoelectric ceramics brought into contact with the detection phase electrode is converted into an electric signal in accordance with the magnitude of the distortion and output to a drive circuit through the detection phase electrode.

When an alternating voltage is applied to the ultrasonic motor at a frequency higher than a resonant frequency, the ultrasonic motor starts a rotation operation. When the frequency is brought close to the resonant frequency, the rotation is accelerated to reach a highest rotation speed at the resonant frequency. Thus, the ultrasonic motor is generally driven at a desired rotation speed by sweeping the frequency from a frequency region higher than the resonant frequency to the resonant frequency.

However, in the above-mentioned frequency sweep, a bending vibration wave different from a previously set n-th order (wave number: n) bending vibration wave, e.g., a (n−1)-th order or (n+1)-th order bending vibration wave may be generated. Bending vibration waves other than the set vibration wave are referred to as unnecessary vibration waves. The unnecessary vibration waves are caused by low accuracy of a contact surface between the vibrator and the moving member, irregularity of mechanical vibration generated in the moving member, non-uniform distribution of a contact pressure between the vibrator and the moving member, and the like. The unnecessary vibration waves cause the generation of abnormal noise and a decrease in output when the ultrasonic motor is driven.

In Japanese Patent No. 5322431, as a constitution configured to reduce generation of the unnecessary vibration waves, there is described a configuration in which grooves are formed radially on a surface of a vibrating plate on a side that is brought into contact with an annular moving member, and the depth of the grooves changes along a sine wave curve.

Meanwhile, a lead zirconate titanate-based material to be used in the piezoelectric ceramics contains a large amount of lead in an A-site of an $ABO_3$ perovskite type metal oxide. Accordingly, an effect of a lead component on environments has been seen as a problem. In order to deal with this problem, piezoelectric ceramics using a perovskite type metal oxide that does not contain lead (lead content is less than 1,000 ppm) has been proposed.

As piezoelectric ceramics made of a perovskite type oxide that does not contain lead (lead-free), barium titanate ($BaTiO_3$) and a derivative thereof have been known. In Japanese Patent No. 5344456 and "Journal of Applied Physics" 2011, vol. 109, 054110-1 to 054110-6, there is disclosed piezoelectric ceramics in which piezoelectric characteristics are enhanced by substituting a part of an A-site of barium titanate with calcium (Ca) and substituting a part of a B-site thereof with zirconium (Zr).

However, the piezoelectric characteristics are enhanced by increasing a change in piezoelectric characteristics and elasticity with respect to environmental temperature. Therefore, when lead-free piezoelectric ceramics is used in an ultrasonic motor, it is necessary to design peripheral elements in consideration of changes in piezoelectric characteristics and elasticity with respect to temperature. Thus, even when the vibrating plate designed on the premise of being used for the related-art piezoelectric ceramics as in Japanese Patent No. 5322431 is applied to an ultrasonic motor using the lead-free piezoelectric ceramics as in Japanese Patent No. 5344456, the generation of the unnecessary vibration waves cannot be necessarily reduced.

Further, the density of the lead-free piezoelectric ceramics is generally lower than that of the lead zirconate titanate-based material. Therefore, it can be said that even when the vibrating plate designed on the premise of being used for the related-art piezoelectric ceramics as in Japanese Patent No. 5322431 is applied to an ultrasonic motor using the lead-free piezoelectric ceramics as in Japanese Patent No. 5344456, the generation of the unnecessary vibration waves cannot be necessarily reduced.

SUMMARY OF THE INVENTION

The present invention has been made to solve the above-mentioned problems, and it is an object of the present invention to provide an ultrasonic motor in which a sufficient drive speed is exhibited even when lead-free piezoelectric ceramics is used, and generation of unnecessary vibration waves other than a vibration wave of a desired order (for example, a 7th order vibration wave) is suppressed, a drive control system and an optical apparatus that use the ultrasonic motor, and further, a vibrator to be used in the ultrasonic motor.

In order to solve the above-mentioned problems, according to one embodiment of the present invention, there is provided an ultrasonic motor including an annular vibrator; and an annular moving member arranged so as to be brought into pressure-contact with the annular vibrator, in which the annular vibrator includes an annular vibrating plate; and an annular piezoelectric element arranged on a first surface of the annular vibrating plate, the annular vibrating plate being brought into contact with the annular moving member on a second surface on a side opposite to the first surface, in which the annular piezoelectric element includes an annular piezoelectric ceramic piece; a common electrode arranged on a surface of the annular piezoelectric ceramic piece opposed to the annular vibrating plate so as to be sandwiched between the annular piezoelectric ceramic piece and the annular vibrating plate; and a plurality of electrodes arranged on a surface of the annular piezoelectric ceramic piece on a side opposite to the surface on which the common electrode is arranged, in which the annular piezoelectric ceramic piece contains lead in a content of less than 1,000 ppm, in which the plurality of electrodes include two drive phase electrodes, one or more non-drive phase electrodes, and one or more detection phase electrodes, in which the second surface of the annular vibrating plate includes groove regions extending radially in X portions, and when an outer diameter of the annular vibrating plate is set to 2R in units of mm, X is a natural number satisfying 2R−10≤X≤2R+5 and the outer diameter 2R is larger than 55 mm, in which a ratio between an average value $L_{top}$ of a length in a circumferential direction on an outer diameter side of a wall region that separates the adjacent groove regions from each other and an average value $L_{btm}$ of a length in a circumferential direction on an outer diameter side of the groove regions falls within a range of $1.00 \leq L_{top}/L_{btm} \leq 2.86$, and in which, when center depths of the groove regions in the X portions are represented by $D_1$ to $D_X$ in order in the circumferential direction, $D_1$ to $D_X$ change so as to follow a curve obtained by superimposing one or more sine waves on one another, the groove regions reaching a local maximum in 12 or more regions in the change of the center depth and the groove regions reaching a local minimum in 12 or more regions in the change of the center depth, the groove regions reaching the local maximum and the groove regions reaching the local minimum being prevented from being adjacent to each other.

In order to solve the above-mentioned problems, according to another embodiment of the present invention, there is provided a drive control system, including at least the above-mentioned ultrasonic motor and a drive circuit electrically connected to the ultrasonic motor.

In order to solve the above-mentioned problems, according to yet another embodiment of the present invention, there is provided an optical apparatus, including at least the above-mentioned drive control system and an optical element dynamically connected to the ultrasonic motor.

In order to solve the above-mentioned problems, according to still another embodiment of the present invention, there is provided an annular vibrator including an annular vibrating plate; and an annular piezoelectric element arranged on a first surface of the annular vibrating plate, in which the annular piezoelectric element includes an annular piezoelectric ceramic piece; a common electrode arranged on a surface of the annular piezoelectric ceramic piece opposed to the annular vibrating plate so as to be sandwiched between the annular piezoelectric ceramic piece and the annular vibrating plate; and a plurality of electrodes arranged on a surface of the annular piezoelectric ceramic piece on a side opposite to the surface on which the common electrode is arranged, in which the annular piezoelectric ceramic piece contains lead in a content of less than 1,000 ppm, in which the plurality of electrodes include two drive phase electrodes, one or more non-drive phase electrodes, and one or more detection phase electrodes, in which a second surface of the annular vibrating plate includes groove regions extending radially in X portions, and when an outer diameter of the annular vibrating plate is set to 2R in units of mm, X is a natural number satisfying 2R−10≤X≤2R+5 and the outer diameter 2R is larger than 55 mm, in which a ratio between an average value $L_{top}$ of a length in a circumferential direction on an outer diameter side of a wall region that separates the adjacent groove regions and an average value $L_{btm}$ of a length in a circumferential direction on an outer diameter side of the groove regions falls within a range of $1.0 \le L_{top}/L_{btm} \le 2.86$, and in which, when center depths of the groove regions in the X portions are represented by $D_1$ to $D_X$ in order in the circumferential direction, $D_1$ to $D_X$ change so as to follow a curve obtained by superimposing one or more sine waves on one another, the groove regions reaching a local maximum in 12 or more regions in the change of the center depth and the groove regions reaching a local minimum in 12 or more regions in the change of the center depth, the groove regions reaching the local maximum and the groove regions reaching the local minimum being prevented from being adjacent to each other.

According to the present invention, in the ultrasonic motor using the lead-free piezoelectric ceramics or the drive control system and the optical apparatus that use the ultrasonic motor, the generation of the unnecessary vibration waves can be effectively suppressed while a sufficient drive speed is exhibited.

Further features of the present invention will become apparent from the following description of exemplary embodiments with reference to the attached drawings.

DESCRIPTION OF THE EMBODIMENTS

Now, an ultrasonic motor, a drive control system, an optical apparatus, and a vibrator according to embodiments of the present invention are described.

The ultrasonic motor of the present invention has the following features. The ultrasonic motor includes an annular vibrator and an annular moving member that is arranged so as to be brought into pressure-contact with the vibrator. The vibrator includes an annular vibrating plate and an annular piezoelectric element arranged on a first surface (one surface) of the vibrating plate, a second surface (surface on a side opposite to the first surface) of the vibrating plate being brought into contact with the moving member. The piezoelectric element includes an annular piezoelectric ceramic piece (formed in an integrated manner without seams), a common electrode arranged on one surface (on a side opposed to the vibrating plate) of the piezoelectric ceramic piece, and a plurality of electrodes arranged on the other surface (on a side opposite to the surface on which the common electrode is arranged) of the piezoelectric ceramic piece. The piezoelectric ceramic piece contains lead in a content of less than 1,000 ppm. The plurality of electrodes include two drive phase electrodes, one or more non-drive phase electrodes, and one or more detection phase electrodes. A second surface of the annular vibrating plate includes groove regions extending radially in X portions. At this time, the X is a natural number satisfying $2R-10 \leq X \leq 2R+5$ (2R is the outer diameter of the vibrating plate; unit: mm), 2R is larger than 55 mm, and a ratio between an average value $L_{top}$ of a length in a circumferential direction on an outer diameter side of a wall region that separates the adjacent groove regions from each other and an average value $L_{btm}$ of a length in a circumferential direction on an outer diameter side of the groove regions falls within a range of $1.00 \leq L_{top}/L_{btm} \leq 2.86$. When center depths of the groove regions in the X portions are represented by $D_1$ to $D_X$ in order in the circumferential direction, the $D_1$ to the $D_X$ change so as to follow a curve obtained by superimposing one or more sine waves on one another, the groove regions reaching a local maximum in 12 or more regions in the change of the center depth and the groove regions reaching a local minimum in 12 or more regions in the change of the center depth, the groove regions reaching the local maximum and the groove regions reaching the local minimum being prevented from being adjacent to each other.

Figure 1A:
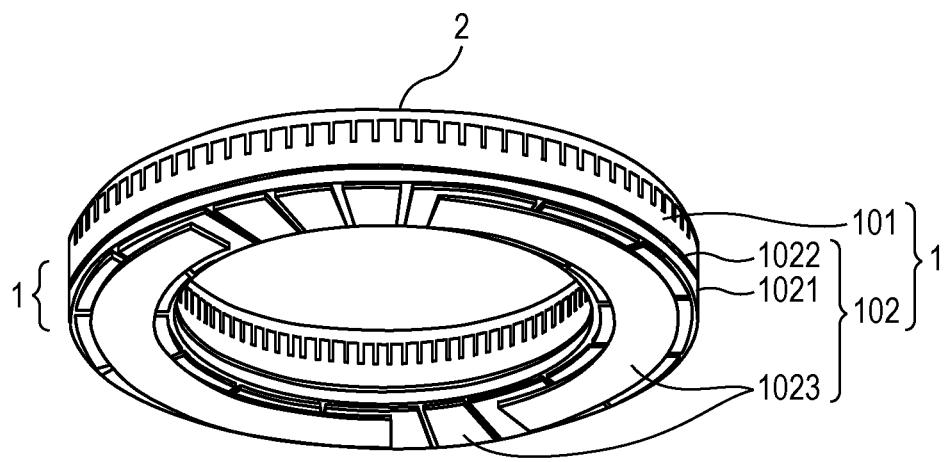
FIG. 1A and FIG. 1B are each a schematic view for illustrating an ultrasonic motor according to an embodiment of the present invention.
Figure 1B:
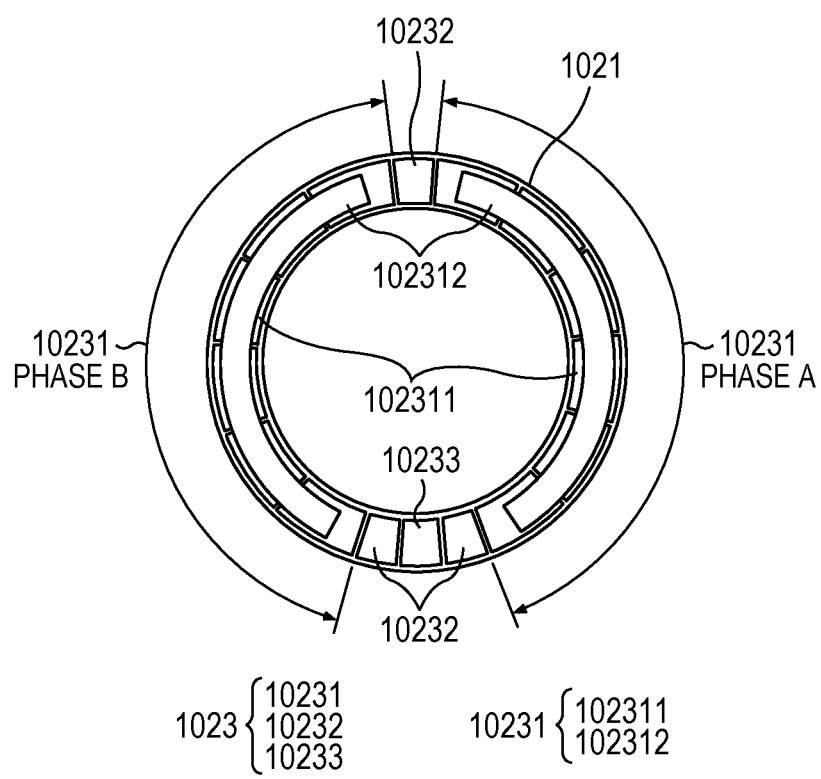
Figure 2:
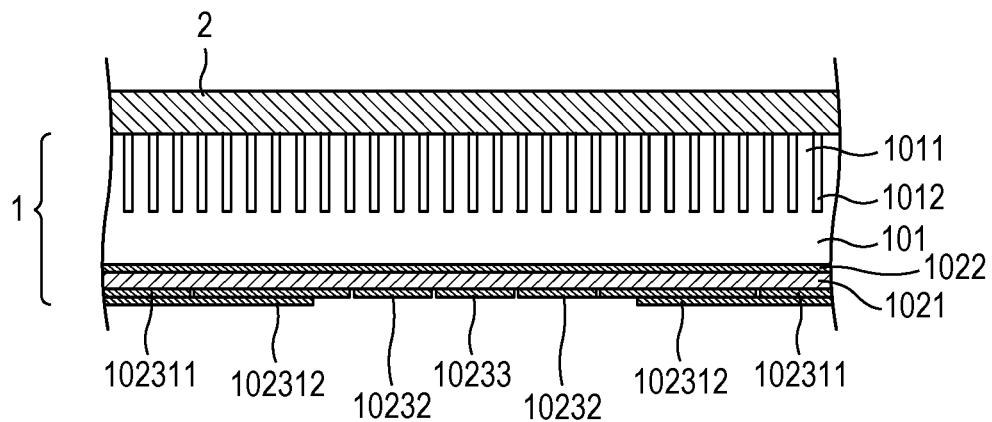
FIG. 2 is a schematic sectional view for illustrating a part of a configuration of the ultrasonic motor according to the embodiment of the present invention.

FIG. 1A and FIG. 1B are each a schematic view for illustrating the ultrasonic motor according to an embodiment of the present invention. FIG. 1A is a schematic perspective view of the ultrasonic motor when viewed from an oblique direction, and FIG. 1B is a schematic plan view of the ultrasonic motor when viewed from a side on which a plurality of electrodes (pattern electrodes) are arranged. FIG. 2 is a schematic partial sectional view of a detailed configuration of the ultrasonic motor according to the embodiment of the present invention when viewed from a side direction. The side direction as used herein refers to a position away from the annular ring in a radial direction. As illustrated in FIG. 1A, the ultrasonic motor of the present invention includes an annular vibrator 1 and an annular moving member 2 that is brought into pressure-contact with the vibrator 1.

In the present invention, as described above, the annular shape refers to a shape in which a disc having a predetermined thickness can be schematically regarded as a configuration that includes a circular through hole concentrically. The outer peripheral shapes of the disc and the through hole are ideally true circular shapes, but include an oval shape, an elliptical shape, and the like as long as the shape can be schematically regarded as an annular ring. The radius and diameter when the circular shape is not a true circular shape are determined assuming a true circle having the same area. A substantially annular shape, such as a shape in which a part of an annular ring is chipped, a shape in which a part of an annular ring is cut, or a shape in which a part of an annular ring protrudes, is also included in the annular shape in the present invention as long as the substantially annular shape can be substantially regarded as an annular shape. Thus, a substantially annular shape that is slightly deformed due to the variation in manufacturing is also included in the annular shape in the present invention as long as the substantially annular shape can be substantially regarded as an annular shape. The radius and diameter when the circular shape is a substantially annular shape are determined assuming a true circle in which a defective region and an abnormal region are corrected.

(Moving Member)

The annular moving member 2 is similarly brought into pressure-contact with the annular vibrator 1 and rotates by the drive force caused by the vibration generated in a contact surface with respect to the vibrator 1. It is preferred that the contact surface of the moving member 2 with respect to the vibrator 1 be flat (even). It is preferred that the moving member 2 be formed of an elastic body, and a material for the moving member 2 be a metal. For example, aluminum is used suitably as the material for the moving member 2. The surface of the aluminum may be subjected to alumite (anodization) treatment.

(Vibrator)

As illustrated in FIG. 1A, the vibrator 1 includes an annular vibrating plate 101 and an annular piezoelectric element 102 arranged on a first surface of the vibrating plate 101 and is brought into contact with the moving member 2 on a second surface of the vibrating plate 101. It is preferred that the moving member 2 be pressed against the second surface of the vibrating plate 101 by appropriate external force so that the transmission of the drive force from the vibrator 1 to the moving member 2 becomes more satisfactory.

The outer diameter 2R (unit: mm) of the vibrating plate 101 is larger than 55 mm (2R>55). When the outer diameter 2R is 55 mm or less, a region of the through hole becomes smaller, and hence the advantage of the annular ring may not be obtained. It is not practically suitable that the outer diameter be small, for example, in the case of using the ultrasonic motor of the present invention for the purpose of moving a lens for a camera so that the area through which a light flux passes becomes smaller. It is more preferred that the lower limit of the outer diameter 2R of the vibrating plate 101 be 56 mm (2R≤56).

There is no particular limitation on the upper limit of the outer diameter 2R of the vibrating plate 101, but from the viewpoint that unnecessary vibration waves can be sufficiently removed, which is the main effect of the present invention, it is preferred that a relationship: 2R≤90 mm be satisfied. It is more preferred that a relationship: 2R≤80 mm be satisfied. When the outer peripheral surface of the vibrating plate 101 does not have a simple shape and has a plurality of outer diameters depending on a measurement position, the maximum outer diameter is set to 2R.

There is no particular limitation on an inner diameter $2R_{in}$ (unit: mm) of the vibrating plate 101 as long as the inner diameter $2R_{in}$ is smaller than the outer diameter 2R, but it is preferred that a relationship: $2R-16 \leq 2R_{in} \leq 2R-6$ be satisfied. This requirement can be interpreted as setting a length in a radial direction of the annular ring of the vibrating plate 101 (hereinafter referred to as "width" of the annular ring) to 3 mm or more and 8 mm or less. When the width of the annular ring of the vibrating plate 101 is set to within the above-mentioned range, sufficient drive force is generated during drive of the ultrasonic motor while the advantage of the annular shape is ensured. When the inner diameter $2R_{in}$ is smaller than 2R−16, a region of the through hole becomes smaller. Therefore, the advantage of the annular ring may not be obtained as described above. Meanwhile, when $2R_{in}$ is larger than 2R−6, the width of the annular ring of the vibrating plate 101 becomes insufficient, and there is a risk in that the drive force generated during drive of the ultrasonic motor may become insufficient.

It is preferred that the first surface of the vibrating plate 101 be flat so that the transmission of vibration involved in the expansion and contraction of the piezoelectric element 102 becomes more satisfactory. It is preferred that the center of the annular ring of the vibrating plate 101 be matched with the center of the annular ring of the piezoelectric element 102 so that the transmission of vibration becomes more satisfactory.

There is no particular limitation on a method of arranging the piezoelectric element 102 on the first surface of the vibrating plate 101, but it is preferred to cause the piezoelectric element 102 to directly adhere to the first surface of the vibrating plate 101 so as not to inhibit the transmission of vibration or to cause the piezoelectric element 102 to adhere to the first surface of the vibrating plate 101 through intermediation of a highly-elastic material (not shown). When an adhesive layer (not shown) having a Young's modulus at room temperature (e.g., 20° C.) of 0.5 GPa or more, more preferably 1 GPa or more is arranged as an example of the highly-elastic material, the transmission of vibration from the piezoelectric element 102 to the vibrating plate 101 becomes more satisfactory. Meanwhile, the upper limit of the Young's modulus at room temperature of the adhesive layer may not be set particularly, but in order to sufficiently obtain adhesion strength of a resin after curing, the upper limit of the Young's modulus is preferably 10 GPa or less. For example, an epoxy resin is suitably used as the adhesive layer. The Young's modulus at room temperature of the adhesive layer can be calculated by JIS K6911 "General test methods for thermosetting plastics" (1995).

(Piezoelectric Element)

As illustrated in FIG. 1A, the annular piezoelectric element 102 includes an annular piezoelectric ceramic piece 1021, a common electrode 1022 arranged on a surface of the piezoelectric ceramic piece 1021 opposed to the vibrating plate 101, and a plurality of electrodes 1023 arranged on a surface of the vibrating plate 101 on a side opposite to the surface on which the common electrode 1022 is arranged.

In the present invention, the piezoelectric ceramic piece 1021 is a lump (bulk body) having a uniform composition without seams, which is obtained by calcining raw material powder including metal elements, and refers to ceramics having an absolute value of a piezoelectric constant $d_{31}$ at room temperature of 10 pm/V or more or a piezoelectric constant $d_{33}$ at room temperature of 30 pC/N or more.

The piezoelectric constant of piezoelectric ceramics can be determined by calculation based on the Japan Electronics and Information Technology Industries Association Standard (JEITA EM-4501) from the measurement results of a density, a resonant frequency, and an antiresonant frequency of the piezoelectric ceramics. This method is hereinafter referred to as a resonance-antiresonance method. The density can be measured, for example, by an Archimedes' method. The resonant frequency and the antiresonant frequency can be measured, for example, through use of an impedance analyzer after a pair of electrodes is arranged on the piezoelectric ceramics.

Ceramics is generally an aggregate of fine crystals (also called "polycrystal"), and each crystal includes an atom having a positive charge and an atom having a negative charge. Most of the ceramics have a state in which the positive charge and the negative charge are balanced. However, dielectric ceramics also includes ceramics called ferroelectrics in which the positive charge and the negative charge in crystals are not balanced even in a natural state, and bias of charge (spontaneous polarization) occurs. The ferroelectric ceramics after calcination has spontaneous polarization in various directions and does not appear to have bias of charge in the entire ceramics. However, when a high voltage is applied to the ferroelectric ceramics, the directions of spontaneous polarization are aligned in a uniform direction, and the spontaneous polarization does not return to the original directions even when the voltage is removed. Aligning the directions of spontaneous polarization is generally called polarization treatment. When a voltage is applied to the ferroelectric ceramics subjected to the polarization treatment from outside, the centers of the respective positive and negative charges in the ceramics attract or repel external charge, and the ceramics main body expands or contracts (inverse piezoelectric effect). The piezoelectric ceramic piece 1021 of the present invention is subjected to such polarization treatment to cause the inverse piezoelectric effect, and at least a region of a part of the piezoelectric material piece is subjected to polarization treatment.

It is preferred that the outer diameter of the annular piezoelectric ceramic piece 1021 be smaller than the outer diameter 2R of the vibrating plate 101, and the inner diameter of the piezoelectric ceramic piece 1021 be larger than the inner diameter $2R_{in}$ of the vibrating plate 101. That is, it is preferred that, when the centers of the annular rings are matched, a projection surface of the piezoelectric ceramic piece 1021 in an annular ring center axial direction be included in a projection surface of the vibrating plate 101 in the same direction. When the outer diameter and the inner diameter of the annular piezoelectric ceramic piece 1021 are set to within such range, the transmission of vibration between the piezoelectric ceramic piece 1021 and the vibrating plate 101 becomes more satisfactory.

In the present invention, the piezoelectric ceramic piece 1021 contains lead in a content of less than 1,000 ppm. That is, the piezoelectric ceramic piece 1021 is lead-free piezoelectric ceramics. It is preferred that the piezoelectric ceramic piece 1021 have a Young's modulus at room temperature (e.g., 20° C.) of 80 GPa or more and 145 GPa or less. The Young's modulus at room temperature of the piezoelectric ceramic piece 1021 can be calculated by the above-mentioned resonance-antiresonance method.

Most of the related-art piezoelectric ceramics contain lead zirconate titanate as a main component. Therefore, the following has been indicated. For example, when a piezoelectric element is discarded and exposed to acid rain or left in a severe environment, there is a risk in that a lead component in the related-art piezoelectric ceramics dissolves into the soil to cause harm to the ecosystem. However, when the content of lead is less than 1,000 ppm as in the piezoelectric ceramic piece 1021 of the present invention, for example, even when a piezoelectric element is discarded and exposed to acid rain or left in a severe environment, the influence of the lead component contained in the piezoelectric ceramic piece 1021 on the environment is negligible. The content of lead contained in the piezoelectric ceramic piece 1021 can be evaluated based on the content of lead with respect to the total weight of the piezoelectric ceramic piece 1021, for example, quantified by X-ray fluorescence (XRF) analysis and ICP emission spectroscopic analysis.

When the Young's modulus at room temperature of the piezoelectric ceramic piece 1021 is smaller than 80 GPa, the drive force generated during drive of the ultrasonic motor may become insufficient. Meanwhile, when the Young's modulus at room temperature of the piezoelectric ceramics 1021 is larger than 145 GPa, there is a risk in that the piezoelectric ceramic piece 1021 is liable to crack. For example, when the Young's modulus is large, the stress caused by deformation (distortion) of the piezoelectric ceramic piece 1021 occurring due to the drive of the ultrasonic motor increases, and hence the piezoelectric ceramic piece 1021 is liable to crack. For example, when the Young's modulus of the piezoelectric ceramic piece 1021 is large, the neutral plane of elastic deformation of the vibrator 1 is shifted from the vibrating plate 101 side to the piezoelectric ceramic piece 1021 side. Therefore, the efficiency of the motor drive (efficiency of output with respect to the input power to the ultrasonic motor) is degraded. In view of this, though the thickness of the piezoelectric ceramic piece 1021 may be reduced so as to return the neutral surface to the vibrating plate 101 side, the stress during deformation increases in proportion to the inverse square of the thickness, and hence the piezoelectric ceramic piece 1021 is liable to crack.

As a main component of the piezoelectric ceramic piece 1021 in which the content of lead is less than 1,000 ppm, and the Young's modulus at room temperature is 80 GPa or more and 145 GPa or less, a metal oxide (perovskite type metal oxide) having a perovskite type crystal structure is preferred.

The perovskite type metal oxide of the present invention refers to a metal oxide having a perovskite structure that is ideally a cubic structure as described in "Iwanami Dictionary of Physics and Chemistry", Fifth Edition (Iwanami Shoten, published on Feb. 20, 1998). The metal oxide having a perovskite structure is generally represented by a chemical formula of $ABO_3$. Although the molar ratio between the element in the B-site and the O-element is described as 1:3, even when the ratio of the element amounts is slightly shifted (for example, from 1.00:2.94 to 1.00:3.06), a metal oxide can be considered as a perovskite type metal oxide as long as the metal oxide has a perovskite structure as a main phase. From structure analysis, for example, by X-ray diffraction or electron beam diffraction, it can be determined that the metal oxide has a perovskite structure.

In the perovskite type metal oxide, elements A and B occupy specific positions in the form of ions in a unit lattice, which are called A-site and B-site. For example, in a cubic unit lattice, the element A is positioned at a vertex of the cube while the element B occupies the body-centered position of the cube. The element O occupies a face center position of the cube as an anion of oxygen. When the element A, the element B, and the element O are respectively shifted slightly on the coordinates from symmetric positions of the unit lattice, the unit lattice of the perovskite type structure is distorted to become a tetragonal, rhombohedral, or orthorhombic crystal system.

As a combination of valences that can be taken by an A-site ion and a B-site ion, there are given $A^+B^{5+}O^{2-}{}_3$, $A^{2+}B^{4+}O^{2-}{}_3$, $A^{3+}B^{3+}O^{2-}{}_3$, and a solid solution obtained by a combination thereof. The valence may be an average valance of a plurality of ions positioned in the same site. For example, a $(K, Na, Li)^+(Nb, Ta)^{5+}O_3$ system, a $(Ba, Ca)^{2+}(Ti, Zr, Sn)^{4+}O_3$ system, a $(Bi_{0.5}((K, Na, Li)_{0.5})^{2+}(Ti, Zr, Sn)^{4+}O_3$ system, a $(K, Na, Li)^+(Nb, Ta)^{5+}O_3$—$(Ba, Ca)^{2+}(Ti, Zr, Sn)^{4+}O_3$ solid solution system, a $(K, Na, Li)^+(Nb, Ta)^{5+}O_3$—$(Bi_{0.5}((K, Na, Li)_{0.5})^{2+}(Ti, Zr, Sn)^{4+}O_3$ solid solution system, and the like can be used as materials for the piezoelectric ceramic piece 1021 containing lead in a content of less than 1,000 ppm.

The common electrode 1022 is arranged on a surface of the annular piezoelectric ceramic piece 1021 on a side opposed to the vibrating plate 101, that is, a surface that is brought into contact with the vibrating plate 101 or a surface that is brought into contact with the above-mentioned adhesive layer. The common electrode 1022 is arranged in an annular manner similarly to the surface of the piezoelectric ceramic piece 1021. It is preferred that the common electrode 1022 be brought into conduction with a non-drive phase electrode 10232 (see FIG. 1B) among the plurality of electrodes 1023 so that a drive voltage can be applied to only a particular region of the plurality of electrodes 1023. For example, when wiring is arranged so as to be brought into contact with both the common electrode 1022 and the non-drive phase electrode 10232, the common electrode 1022 and the non-drive phase electrode 10232 are brought into conduction. Alternatively, wiring may be arranged so as to bring the common electrode 1022 and the non-drive phase electrode 10232 into conduction through intermediation of the vibrating plate 101 having conductivity. Such wiring can be formed, for example, by applying a metal paste made of, for example, silver and drying or baking the metal paste.

As illustrated in FIG. 1B, the plurality of electrodes 1023 include two drive phase electrodes 10231, one or more non-drive phase electrodes 10232, and one or more detection phase electrodes 10233. It is preferred that the drive phase electrodes 10231, the non-drive phase electrode 10232, and the detection phase electrode 10233 not be brought into conduction with each other so that each electrode can have an independent potential during drive.

The detection phase electrode 10233 is arranged for the purpose of detecting a vibration state of the vibrator 1 and feeding back information on the vibration state to the outside, for example, a drive circuit. The piezoelectric ceramic piece 1021 in a region that is brought into contact with the detection phase electrode 10233 is subjected to polarization treatment. Therefore, when the ultrasonic motor is driven, a voltage corresponding to the magnitude of distortion of the vibrator 1 is generated in a region of the detection phase electrode 10233 and output to the outside as a detection signal.

It is preferred that at least one non-drive phase electrode 10232 be brought into conduction with the common electrode 1022 so that the non-drive phase electrode 10232 can be used as a ground electrode. An exemplary mode and procedure for obtaining conduction are as described above. When the drive phase electrode 10231, the non-drive phase electrode 10232 serving as a ground electrode, and the detection phase electrode 10233 are arranged on one surface (surface opposite to the common electrode 1022) of the annular piezoelectric element 102, the transmission of an electric signal (drive signal, detection signal) with respect to the drive circuit outside of the ultrasonic motor is facilitated. For example, a drive signal and a detection signal can be transmitted through a flexible printed board.

When a flexible printed board is used for electrical connection of the ultrasonic motor and the drive circuit, the flexible printed board is arranged so as to be brought into contact with a part of each drive phase electrode 10231, the non-drive phase electrode 10232, and the detection phase electrode 10233 on one surface of the annular piezoelectric element 102 (surface on a side opposite to a surface on which the common electrode 1022 is arranged). The flexible printed board has high dimension accuracy and can be positioned easily through use of a jig or the like. For connection of the flexible printed board, thermal pressure bonding can also be performed through use of an epoxy adhesive or the like. However, from the viewpoint of mass production, it is preferred that an anisotropic conductive paste (ACP) and an anisotropic conductive film (ACF) that have conductivity be subjected to thermal pressure bonding so that a conduction failure can be reduced and a process speed is increased. When thermal pressure bonding is used for connection of the flexible printed board, it is preferred to select a temperature lower than the depolarization temperature of the piezoelectric ceramic piece 1021.

The piezoelectric ceramic piece 1021 in a region that is in contact with the non-drive phase electrode 10232 may or may not have residual (remanent) polarization. When the piezoelectric ceramic piece 1021 in a region that is brought into contact with the non-drive phase electrode 10232 has residual polarization, it is preferred that the non-drive phase electrode 10232 and the common electrode 1022 be brought into conduction with each other.

As illustrated in FIG. 1B, each drive phase electrode 10231 includes six polarizing electrodes 102311 and a connecting electrode 102312 that electrically connects the six polarizing electrodes 102311.

Figure 3:
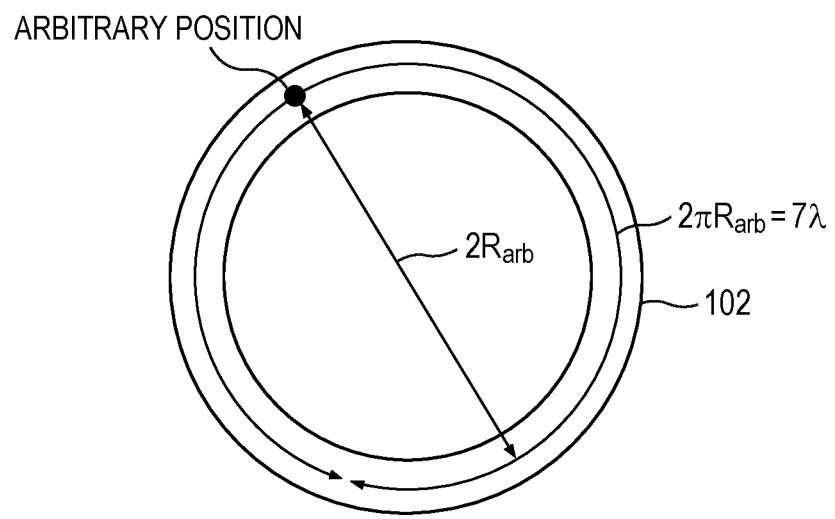
FIG. 3 is a schematic view for illustrating a relationship between a circumferential length and the wavelength of a vibration wave in an annular piezoelectric element to be used in the ultrasonic motor and a vibrator of the present invention.

FIG. 3 is a schematic view for illustrating a relationship between the circumferential length and the wavelength of a vibration wave in the annular piezoelectric element 102 to be used in the ultrasonic motor of the present invention. In FIG. 3, for convenience of description, the electrodes are not shown. The annular ring in FIG. 3 represents the piezoelectric element 102 and has substantially the same shape as that of the piezoelectric ceramic piece 1021. When an arbitrary position is designated on a surface of the annular ring, and the diameter of a circle that passes through the arbitrary position and shares its center with the annular shape of the piezoelectric element 102 is represented by $2R_{arb}$ (unit: mm), the circumferential length of the circle is $2\pi R_{arb}$. The circumferential length $2\pi R_{arb}$ is set to $7\lambda$. "$\lambda$" in the present invention refers to the wavelength at a time when a propagating wave of 7th order (wave number: 7) bending vibration is generated in the circumferential direction of the vibrator 1 forming the ultrasonic motor of the present invention. The value of $\lambda$ varies depending on the arbitrary position designated above, but such parameter A is assumed in order to design the shape and dimensions of the plurality of electrodes 1023. The circumferential length is hereinafter considered assuming the circle that passes through the arbitrary position on the surface of the piezoelectric element 102 even when there is no particular description.

Figure 4A:
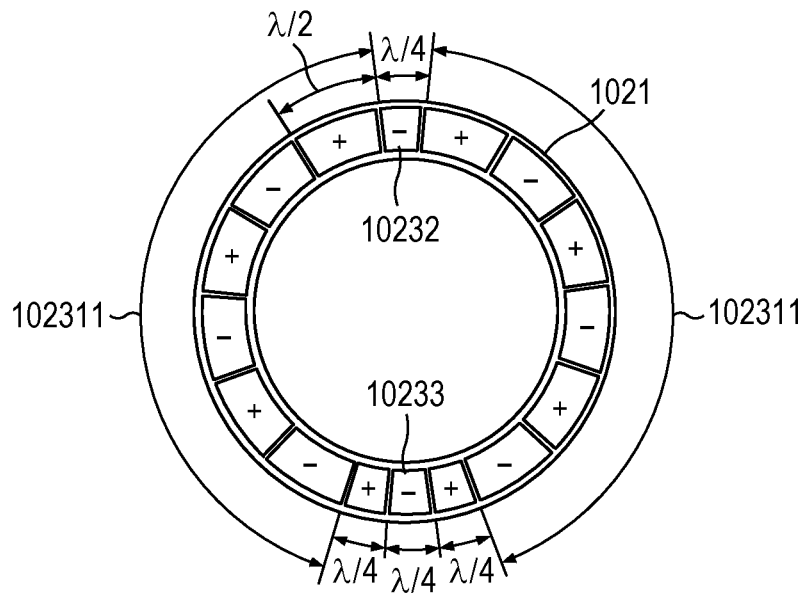
FIG. 4A and FIG. 4B are each a schematic view of the annular piezoelectric element to be used in the ultrasonic motor and the vibrator according to an embodiment of the present invention.
Figure 4B:
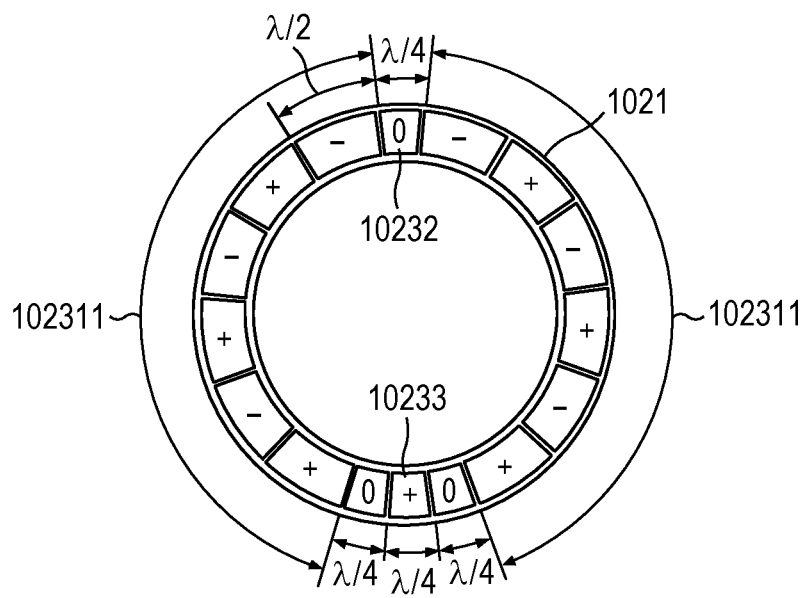

FIG. 4A and FIG. 4B are each a schematic view for illustrating the arrangement of the polarizing electrodes 102311 in the annular piezoelectric element 102 to be used in the ultrasonic motor of the present invention and the polarity of the piezoelectric ceramic piece 1021 in each electrode region, when the annular piezoelectric element 102 is viewed from a side on which the plurality of electrodes are arranged. For convenience of description, in FIG. 4A and FIG. 4B, the connecting electrode 102312 is not shown. A combination of the polarities in FIG. 4A and FIG. 4B is an example and does not limit the present invention.

The piezoelectric ceramic piece 1021 in a region that is brought into contact with the drive phase electrode 10231 has residual polarization in a direction substantially perpendicular to the drive phase electrode 10231. A region having residual polarization may be a part or a whole of the piezoelectric ceramic piece 1021 in a region held between the polarizing electrodes 102311 and the common electrode 1022. From the viewpoint of enhancing the generation force during drive of the ultrasonic motor, it is preferred that the entire region held between the polarizing electrodes 102311 and the common electrode 1022 have residual polarization. In the present invention, the region having residual polarization is referred to as "polarized region". The residual polarization refers to polarization that remains in the piezoelectric ceramic piece 1021 at a time when a voltage is not applied to the piezoelectric ceramic piece 1021. When the piezoelectric ceramic piece 1021 is subjected to polarization treatment, the direction of spontaneous polarization is aligned in a voltage application direction, and thus the piezoelectric ceramic piece 1021 has residual polarization. Whether or not the piezoelectric ceramic piece 1021 has residual polarization can be determined by applying an electric field between the electrodes holding the piezoelectric element 102 and measuring an applied electric field E and a polarization amount P (P-E hysteresis curve).

Each drive phase electrode 10231 includes the six polarizing electrodes 102311, and correspondingly, there are six regions of the piezoelectric ceramic piece 1021 that are brought into contact with the polarizing electrodes 102311, that is, six polarized regions. The six polarized regions and the six polarizing electrodes 102311 are arranged along the circumference so as to sandwich unpolarized regions therebetween as illustrated in FIG. 4A and FIG. 4B. The polarities of the polarized regions are reversed alternately in order of the arrangement along the circumference. In FIG. 4A and FIG. 4B, symbols "+" and "−" written on an inner side of the polarizing electrodes 102311 represent directions of residual polarization, that is, polarities. In this specification, the symbol "+" is written in the electrode region to which a positive voltage is applied in the polarization treatment in the manufacturing step of the piezoelectric element 102. Therefore, when the piezoelectric constant $d_{33}$ is measured only in the "+" electrode region, a negative value is detected. Similarly, in the "−" electrode region, a positive piezoelectric constant $d_{33}$ is detected. Meanwhile, only in the electrode regions having the symbol "0" written in FIG. 4B or the unpolarized regions having no electrodes arranged in FIG. 4B, only the piezoelectric constant $d_{33}$ at room temperature of zero or an extremely small value, e.g., 5 pC/N or less is detected. In the piezoelectric element 102 illustrated in FIG. 4A and FIG. 4B, the piezoelectric ceramic piece 1021 includes a region having downward residual polarization and a region having upward residual polarization with respect to the drawing sheet. As a method of confirming that the polarity of residual polarization varies depending on the region, there are a method involving determining the variation in polarity based on the plus and minus of a value detected by measuring a piezoelectric constant and a method involving confirming that a shift direction from an original point of a coercive electric field in a P-E hysteresis curve is opposite.

Each polarized region has substantially the same dimensions. Specifically, it is preferred that the six polarizing electrodes 102311 (12 polarizing electrodes 102311 as a total of the two drive phase electrodes 10231) have an equal length in the circumferential direction. It is also preferred that each polarized region (each polarizing electrode 102311) have a difference of less than 2% in terms of a projection area.

More specifically, each polarizing electrode 102311 has a fan shape, and the length thereof in the circumferential direction is ideally $\lambda/2$ when the unpolarized regions are ignored. Actually, in order to prevent short-circuiting at a time when adjacent regions create polarized states having different polarities, the unpolarized regions are present between the respective polarizing electrodes 102311. In this case, it is ideal that the center of the unpolarized region in the circumferential direction be taken as a starting point, and a distance from the starting point to the center of the subsequent unpolarized region beyond the adjacent polarizing electrode 102311 be set to $\lambda/2$. However, an error of length of about less than 2% is allowed. From the viewpoint of enhancing drive force generated during drive of the ultrasonic motor, it is preferred that the volume of the unpolarized regions be as small as possible. The unpolarized regions sandwiched between the polarizing electrodes 102311 are brought into contact with the connecting electrode 102312.

The length of each drive phase electrode 10231 in the circumferential direction is ideally $3\lambda$. Actually, there is a gap having no electrode in order to prevent short-circuiting with respect to the adjacent non-drive phase electrode 10232 or the detection phase electrode 10233, and hence the length may be slightly smaller than $3\lambda$. Actually, the length is set to be, for example, smaller than $3\lambda$ by from about 1% to about 2.5% in most cases.

The circumferential length of the circle that passes through an arbitrary position on the surface of the piezoelectric element 102 is $7\lambda$, and hence a residual region of the circumferential length excluding the two drive phase electrodes 10231 is $\lambda$ when the gap between the electrodes is ignored. The residual region is shared by one or more non-drive phase electrodes 10232 and one or more detection phase electrodes 10233. In this case, the two drive phase electrodes 10231 need to be arranged at a distance of an odd multiple of $\lambda/4$ in the circumferential direction, and hence the two drive phase electrodes 10231 need to be separated from each other in the circumferential direction by two spacing regions having circumferential lengths of $\lambda/4$ and $3\lambda/4$, respectively. The non-drive phase electrode 10232 and the detection phase electrode 10233 need to be arranged in two spacing regions. With this, phases of standing waves generated in regions of the two drive phase electrodes 10231, for example, the positions of nodes are shifted by $\lambda/4$, and the annular piezoelectric element 102 can form a bending vibration wave in the circumferential direction of the vibrator 1. This is because, when a voltage is applied simultaneously to each polarizing electrode 102311 through the connecting electrode 102312, one of the polarized regions having different polarities, which are arranged alternately, expands and the other contracts in the circumferential direction due to the inverse piezoelectric effect.

Specifically, when an alternating voltage having a frequency serving as a natural frequency of the vibrator 1 is applied to only a region sandwiched between one drive phase (phase A) electrode 10231 and the common electrode 1022 of the ultrasonic motor of the present invention, a standing wave having a wavelength $\lambda$ is generated over the entire circumference along the circumferential direction on the surface of the vibrating plate 101. When an alternating voltage is similarly applied to only a region sandwiched between the other drive phase (phase B) electrode 10231 and the common electrode 1022, a similar standing wave is generated. The positions of nodes of the respective standing waves have a shift of $\lambda/4$ along the circumferential direction of the vibrating plate 101.

When the ultrasonic motor is driven, an alternating voltage having a frequency serving as a natural frequency of the vibrator 1 is applied to regions of the two drive phase (phase A and phase B) electrodes 10231 of the ultrasonic motor of the present invention so that the frequency is the same and a temporal phase difference becomes $\pi/2$. With this, due to the synthesis of the two standing waves, a 7th order propagating wave having the wavelength $\lambda$, which propagates in the circumferential direction, is generated in the vibrating plate 101.

The polarizing electrode 102311, the non-drive phase electrode 10232, the detection phase electrode 10233, and the connecting electrode 102312 are formed of a layer-like or film-like conductor having a resistance of less than $10\Omega$, preferably less than $1\Omega$. The resistance of the electrodes can be evaluated, for example, by measuring a resistance with a circuit tester (electric tester). The thickness of each electrode is from about 5 nm to about 20 µm. There is no particular limitation on the material for each electrode, and any material that is generally used in a piezoelectric element may be used.

As the material for the electrodes, there are given, for example, metals such as Ti, Pt, Ta, Ir, Sr, In, Sn, Au, Al, Fe, Cr, Ni, Pd, Ag, and Cu, and compounds thereof. The electrodes may be formed of one kind of the above-mentioned examples or laminations of two or more kinds thereof. The respective electrodes arranged in the piezoelectric element may be made of different materials.

Of those, as the electrode to be used in the present invention, an Ag paste or Ag baked electrode, an Au/Ti sputtered electrode, or the like is preferred because a resistance is low.

(Vibrating Plate)

As illustrated in FIG. 2, the second surface of the vibrating plate 101 that is brought into contact with the moving member 2 includes a plurality of groove regions 1012, each having a U-shaped cross-section, which extend radially. The "U-shaped cross-section" as used herein refers to a sectional shape having both wall surfaces substantially perpendicular to the second surface of the vibrating plate 101 and a bottom surface substantially horizontal thereto. The U-shaped cross-section broadly includes not only a so-called U-shape in which a bottom surface and each wall surface are smoothly connected to each other in a rounded manner, but also a shape similar to the so-called U-shape, which can be regarded as the "U-shaped cross-section", such as a so-called rectangular shape in which a bottom surface and each wall surface are connected to each other so as to form a right angle, an intermediate shape thereof, or a shape slightly deformed from those shapes. FIG. 6B, FIG. 6C, and FIG. 6D are each an illustration of an exemplary sectional shape of a groove region having a U-shaped cross-section included in the present invention.

The second surface of the vibrating plate 101 includes the plurality of groove regions 1012 that are arranged radially, and hence a region between two adjacent groove regions forms a wall region 1011 that separates the two groove regions from each other. The plurality of groove regions 1012 extending radially are arranged in the circumferential direction, and hence the number of the wall regions 1011 formed therebetween is the same as that of the groove regions 1012. A top surface (ceiling surface) of the wall region 1011 corresponds to the second surface of the annular vibrating plate 101 and also serves as a reference surface for defining a depth of each groove region 1012. However, the wall region 1011 can be regarded as a convex region with respect to the groove region 1012 that is a concave region, and hence the wall region can also be referred to as "protrusion region". That is, the moving member 2 can relatively move with respect to the vibrator 1, with which the moving member 2 is brought into pressure-contact, with drive force caused by friction with respect to the top surface of the protrusion region 1011. In the following, for convenience of description, the region 1011 between the groove regions 1012 is referred to as "protrusion region" instead of "wall region" in principle.

The groove regions 1012 of the present invention have a feature in that the center depth varies depending on each groove region 1012 (in FIG. 2, the center depth is shown as the same center depth). The "center depth" as used herein refers to a depth at a center position at a time when each groove region 1012 is viewed from the moving member 2 side. That is, the center depth refers to a depth of a groove measured from a top surface (second surface of the vibrating plate 101) of the protrusion region at a position corresponding to the center of each groove region both in the radial direction and the circumferential direction. In general, the bottom surface of the groove region 1012 is parallel as a whole to the second surface of the vibrating plate 101, is flat as a whole in the radial direction (direction in which the groove extends), and is flat as a whole in the circumferential direction (direction in which the grooves are arranged), or has a concave surface shape in which the center portion is flat and both side portions (vicinity of the wall surface) are raised. Therefore, the center depth means a depth of the deepest portion of each groove region. However, the foregoing varies depending on the bottom surface shape of each groove region, and hence the center depth does not necessarily always refer to the depth of the deepest portion. For example, the center depth may refer to a median value of a depth (for example, when the bottom surface is inclined in one direction). When the depth at the center position is a value that does not generally have a meaning as a representative value of the depth (for example, a significant point), a value representing the depth of the groove region, which is a depth at another point close to the center position, is defined as a center depth. When a measurement position of a depth is fixed in all the groove regions, and the bottom surface of each groove region has the same shape, the significance of the center depth is the same in all the groove regions.

The protrusion regions (wall regions) 1011 and the groove regions 1012 are alternately arranged along the circumferential direction of the annular vibrating plate 101, and as described above, the number of the protrusion regions 1011 is the same as that of the groove regions 1012. It is assumed that the protrusion regions 1011 and the groove regions 1012 are present in X portions, respectively. The number of the protrusion regions 1011 or the groove regions 1012 is determined so as to be substantially proportional to the outer diameter 2R of the vibrating plate 101, that is, so as to satisfy a relationship: $2R-10 \leq X \leq 2R+5$. Here, the units of 2R are mm, and X is a natural number. When X and 2R satisfy the above-mentioned relationship, the ultrasonic motor of the present invention can transmit sufficient drive force while having appropriate friction between the vibrator 1 and the moving member 2.

Figure 5:
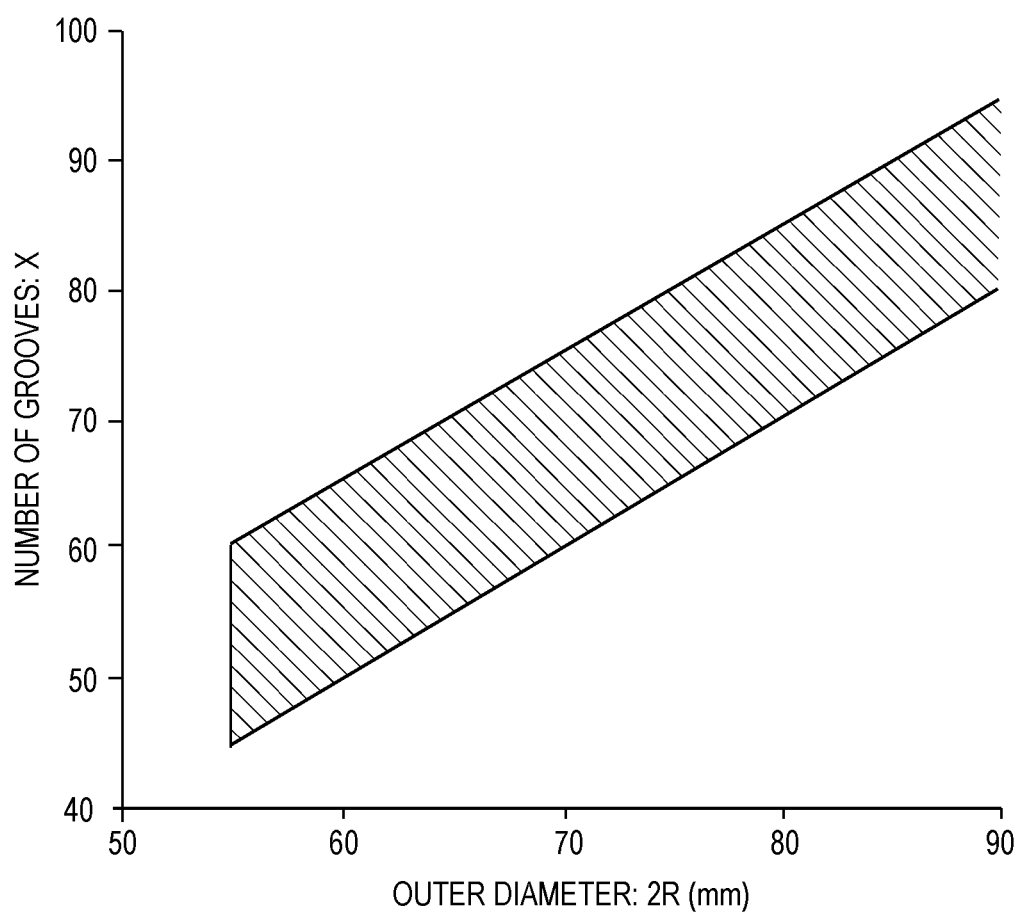
FIG. 5 is a graph for showing a relationship between the number of groove regions and the outer diameter of an annular vibrating plate to be used in the ultrasonic motor and the vibrator of the present invention.

FIG. 5 is a graph for showing a relationship between the number of the groove regions 1012 (or the protrusion regions 1011) of the vibrating plate 101 and the outer diameter 2R of the vibrating plate 101. A colored region including the line segments of FIG. 5 falls within the scope of the present invention. It is not particularly necessary to provide an upper limit to the outer diameter 2R, but the description of the range in which the outer diameter 2R is more than 90 mm is not shown.

Meanwhile, the outer diameter 2R of the vibrating plate 101 is set to be larger than 55 mm, and hence a minimum value of the number X of the groove regions 1012 is 46. When the upper limit of the outer diameter 2R is 90 mm, a maximum value of the number X is 95. As another example, when the upper limit of the outer diameter 2R is 80 mm, the maximum value of the number X is 85.

When the number X of the groove regions 1012 is a natural number smaller than 2R−10, the deformation of the protrusion regions 1011 that are brought into contact with the moving member 2 becomes insufficient, and the drive force generated by the vibrator 1 decreases. Meanwhile, when the number X is a natural number larger than 2R+5, the contact area with the moving member 2 for one protrusion region 1011 decreases. Therefore, when a weight body is used as an element on the moving member 2 side or a large load (torque) is applied to the moving member 2, the friction force between the moving member 2 and the protrusion regions 1011 becomes insufficient, and the drive force is not sufficiently transmitted, with the result that sliding may occur.

From the viewpoint of the generation of force during motor drive and the prevention of sliding, the range of the number X is more preferably $50 \leq X \leq 70$.

FIG. 6A to FIG. 6D are each a schematic view for illustrating a method of measuring lengths (unit: mm) in the circumferential direction (on the outer diameter side) of the protrusion region 1011 and the groove region 1012 of the annular vibrating plate 101 to be used in the ultrasonic motor of the present invention or the vibrator 1 of the present invention. When a boundary line between the protrusion region 1011 and the groove region 1012 extends accurately in the radial direction (that is, the groove region 1012 is formed in a fan shape), the ratio of the lengths thereof in the circumferential direction is the same even when the circumference is taken at any position on the surface of the vibrating plate 101. However, in general, the groove region 1012 does not have a fan shape and is formed into a shape in which the center line of the groove extends in the radial direction, and both wall surfaces extend in parallel to the center line (rectangular shape when viewed from the moving member 2 side). Thus, in a strict sense, the ratio of the lengths of the protrusion region 1011 and the groove region 1012 in the circumferential direction slightly varies depending on where the circumference is taken (radius of the virtual circle). In such case, the circumference is taken on the outer diameter side of the vibrating plate 101, and the radius of the virtual circle is set to R.

In the present invention, a ratio between an average value $L_{top}$ of lengths of the protrusion regions 1011 in the circumferential direction on the outer diameter side and an average value $L_{btm}$ of lengths of the groove regions 1012 in the circumferential direction on the outer diameter side (same applies to the ratio between a total of lengths of the protrusion regions 1011 and a total of lengths of the groove regions 1012 in the circumferential direction) is $1.00 \leq L_{top}/L_{btm} \leq 2.86$. When the average values $L_{top}$ and $L_{btm}$ satisfy the above-mentioned relationship, the ultrasonic motor of the present invention can sufficiently transmit the drive force generated in the vibrator 1 while having appropriate friction between the vibrator 1 and the moving member 2.

Figure 6A:
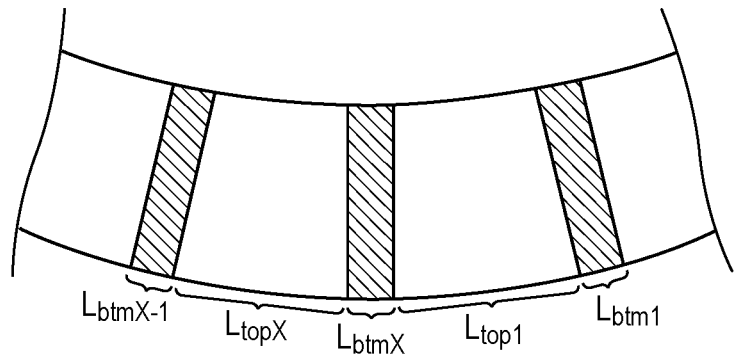
FIG. 6A, FIG. 6B, FIG. 6C, and FIG. 6D are each a schematic view for illustrating a method of measuring a circumferential length of a protrusion region and the groove region of the annular vibrating plate to be used in the ultrasonic motor and the vibrator of the present invention.
Figure 6B:
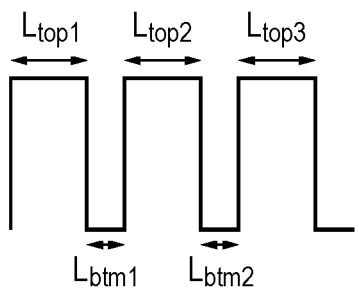
Figure 6C:
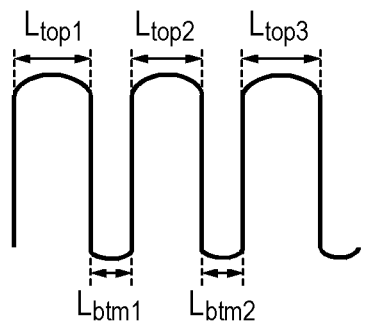
Figure 6D:
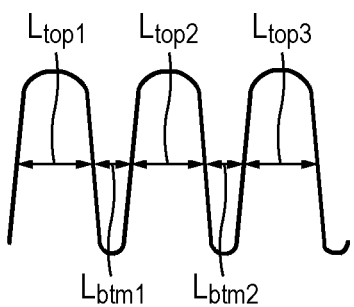

FIG. 6A is a schematic partial plan view of the vibrating plate 101 when viewed from a side of a surface (second surface) that is brought into contact with the moving member 2. It is assumed that one arbitrary protrusion region is selected from the protrusion regions (1011-1 to 1011-X) in X portions. The length (arc) of the selected protrusion region 1011-1 in the circumferential direction on the outer diameter side is represented by $L_{top1}$. Lengths of the other protrusion regions 1011-2 to 1011-X in the circumferential direction on the outer diameter side are similarly determined, and an average of the lengths ($L_{top1}$ to $L_{topX}$) in the X portions is determined to be the average value $L_{top}$. An average is taken, and hence the lengths of the protrusion regions 1011 in the circumferential direction on the outer diameter side may be equal to or different from each other.

Similarly, one arbitrary groove region is selected from the groove regions (1012-1 to 1012-X) in the X portions. The length (arc) of the selected groove region 1012-1 in the circumferential direction on the outer diameter side is represented by $L_{btm1}$. The lengths of the other groove regions 1012-2 to 1012-X in the circumferential direction on the outer diameter side are similarly determined, and an average of the lengths ($L_{btm1}$ to $L_{btmX}$) in the X portions is determined to be the average value $L_{btm}$. An average is taken, and hence the lengths of the groove regions 1012-1 to 1012-X in the circumferential direction on the outer diameter side may be equal to or different from each other.

FIG. 6B, FIG. 6C, and FIG. 6D are each a schematic developed view of a part of the vibrating plate 101 including the arbitrary protrusion region 1011-1 and the arbitrary groove region 1012-1 when viewed from the outer diameter side of the annular ring (position away from the annular ring in the radial direction). When the protrusion region 1011-1 and the groove region 1012-1 are formed into a rectangular shape or a substantially rectangular shape as illustrated in FIG. 6B, it is only necessary that the length of a ceiling side of the protrusion (top surface on the outer diameter side) be set to the length $L_{top1}$, and the length of a bottom side of the groove (bottom surface on the outer diameter side) be set to the length $L_{btm1}$. When a wall surface common to the protrusion region 1011-1 and the groove region 1012-1 is perpendicular to the first surface of the vibrating plate 101, but the top surface of the protrusion region 1011-1 or the bottom surface of the groove region 1012-1 is not flat as illustrated in FIG. 6C, the lengths $L_{top1}$ and $L_{btm1}$ can be determined based on the distance between the wall surfaces on the outer diameter side. When the wall surface common to the protrusion region 1011-1 and the groove region 1012-1 is not perpendicular to the first surface of the vibrating plate 101 as illustrated in FIG. 6D, it is only necessary that a perpendicular line to the first surface of the vibrating plate 101 be assumed at a position on the wall surface serving as a midpoint between the center height of the protrusion region 1011-1 and the center depth of the groove region 1012-1 and set to a length measurement reference of the average values $L_{top1}$ and $L_{btm1}$.

When the ratio $L_{top}/L_{btm}$ of the lengths of the protrusion region 1011 and the groove region 1012 in the circumferential direction on the outer diameter side is less than 1.00, the contact area of the protrusion regions 1011 in the X portions with respect to the moving member 2 decreases. Therefore, when a weight body is used as an element on the moving member 2 side or a large load (torque) is applied to the moving member 2, the friction force between the moving member 2 and the protrusion regions 1011 becomes insufficient, and the drive force is not effectively transmitted, with the result that sliding may occur. Meanwhile, when the ratio $L_{top}/L_{btm}$ is more than 2.80, the deformation of the protrusion regions 1011 that are brought into contact with the moving member 2 becomes insufficient, with the result that the drive force generated by the vibrator 1 decreases. The ratio $L_{top}/L_{btm}$ is more preferably $1.45 \leq L_{top}/L_{btm} \leq 2.40$.

In any of the cases of FIG. 6B, FIG. 6C, and FIG. 6D, further including cases not shown in those figures, from the viewpoint of increasing the contact with the moving member 2, it is preferred that the distances from the first surface of the vibrating plate 101, which serves as a starting point, to the maximum points of the protrusion regions 1011-1 to 1011-X be equal to each other within a range of tolerance of processing dimensions.

Center depths of the groove regions 1012 in the X portions are respectively represented by $D_1$ to $D_X$ (unit: mm) in order of the circumferential direction of the vibrating plate 101. In the present invention, the center depths $D_1$ to $D_X$ take five kinds or more of different values and change so as to follow a curve obtained by superimposing one or more sine waves on one another.

For example, in the case of suppressing 4th order, 5th order, 6th order, and 8th order (wave number along the annular ring is 4, 5, 6, and 8) propagating waves, which serve as the unnecessary vibration waves with respect to the 7th order propagating wave along the annular ring intended by the present invention, it is only necessary that the center depths $D_1$ to $D_X$ are changed along the curve obtained by superimposing one or more and four or less sine waves on one another. A general formula of the curve obtained by superimposing sine waves on one another in that case is represented by the following expression (1).

$$D = D_{ave} + Am_4 \times \sin(4 \times 2 \times \omega + \theta_4) + Am_5 \times \sin(5 \times 2 \times \omega + \theta_5) + Am_6 \times \sin(6 \times 2 \times \omega + \theta_6) + Am_8 \times \sin(8 \times 2 \times \omega + \theta_8) \quad \text{Expression 1}$$

In the expression (1), $\omega$ represents an angle indicating a center position of a groove of the annular vibrating plate 101 extending radially. $\theta$ represents an angle indicating a phase difference and is appropriately determined so as to satisfy conditions described later in the embodiment. D (unit: mm) represents a depth of an ideal groove at a center position of an arbitrary groove of the annular vibrating plate 101, and the center depths $D_1$ to $D_X$ are set to $D \pm 0.1$. The magnitude relationship of the respective values of the center depths $D_1$ to $D_X$ is matched with D calculated by the expression (1). $D_{ave}$ (unit: mm) represents a standard depth of the groove region 1012 that is set separately as an average value of the center depths $D_1$ to $D_X$.

Am (unit: mm) is a real number to be an amplitude of each sine wave, and a suffix represents an order (wave number) of the unnecessary vibration waves intended to be reduced. Of $Am_4$, $Am_5$, $Am_6$, and $Am_8$, at least one takes a value other than 0. The number of amplitudes having values other than 0 is the number of sine waves to be superimposed on one another. There is no particular limitation on an upper limit thereof as long as the number of sine waves to be superimposed on one another is one or more. However, when five or more sine waves are superimposed on one another, the effect of reducing the unnecessary vibration waves is not enhanced while the efficiency of motor drive is degraded. Thus, it is preferred that the number of sine waves to be superimposed on one another be one or more and four or less. The more preferred number of sine waves to be superimposed on one another is two or more and four or less.

Figure 7A:
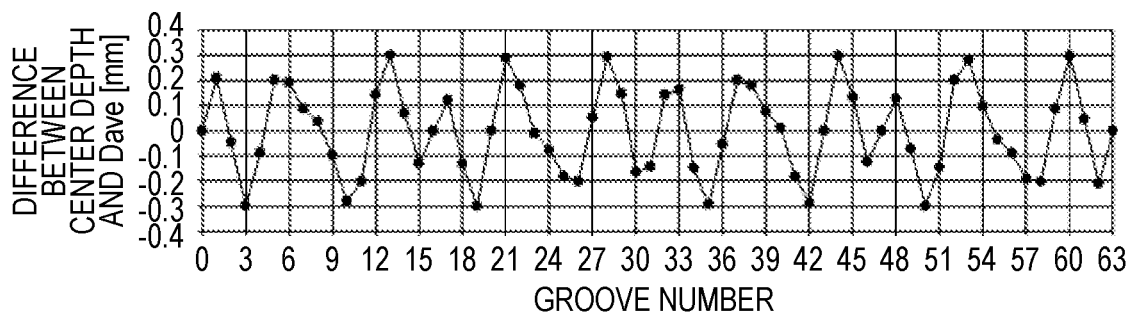
FIG. 7A, FIG. 7B, FIG. 7C, and FIG. 7D are each a graph for schematically showing a distribution of a center depth of the groove region of the vibrating plate of the ultrasonic motor and the vibrator according to the embodiment of the present invention. The arrangement of the protrusion regions and the groove regions is non-uniform along the circumference.
Figure 7B:
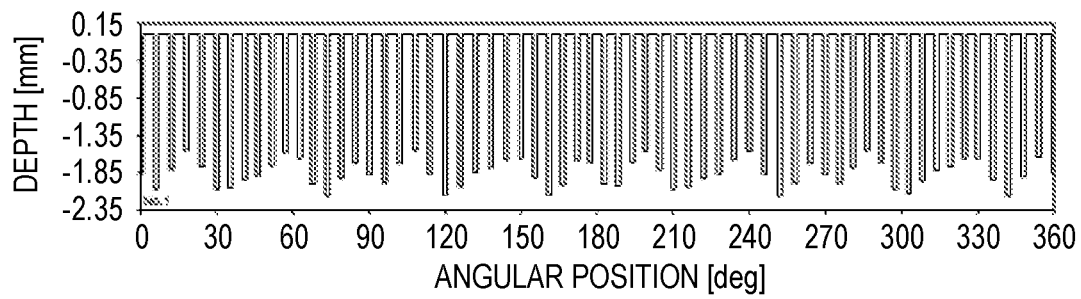
Figure 7C:
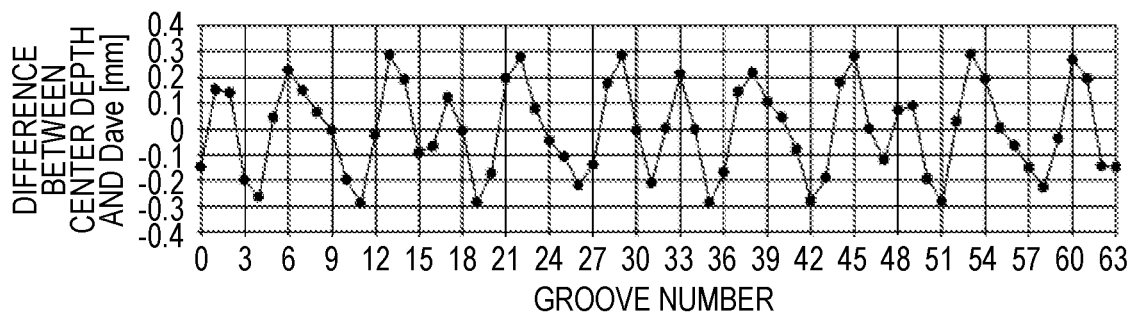
Figure 7D:
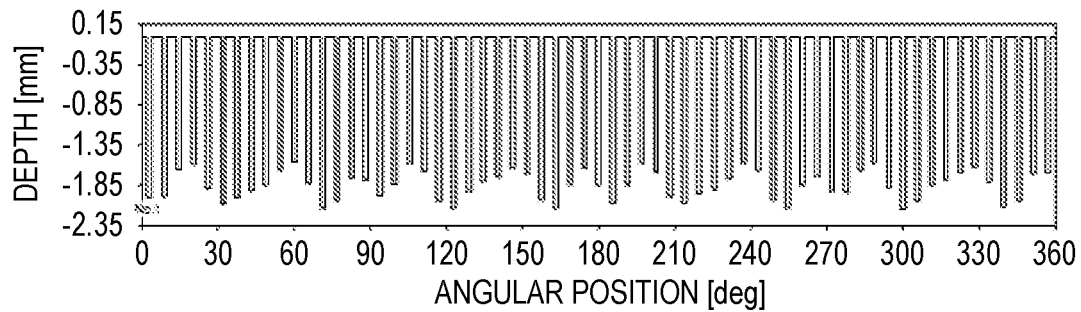

FIG. 7A to FIG. 7D and FIG. 8A to FIG. 8D are each a graph for schematically showing a distribution of a center depth of the groove regions 1012 of the vibrating plate 101 of the ultrasonic motor according to the embodiment of the present invention. FIG. 8A to FIG. 8D are each an example in which the protrusion regions 1011 in the X portions and the groove regions 1012 in the X portions are arranged along the annular ring in a uniform manner, and FIG. 7A and FIG. 7B are each an example in which the protrusion regions 1011 in the X portions and the groove regions 1012 in the X portions are arranged in a non-uniform manner by changing the width of the protrusion regions 1011. FIG. 7C and FIG. 7D are each an example in which the protrusion regions 1011 in the X portions and the groove regions 1012 in the X portions are arranged in a non-uniform manner by changing the width of the groove regions 1012.

Figure 8A:
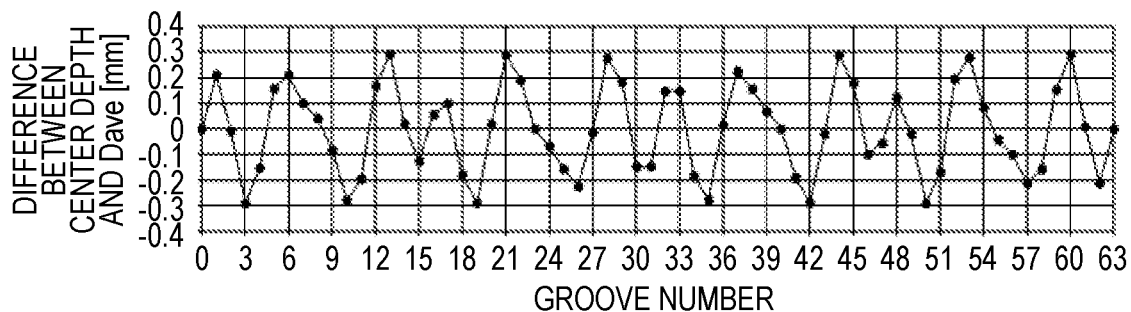
FIG. 8A, FIG. 8B, FIG. 8C, and FIG. 8D are each a graph for schematically showing a distribution of a center depth of the groove region of the vibrating plate of the ultrasonic motor and the vibrator according to an embodiment of the present invention. The arrangement of the protrusion regions and the groove regions is uniform along the circumference.

FIG. 7A and FIG. 7C, and FIG. 8A are each an example for showing a difference between the center depth and the standard depth $D_{ave}$ of each groove region 1012 at a time when it is assumed that X is 63. A horizontal axis of each plot represents the order of 63 groove regions 1012 (hereinafter referred to as "groove number"). The 0th groove region does not actually exist, but is used for convenience on the plot so as to show the depth of the 63rd groove region twice. FIG. 8C is an example for showing a difference between the center depth and the standard depth $D_{ave}$ of each groove region 1012 at a time when it is assumed that X is 90. The 0th groove region is used for convenience so as to show the depth of the 90th groove region twice.

The plots of the depths of each groove region 1012 in FIG. 7A and FIG. 7C and FIG. 8A and FIG. 8C follow a curve obtained by superimposing four sine waves on one another in both cases.

FIG. 7B is a graph for schematically showing, as a graph plot, a relationship of the height of the protrusion region 1011 and the depth of the groove region 1012 in the case of application to the vibrating plate 101, with the center depth of each groove region 1012 shown in FIG. 7A being the standard depth $D_{ave}$ of 1.85 mm. In this example, the heights of the respective protrusion regions 1011, with the first surface of the vibrating plate 101 being a starting point, are equal to each other. The horizontal axis of each plot represents positions of the 63 groove regions 1012 as angles when viewed from the center of the annular ring. The values on the horizontal axis are relative values, but in FIG. 7B, the center portion of the 63rd (0th) groove region in FIG. 7A is set as a starting point.

Similarly, FIG. 7D is a graph for schematically showing, as a graph plot, a relationship of the height of the protrusion region 1011 and the depth of the groove region 1012 in the case of application to the vibrating plate 101, with the center depth of each groove region 1012 shown in FIG. 7C being the standard depth $D_{ave}$ of 1.85 mm. In FIG. 7D, the center of the protrusion region 1011 sandwiched between the 63rd (0th) groove region and the 1st groove region in FIG. 7C is set as a starting point.

Figure 8B:
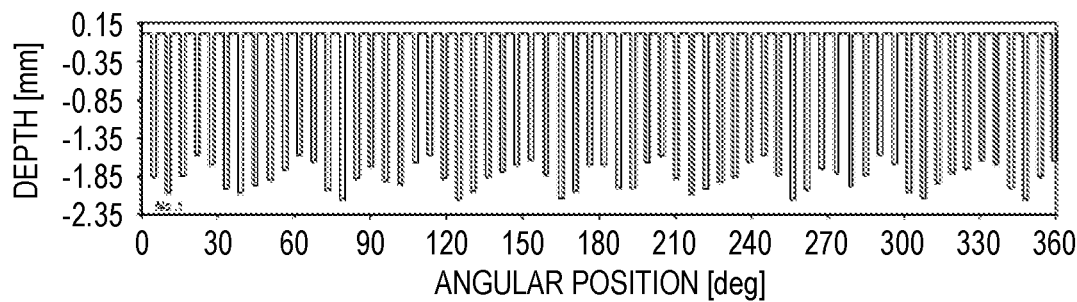
Figure 8C:
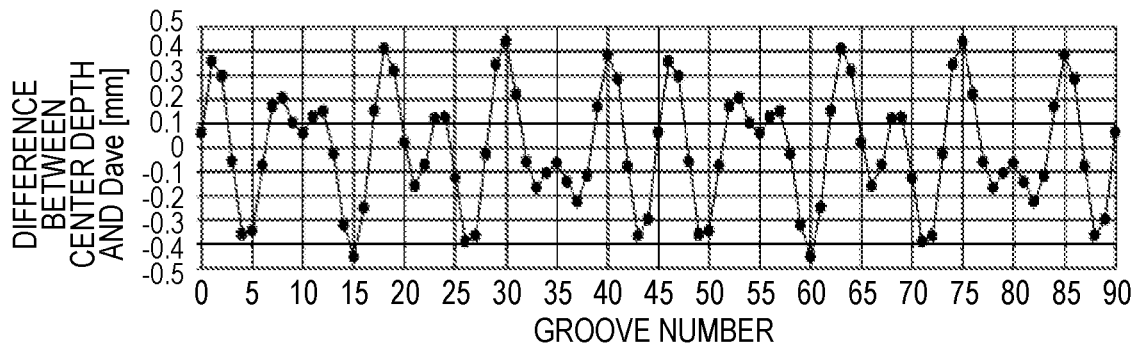

Similarly, FIG. 8B is a graph for schematically showing, as a graph plot, a relationship of the height of the protrusion region 1011 and the depth of the groove region 1012 in the case of application to the vibrating plate 101, with the center depth of each groove region 1012 shown in FIG. 8A being the standard depth $D_{ave}$ of 1.85 mm. In FIG. 8B, the end point of the 62nd groove region (starting point of the protrusion region sandwiched between the 62nd and 63rd groove regions) in FIG. 8A is set as a starting point.

Figure 8D:
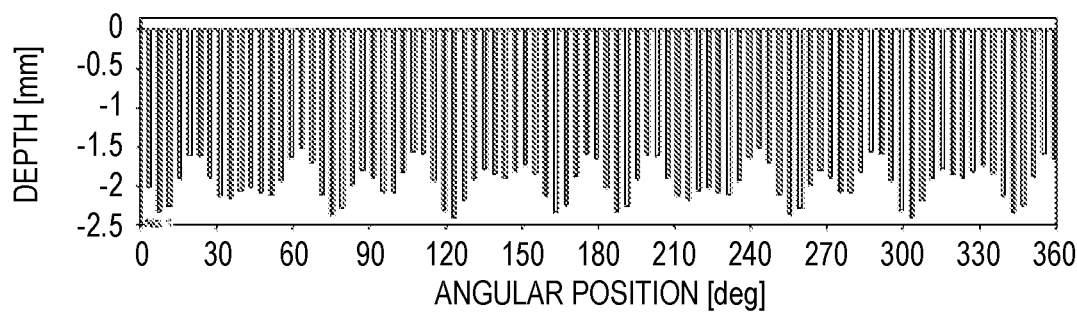

Similarly, FIG. 8D is a graph for schematically showing, as a graph plot, a relationship of the height of the protrusion region 1011 and the depth of the groove region 1012 in the case of application to the vibrating plate 101, with the center depth of each groove region 1012 shown in FIG. 8C being the standard depth $D_{ave}$ of 1.95 mm. In FIG. 8D, the end point of the 89th groove region (starting point of the protrusion region sandwiched between the 89th and 90th groove regions) in FIG. 8C is set as a starting point.

By setting the groove depth as shown in FIG. 7A to FIG. 7D and FIG. 8A to FIG. 8D, the generation of the 4th order, 5th order, 6th order, and 8th order propagating waves being the unnecessary vibration waves are substantially suppressed with respect to the 7th order propagating wave. For example, when only the 4th order unnecessary vibration wave is focused on, the center depth of the groove region 1012 has local maximum regions (deep regions) in 8 portions and local minimum regions (shallow regions) in 8 portions at an equal interval (angle of π/4) with respect to the circumference as also represented by the second term (sin (4×2×ω+θ$_4$)) of the expression (1). The position of an antinode of each standing wave generated in two drive phase electrode regions is also shifted at an angle of π/4. Therefore, one standing wave vibrates in a portion having low elasticity, and hence the resonant frequency is shifted to a low frequency side. The other standing wave vibrates in a portion having high elasticity, and hence the resonant frequency is shifted to a high frequency side. The resonant frequencies of the standing waves are separated, with the result that the 4th order propagating wave (unnecessary vibration wave) is not generated. The same mechanism of suppression applies to the other order unnecessary vibration waves.

As a method of confirming that the center depth of the groove regions 1012 in the X portions in the vibrating plate 101 of the ultrasonic motor changes along the curve obtained by superimposing one or more sine waves on one another, there may be given the following method. First, coordinates and a depth of a center portion of each groove with respect to the circumferential length of the vibrating plate 101 on the outer diameter side are actually measured. The coordinates of the groove regions are taken on the horizontal axis, and the actually measured depth is taken on the vertical axis. Plots are complemented, and a curve in which a groove depth is present in all the coordinates is assumed. This curve is subjected to Fourier transformation to determine the presence and number of sine waves.

The center depth of the groove regions 1012 in the X portions changes so that the number of the groove regions which reach a local maximum and the number of the groove regions which reach a local minimum reaches 12 or more, respectively. The local maximum of the center depth indicates that the center depth of a certain groove region is larger than any center depth of the groove regions adjacent to the certain groove region on both sides. Similarly, the local minimum of the center depth indicates that the center depth of a certain groove region is smaller than any center depth of the groove regions adjacent to the certain groove region on both sides.

The ultrasonic motor and the vibrator 1 of the present invention use a 7th order bending vibration wave as a drive source of the moving member 2. The unnecessary vibration waves having significant adverse effects are 6th order and 8th order vibration waves having resonant frequencies close to that of the 7th order bending vibration wave. As represented by the fourth term of the expression (1), the 6th order unnecessary vibration wave having particularly large effects can be effectively suppressed by arranging 12 local maximum regions (deep regions) and 12 local minimum regions (shallow regions) in the groove regions 1012.

It is preferred that the number of the groove regions 1012 which reach a local maximum be matched with that of the groove regions 1012 which reach a local minimum. It is preferred that the number of the groove regions 1012 which reach a local maximum and the number of the groove regions 1012 which reach a local minimum be 16 or less, respectively. When an attempt is made to suppress the 8th unnecessary vibration wave, the number of the groove regions 1012 which reach a local maximum and the number of the groove regions 1012 which reach a local minimum may become 16, respectively. However, when the number becomes or more, there is a risk in that the drive force generated by the ultrasonic motor and the vibrator 1 of the present invention may extremely decrease.

In the groove regions 1012 in the X portions, the groove region in which the center depth reaches a local maximum and the groove region in which the center depth reaches a local minimum are arranged so as to sandwich one or more groove regions without being adjacent to each other. With this configuration, the rotation operation of the moving member 2 at a time when the ultrasonic motor and the vibrator 1 of the present invention are driven becomes more stable.

When the ultrasonic motor and the vibrator 1 of the present invention are driven, an elliptical motion occurs in a ceiling surface of each protrusion region 1011 to serve as power for rotating the moving member 2. The elliptical ratio of the elliptical motion depends on the center depth of the groove region. Therefore, when the center depth is small, the elliptical ratio becomes larger, and when the center depth is large, the elliptical ratio becomes smaller. The elliptical ratio differs greatly between the groove region in which the center depth reaches a local maximum and the groove region in which the center depth reaches a local minimum. Therefore, when those groove regions are adjacent to each other, the rotation operation of the moving member 2 does not become smoother, and the behavior of the rotation operation varies depending on the rotation direction.

The maximum thickness of the vibrating plate 101 is represented by $T_{dia}$ (unit: mm). A distance between the first surface of the vibrating plate 101 and the top surface of the protrusion region 1011 is generally taken. When the thickness of the vibrating plate 101 varies depending on the position, the maximum value is basically defined as the maximum thickness of the vibrating plate 101.

It is preferred that the maximum thickness $T_{dia}$ be 4 mm or more and 6 mm or less. When the maximum thickness $T_{dia}$ is less than 4 mm, a neutral surface of elastic deformation as the vibrator 1 is shifted to the piezoelectric ceramic piece 1021 side, and hence the efficiency of motor drive is degraded. When the piezoelectric ceramic piece 1021 is decreased in thickness for the purpose of returning the neutral surface to the vibrating plate 101 side, a stress during deformation increases in proportion to an inverse square of the thickness, and hence the piezoelectric ceramic piece 1021 is liable to crack. Further, the generation force of the vibrator 1 decreases. Meanwhile, when the maximum thickness $T_{dia}$ is larger than 6 mm, the deformation amount during drive of the vibrating plate 101 becomes smaller, and the rotation speed of the motor decreases. When the piezoelectric ceramic piece 1021 is increased in thickness for the purpose of compensating for the deformation amount during drive of the vibrating plate 101, the drive voltage of the motor increases excessively.

It is preferred that, of the center depths $D_1$ to $D_X$, a difference (change width) between the maximum value (groove having a largest center depth) and the minimum value (groove having a smallest center depth) be 5% or more and 25% or less with respect to the maximum thickness $T_{dia}$. By setting the change width of the center depths $D_1$ to $D_X$ to within the above-mentioned range with respect to the thickness of the vibrating plate 101, the suppression of the unnecessary vibration waves and the efficiency of the motor drive can be achieved. When the difference between the maximum value and the minimum value of the center depths $D_1$ to $D_X$ is less than 5% with respect to the maximum thickness $T_{dia}$, there is a risk in that the unnecessary vibration waves may not be sufficiently suppressed. Meanwhile, when the difference between the maximum value and the minimum value of the center depths $D_1$ to $D_X$ is more than 25% with respect to the maximum thickness $T_{dia}$, the transmission efficiency of vibration to the moving member 2 for each protrusion region 1011 varies, and hence there is a risk in that the drive efficiency of the motor may decrease. It is more preferred that a difference between the maximum value and the minimum value of the center depths $D_1$ to $D_X$ be 5% or more and 15% or less with respect to the maximum thickness $T_{dia}$.

FIG. 7A to FIG. 7D and FIG. 8A to FIG. 8D are each an example in which the center depth is designed so that the difference between the maximum value and the minimum value of the center depths $D_1$ to $D_X$ is 5% or more and 25% or less with respect to the maximum thickness $T_{dia}$, with the maximum thickness $T_{dia}$ being set to 4 mm or more and 6 mm or less.

It is preferred that the standard depth $D_{ave}$ of the center depths $D_1$ to $D_X$ be 25% or more and 50% or less with respect to the maximum thickness $T_{dia}$. By setting the standard depth $D_{ave}$ to within the above-mentioned range with respect to the thickness of the vibrating plate 101, the efficiency of the motor drive and the rotation speed can both be achieved. When the standard depth $D_{ave}$ is less than 25% with respect to the maximum thickness $T_{dia}$, the deformation amount during drive of the vibrating plate 101 decreases, and there is a risk in that the rotation speed of the motor may decrease. Meanwhile, when the standard depth $D_{ave}$ is more than 50% with respect to the maximum thickness $T_{dia}$, there is a risk in that the drive efficiency of the motor may decrease.

When the number X is an even number, it is preferred that, of the center depths $D_1$ to $D_X$, the depth change of the former half $D_1$ to $D_{X/2}$ (rows of center depths of the respective groove regions) be matched with that of the latter half $D_{X/2+1}$ to $D_X$. The groove region 1012 serving as a starting point may be arbitrarily selected. Therefore, when X is equal to, for example, 70, it is preferred that a relationship: $D_n=D_{n+35}$ hold with respect to any n. In this case, the magnitude relationship of 35 continuous groove regions 1012 and the depth change of 35 remaining continuous groove regions 1012 are matched in the same circumferential direction. With such configuration, the suppression of the unnecessary vibration waves is further enhanced, and the symmetric property of the rotation motion of the moving member 2 becomes satisfactory.

Of the groove regions 1012 in the X portions, the center depth of the groove region 1012 closest to the detection phase electrode 10233 is represented by $D_{sen}$ (unit: mm). The term "sen" as used herein relates to a natural number of 1 or more and X or less. The groove region 1012 closest to the detection phase electrode 10233 is determined with the center portion of the detection phase electrode 10233 being a reference point. The center depths of two groove regions 1012 adjacent to the groove region 1012 closest to the detection phase electrode 10233 are represented by $D_{sen-1}$ and $D_{sen+1}$. In this case, it is preferred that a relationship: $|D_{sen+1}-D_{sen-1}|/D_{sen}\leq 5\%$ be satisfied. It is more preferred that a relationship: $|D_{sen+1}-D_{sen-1}|/D_{sen}\leq 2\%$ be satisfied. When the relationship of the center depths of the three groove regions is set to within the above-mentioned range, the center depths of both the adjacent groove regions 1012 having the detection phase electrode 10233 as a center become closer to each other. As a result, the amplitude of the vibrator 1 in the vicinity of the detection phase electrode 10233 during drive of the ultrasonic motor becomes substantially the same irrespective of whether the drive is clockwise drive or counterclockwise drive, and hence the drive control of the ultrasonic motor by the drive circuit becomes easier.

It is preferred that the vibrating plate 101 be formed of an elastic body for the purpose of forming a propagating wave of bending vibration together with the piezoelectric element 102 and transmitting the vibration to the moving member 2. It is preferred that the vibrating plate 101 be made of a metal from the viewpoint of the properties and processability of the elastic body. As the metal that can be used as the vibrating plate 101, there may be given aluminum, brass, a Fe—Ni 36% alloy, and stainless steel. Of those, stainless steel is used in the present invention because the stainless steel can provide a high rotation speed in combination with the piezoelectric ceramic piece 1021 having a Young's modulus at room temperature of 80 GPa or more and 145 GPa or less. Stainless steel as used herein refers to an alloy containing 50 mass % or more of steel and 10.5 mass % or more of chromium. Of the stainless steel, martensite stainless steel is preferred, and SUS420J2 is most preferred as a material for the vibrating plate 101.

Figure 9:
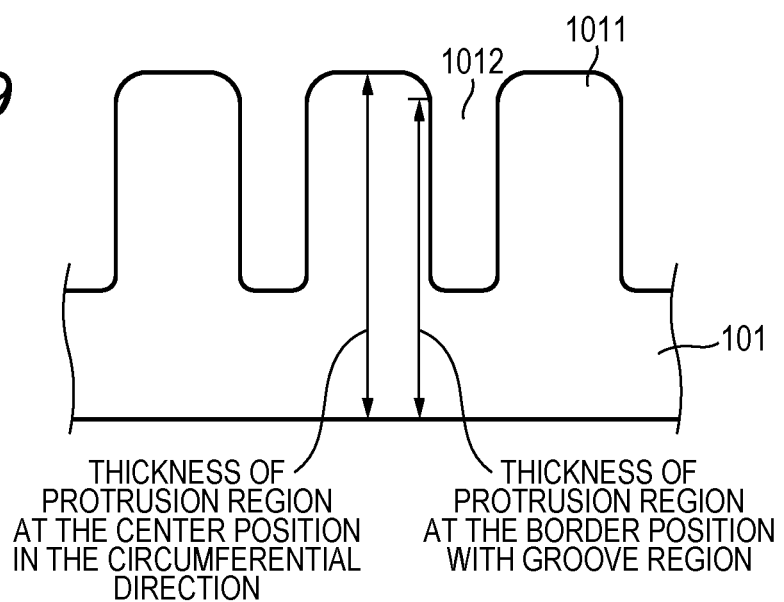
FIG. 9 is a schematic sectional view for illustrating a part of a configuration of the annular vibrating plate to be used in the ultrasonic motor and the vibrator according to an embodiment of the present invention.

FIG. 9 is a schematic sectional view for illustrating a configuration of a part of the annular vibrating plate 101 to be used in the ultrasonic motor and the vibrator 1 of the present invention. In at least one of the protrusion regions 1011 in the X portions of the vibrating plate 101, the vibrating plate thickness of the protrusion region at a center position in the circumferential direction is larger than that of the protrusion region at least one border position with the groove region. That is, it is preferred that a corner at the border position in the circumferential direction be cut off. In other words, in at least one protrusion region 1011, the border position with the groove region, which has a protrusion shape, is chamfered. The border position may be C-chamfered or R-chamfered.

When the piezoelectric ceramic piece 1021 having a high Young's modulus at room temperature of, for example, 90 GPa or more is used in the ultrasonic motor and the vibrator 1 of the present invention, the resonant frequency of the application voltage for generating the 7th order propagating wave increases, and hence the depletion of the protrusion region 1011 is accelerated. In this case, when the border position with the groove region, which has a protrusion shape, is chamfered, the depletion speed can be remarkably decreased.

Figure 10A:
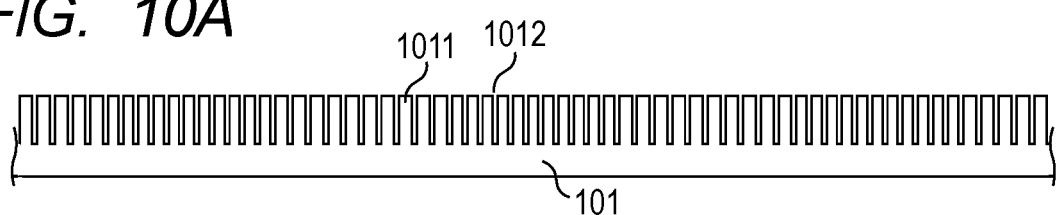
FIG. 10A and FIG. 10B are each a schematic developed sectional view for illustrating the annular vibrating plate to be used in the ultrasonic motor and the vibrator according to an embodiment of the present invention.
Figure 10B:
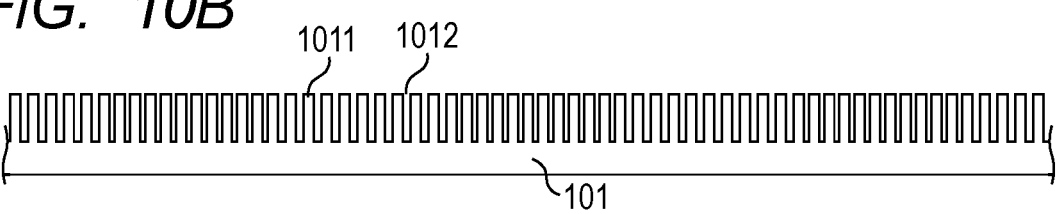

It is preferred that the arrangement of the protrusion regions 1011 in the X portions and the groove regions 1012 in the X portions be not uniform. As a design method therefor, there are given a method involving determining the lengths of the protrusion regions 1011 in a non-uniform manner and a method involving determining the lengths of the groove regions 1012 in a non-uniform manner. FIG. 10A and FIG. 10B are each a schematic view for illustrating an example of the annular vibrating plate 101 to be used in the ultrasonic motor and the vibrator 1 according to the embodiment of the present invention. A case in which the annular vibrating plate 101 is developed and observed from the center of the annular ring is assumed. FIG. 10A is an example in which the lengths of the protrusion regions 1011 are determined in a non-uniform manner. Two kinds of the protrusion regions 1011 having a relatively large width and the protrusion regions 1011 having a relatively small width are arranged in a total of portions (5 portions, 11 portions, 10 portions, 11 portions, 10 portions, 11 portions, and 5 portions) from the left. The vibrating plate 101 shown in FIG. 7A and FIG. 7B is also an example in which the lengths of the protrusion regions 1011 are similarly determined in a non-uniform manner.

FIG. 10B is an example in which the lengths of the groove regions 1012 are determined in a non-uniform manner. Two kinds of the groove regions 1012 having a relatively large width and the groove regions 1012 having a relatively small width are arranged in a total of 63 portions (5.5 portions, 11 portions, 10 portions, 11 portions, 10 portions, 11 portions, and 4.5 portions) from the left. The vibrating plate 101 shown in FIG. 7C and FIG. 7D is also an example in which the lengths of the groove regions 1012 are similarly determined in a non-uniform manner.

Specifically, when the maximum value of the lengths is represented by $L_{max}$ and the minimum value of the lengths is represented by $L_{min}$ in at least one of the lengths of the protrusion regions 1011 in the X portions in the circumferential direction on the outer diameter side and the lengths of the groove regions 1012 in the X portions in the circumferential direction on the outer diameter side, it is preferred that a relationship: $1<L_{max}/L_{min}\le 2$ be satisfied. It is more preferred that a relationship: $1.05\le L_{max}/L_{min}\le 1.15$ be satisfied. The length measurement method of the maximum value $L_{max}$ and the minimum value $L_{min}$ is the same as the determination method for the average values $L_{top1}$ and $L_{btm1}$.

Even when the arrangement of the protrusion regions 1011 in the X portions and the groove regions 1012 in the X portions is made non-uniform, the generation of the unnecessary vibration waves is suppressed. For example, when the 5th order and 6th order unnecessary vibration waves are simultaneously suppressed, the groove regions 1012 can be arranged at positions of multiples of 72° (when viewed from the center of the annular ring) and positions of multiples of 60°, which are intervals between antinodes of the respective standing waves. The effect of suppressing the unnecessary vibration waves obtained by arranging the protrusion regions 1011 and the groove regions 1012 in a non-uniform manner is superimposed on the effect of suppressing the unnecessary vibration waves obtained by changing the center depth of the groove regions 1012 along the sine wave.

The ultrasonic motor using a 7th order bending vibration wave is described above as an example, but the present invention is also applicable to a case using another order bending vibration wave. For example, unnecessary vibration waves other than the 6th order unnecessary vibration wave may be suppressed in an ultrasonic motor using a 6th order bending vibration wave. Similarly, the present invention can be applied to ultrasonic motors using any bending vibration waves such as an 8th order bending vibration wave and an 11th order bending vibration wave.

(Composition of Piezoelectric Ceramics)

There is no particular limitation on the composition of the piezoelectric ceramic piece 1021 as long as the content of lead is less than 1,000 ppm (that is, lead-free), and the Young's modulus at room temperature is 80 GPa or more and 145 GPa or less. For example, piezoelectric ceramics having a composition containing barium titanate, barium calcium titanate, barium calcium zirconate titanate, bismuth sodium titanate, potassium sodium niobate, sodium barium titanate niobate, and bismuth ferrite, and piezoelectric ceramics containing those compositions as a main component can be used in the ultrasonic motor and the vibrator 1 of the present invention.

Of those, it is preferred that the composition of the piezoelectric ceramic piece 1021 contain, as a main component, a perovskite type metal oxide represented by any of the following general formula (1), general formula (2), and general formula (3), and that the content of metal components other than the main component be 1 part by weight or less in terms of a metal with respect to 100 parts by weight of the metal oxide represented by the general formula.

General Formula (1):

$$\{M_h(Na_jLi_kK_{1-j-k})_{1-h}\}_{1-m}\{(Ti_{1-u-v}Zr_uHf_v)_h(Nb_{1-w}Ta_w)_{1-h}\}O_3 \quad (1)$$

where M represents at least one kind selected from the group consisting of $(Bi_{0.5}K_{0.5})$, $(Bi_{0.5}Na_{0.5})$, $(Bi_{0.5}Li_{0.5})$, Ba, Sr, and Ca, and $0 \leq h \leq 0.3$, $0 \leq j \leq 1$, $0 \leq k \leq 0.3$, $0 \leq j+k \leq 1$, $0 < u \leq 1$, $0 \leq v \leq 0.75$, $0 \leq w \leq 0.2$, $0 < u+v \leq 1$, $-0.06 \leq m \leq 0.06$;

General Formula (2):

$$(Ba_{1-s}Ca_s)_\alpha(Ti_{1-t}Zr_t)O_3 \quad (2)$$

where $0.986 \leq \alpha \leq 1.100$, $0.02 \leq s \leq 0.30$, $0 \leq t \leq 0.095$;

General Formula (3):

$$(Na_qBa_{1-q})(Nb_rTi_{1-r})O_3 \quad (3)$$

where $0.80 \leq q \leq 0.95$, $0.85 \leq r \leq 0.95$.

Although the molar ratio between the element in the B-site and the O-element is described as 1:3 in the general formulae (1), (2), and (3), even when the ratio of the element amounts is slightly shifted (for example, from 1.00:2.94 to 1.00:3.06), this case falls within the scope of the present invention as long as the metal oxide has a perovskite type structure as a main phase. From the structure analysis, for example, by X-ray diffraction or electron beam diffraction, it can be determined that the metal oxide has a perovskite type structure.

(Main Component and Other Metal Components)

In the present invention, the term "main component" means that the piezoelectric ceramic piece 1021 contains 90 mass % or more of the perovskite type metal oxide represented by any of the general formulae (1), (2), and (3), or a combination thereof, with respect to the total weight of the piezoelectric ceramic piece 1021. The piezoelectric ceramic piece 1021 contains more preferably 95 mass % or more, still more preferably 99 mass % or more of the perovskite type metal oxide with respect to the total weight of the piezoelectric ceramic piece 1021.

In addition, it is preferred that the content of the metal components other than the main component be 1 part by weight or less in terms of a metal with respect to 100 parts by weight of the metal oxide represented by the general formula. The metal component refers to, for example, typical metals, transition metals, rare-earth elements, and semimetal elements such as Si, Ge, and Sb. The form of the metal component contained in the piezoelectric ceramic piece 1021 is not limited. For example, the metal component may be dissolved in solid in the A-site or the B-site of the perovskite structure or may be contained in a grain boundary. The metal component may also be contained in the piezoelectric ceramic piece 1021 in the form of a metal, an ion, an oxide, a metal salt, a complex, or the like.

When one or more metal elements selected from Mn, Cu, Fe, and Bi is contained in the metal oxide represented by the general formula within a range of 1 part by weight or less in terms of a metal with respect to 100 parts by weight of the metal oxide, an insulation property and a mechanical quality factor of the piezoelectric ceramic piece 1021 are enhanced. Here, the mechanical quality factor refers to a factor representing elasticity loss caused by vibration of the piezoelectric element 102, and the magnitude of the mechanical quality factor is observed as steepness of a resonance curve in impedance measurement. That is, the mechanical quality factor is a constant representing the steepness of resonance of the piezoelectric element 102.

When the content of the metal component is more than 1 part by weight in terms of a metal with respect to 100 parts by weight of the metal oxide represented by the general formula, there is a risk in that the piezoelectric characteristics and insulation characteristics of the piezoelectric ceramic piece 1021 may be degraded.

There is no particular limitation on a method of measuring a composition of the piezoelectric ceramic piece 1021 according to the present invention. As the method of measuring a composition, there are given X-ray fluorescence analysis, ICP emission spectroscopic analysis, and atomic absorption analysis. The composition of the main component and the contents of the other metal components contained in the piezoelectric ceramic piece 1021 can be calculated by any of those methods.

(KNN-Based Piezoelectric Ceramics)

The general formula (1) represents a perovskite type metal oxide having piezoelectricity in which potassium sodium niobate (KNN) is used as a base material and Li, $(Bi_{0.5}K_{0.5})$, $(Bi_{0.5}Na_{0.5})$, $(Bi_{0.5}Li_{0.5})$, Ba, Sr, Ca, Ti, Zr, Hf, and Ta are subjected to site substitution in an amount of at most 30 atomic % or less in order to adjust characteristics.

The Young's modulus at room temperature (for example, 20° C.) of the piezoelectric ceramics containing the perovskite type metal oxide represented by the general formula (1) as a main component (hereinafter referred to as "KNN-based piezoelectric ceramics) falls within a range of from about 80 GPa to about 105 GPa. In the piezoelectric ceramics that can be used in the present invention, the Young's modulus of the KNN-based piezoelectric ceramics falls within a low range. Therefore, in order to obtain sufficient generation force during drive of the ultrasonic motor, it is preferred that a relationship: $1.45 \leq L_{top}/L_{btm} \leq 2.86$ be satisfied. The more preferred range of $L_{top}/L_{btm}$ is $2.00 \leq L_{top}/L_{btm} \leq 2.86$. When the average values $L_{top}$ and $L_{btm}$ satisfy the above-mentioned relationship, the ultrasonic motor of the present invention using the KNN-based piezoelectric ceramics can transmit sufficient generation force while having appropriate friction between the vibrator 1 and the moving member 2.

The absolute value of the piezoelectric constant $d_{31}$ at room temperature of the KNN-based piezoelectric ceramics is large at, for example, 100 pm/V or more. Therefore, when the KNN-based piezoelectric ceramics is used in the ultrasonic motor of the present invention, a high rotation speed is obtained during motor drive.

In the general formula (1), "h" representing the molar ratio of M, which is a divalent or quasi divalent A-site metal, in the A-site falls within a range of $0 \leq h \leq 0.3$. The abundance of Ti, Zr, and Hf, which are quadrivalent B-site metals, in the B-site is also introduced with the molar ratio h. With this, the charge balance (electrical neutrality) of the entire metal oxide is maintained, and the insulation property of the piezoelectric ceramic piece 1021 can be ensured.

The A-site of the KNN-based piezoelectric ceramics is originally monovalent. However, when a part of the A-site is substituted with a divalent metal, a crystal structure changes, and the piezoelectric constant can be enhanced. However, when "h" is larger than 0.3, there is a risk in that a depolarization temperature that is a ceiling temperature of piezoelectricity may decrease to, for example, 100° C. or less.

The depolarization temperature (sometimes referred to as "$T_d$") as used herein refers to temperature at which the piezoelectric constant decreases as compared to that before the temperature is raised at a time when, after an elapse of a sufficient time period from polarization treatment, the temperature is raised from room temperature to the temperature $T_d$(° C.) and lowered to room temperature again. Here, the temperature at which the piezoelectric constant becomes less than 90% of that before the temperature is raised is referred to as the depolarization temperature $T_d$.

The B-site of the KNN-based piezoelectric ceramics is originally pentavalent. However, when a part of the B-site is substituted with quadrivalent Ti, Zr, or Hf, the transition temperature of a crystal structure changes, and the change in piezoelectric constant with respect to the environmental temperature can be suppressed. The effect of suppressing the change in piezoelectric constant with respect to the environmental temperature decreases in the order of Zr, Ti, and Hf. When representing the details of Hf in the quadrivalent metal is larger than 0.75, the piezoelectric constant decreases, and there is a risk in that the rotation speed of the ultrasonic motor may decrease.

In the A-site of the general formula (1), the alkali metals excluding the above-mentioned "M" include Na, K, and Li. The total amount 1−h of the alkali metals in the A-site satisfies a relationship: $0.7 \leq 1-h \leq 1$. The bases of the alkali metals are Na and K, and the substitution amount k of Li is 0.3 or less. When Li is substituted within the above-mentioned range with respect to Na and K, there is an effect that the directivity toward a tetragonal crystal system of a perovskite structure is enhanced to increase the depolarization temperature.

In the general formula (1), "1−m" representing the molar ratio of constituent atoms in the A-site and the B-site of the perovskite structure falls within a range of $0.94 \leq 1-m \leq 1.06$. That is, a relationship: $-0.06 \leq m \leq 0.06$ is satisfied. Ideally, a stoichiometric ratio in which the number of constituent atoms in the A-site and the number of constituent atoms in the B-site have a ratio of 1:1, that is, a relationship: m=0 is preferred. However, in the actual step of manufacturing the KNN-based piezoelectric ceramics, "m" may change within a range of ±0.06. Within this range of "m", the piezoelectric constant of the KNN-based piezoelectric ceramics does not significantly change.

A part of Nb in the B-site of the general formula (1) may be substituted with Ta, and the range of "w" representing the molar ratio of substitution is $0 \leq w \leq 0.2$. When Ta is substituted within the range of the above-mentioned "w" with respect to Nb, the piezoelectric constant of the KNN-based piezoelectric ceramics is enhanced.

(BCT-Based, BCTZ-Based Piezoelectric Ceramics)

The general formula (2) represents barium calcium titanate (BCT) obtained by substituting a part of Ba of piezoelectric barium titanate having a perovskite structure with Ca, or barium calcium zirconate titanate (BCTZ) obtained by substituting a part of Ti of the BCT with Zr in order to further enhance the piezoelectric constant. When Ca and Zr are simultaneously substituted, the piezoelectric constant can be significantly enhanced without decreasing the depolarization temperature of the piezoelectric ceramic piece 1021. It is preferred that the crystal system of the perovskite type metal oxide represented by the general formula (2) have a tetragonal structure at room temperature because a satisfactory mechanical quality factor can be obtained.

The Young's modulus at room temperature (for example, 20° C.) of the BCT-based piezoelectric ceramic piece 1021 falls within a range of from about 130 GPa to about 145 GPa. In the piezoelectric ceramics that can be used in the present invention, the Young's modulus of the BCT-based piezoelectric ceramic piece 1021 falls within a high range, and hence the high generation force can be obtained during drive of the ultrasonic motor.

Meanwhile, the absolute value of the piezoelectric constant $d_{31}$ at room temperature of the BCT-based piezoelectric ceramic piece 1021 is relatively small at, for example, about 50 pm/V. Therefore, in order to obtain a rotation speed required for motor drive when the BCT-based piezoelectric ceramic piece 1021 is used in the ultrasonic motor of the present invention, it is preferred that a relationship: $0.80 \leq L_{top}/L_{btm} \leq 1.35$ be satisfied. The more preferred range of $L_{top}/L_{btm}$ is $1.00 \leq L_{top}/L_{btm} \leq 1.35$. When the average values $L_{top}$ and $L_{btm}$ satisfy the above-mentioned relationship, the ultrasonic motor of the present invention using the BCT-based piezoelectric ceramic piece 1021 can achieve a high rotation speed during drive.

The Young's modulus at room temperature (for example, 20° C.) of the BCTZ-based piezoelectric ceramic piece 1021 falls within a range of from about 110 GPa to about 135 GPa. In the piezoelectric ceramics that can be used in the present invention, the Young's modulus of the BCTZ-based piezoelectric ceramic piece 1021 falls within a high range, and hence the high generation force can be obtained during drive of the ultrasonic motor.

Meanwhile, the absolute value of the piezoelectric constant $d_{31}$ at room temperature of the BCTZ-based piezoelectric ceramic piece 1021 is large at, for example, 90 pm/V or more. Therefore, when the BCTZ-based piezoelectric ceramic piece 1021 is used in the ultrasonic motor of the present invention, a high rotation speed is obtained during motor drive.

In the general formula (2), "α" representing the ratio between the molar quantity of Ba and Ca in the A-site and the molar quantity of Ti and Zr in the B-site falls within a range of $0.986 \leq \alpha \leq 1.100$. When "α" is smaller than 0.986, abnormal grain growth is liable to occur in crystal grains forming the piezoelectric ceramic piece 1021, and the mechanical strength of the piezoelectric ceramic piece 1021 is degraded. Meanwhile, when "a" is larger than 1.100, the temperature required for grain growth of the piezoelectric ceramic piece 1021 becomes too high, with the result that sintering cannot be performed in a general calcination furnace. Here, "sintering cannot be performed" refers to a state in which the density does not become a sufficient value and a great number of pores and defects are present in the piezoelectric ceramic piece 1021.

In the general formula (2), "s" representing the molar ratio of Ca in the A-site falls within a range of $0.02 \leq s \leq 0.30$. When a part of Ba of perovskite type barium titanate is substituted with Ca within the above-mentioned range, the phase transition temperature of an orthorhombic crystal system and a tetragonal crystal system is shifted to a low temperature side, and hence stable piezoelectric vibration can be obtained within the drive temperature range of the ultrasonic motor and the vibrator 1. However, when "s" is larger than 0.30, the piezoelectric constant of the piezoelectric ceramic piece 1021 is not sufficient, and hence the rotation speed of the ultrasonic motor may become insufficient. Meanwhile, when "s" is smaller than 0.020, a sufficient mechanical quality factor is not obtained within the drive temperature range of the ultrasonic motor and the vibrator 1.

In the general formula (2), "t" representing the molar ratio of Zr in the B-site falls within a range of 00.095. Irrespective of whether or not a part of a Ti-site is substituted with Zr, stable piezoelectric vibration can be obtained within the drive temperature range of the ultrasonic motor and the vibrator 1. However, when a part of the Ti-site is substituted with Zr within the above-mentioned range, the distortion of a tetragonal crystal system of the piezoelectric material is reduced, and hence c/a decreases to approach 1, with the result that large piezoelectric vibration can be obtained. The more preferred range of "t" is 0.005≤t≤0.085. When is larger than 0.095, the depolarization temperature decreases, and there is a risk in that the drive of the ultrasonic motor may not be sufficient in a high temperature atmosphere, for example, at 50° C.

(NN-BT-Based Piezoelectric Ceramics)

The general formula (3) represents a piezoelectric perovskite type metal oxide (NN-BT) obtained by dissolving barium titanate ($BaTiO_3$) in solid in sodium niobate ($NaNbO_3$). The metal oxide represented by the general formula (3) means that the metal elements positioned in the A-site are Na and Ba, and the metal elements positioned in the B-site are Ti and Nb. A part of Na and Ba may be positioned in the B-site. Similarly, a part of Ti and Nb may be positioned in the A-site.

The Young's modulus at room temperature (for example, 20° C.) of the NN-BT-based piezoelectric ceramic piece 1021 falls within a range of from about 120 GPa to about 145 GPa. In the piezoelectric ceramics that can be used in the present invention, the Young's modulus of the NN-BT-based piezoelectric ceramic piece 1021 falls within a high range, and hence the high generation force can be obtained during drive of the ultrasonic motor.

Meanwhile, the absolute value of the piezoelectric constant $d_{31}$ at room temperature of the NN-BT-based piezoelectric ceramic piece 1021 is relatively small at, for example, about 50 pm/V. Therefore, in order to obtain a rotation speed required for motor drive when the NN-BT-based piezoelectric ceramic piece 1021 is used in the ultrasonic motor of the present invention, it is preferred that a relationship: $0.80 \leq L_{top}/L_{btm} \leq 1.35$ be satisfied. The more preferred range of $L_{top}/L_{btm}$ is $1.00 \leq L_{top}/L_{btm} \leq 1.35$. When the average values $L_{top}$ and $L_{btm}$ satisfy the above-mentioned relationship, the ultrasonic motor of the present invention using the NN-BT piezoelectric ceramic piece 1021 can achieve a high rotation speed during drive.

Na is liable to volatilize during sintering, and hence Na may be lost with respect to Nb. In the general formula (3), the suffix of Na is described as "q" so as to differentiate from the suffix "r" of Nb in consideration of the case where Na of the piezoelectric ceramic piece 1021 may be lost. The range of "q" in the general formula (3) is 0.80≤q≤0.95. When "q" representing the molar ratio of Na in the A-site is smaller than 0.80, the amount of Na becomes smaller by 95% compared to that of Nb. In the composition in which sodium is lost by more than 5%, an impurity phase (phase having an X-ray diffraction pattern similar to $Ba_4Nb_2O_9$, $Ba_6Ti_7Nb_9O_{42}$, $Ba_3Nb_4Ti_4O_{21}$, $Ba_3Nb_{3.2}Ti_5O_{21}$, and the like) is generated, and the insulation property of a sample decreases. When "q" is more than 0.95, the piezoelectric constant of the piezoelectric ceramic piece 1021 decreases. When "q" falls within a range of 0.80≤q≤0.95, the generation of the impurity phase can be suppressed, and a satisfactory piezoelectric constant is obtained. It is more preferred that "q" fall within a range of 0.80≤q≤0.90.

The range of "r" in the general formula (3) is 0.85≤r≤0.95. When "r" representing the molar ratio of Nb in the B-site is smaller than 0.85, the depolarization temperature decreases to less than 110° C. Meanwhile, when "r" is more than 0.95, the piezoelectric constant decreases. The more preferred range of "r" is 0.85≤r≤0.90.

In order to adjust the physical properties of NN-BT, a part of Ba may be substituted with a divalent metal element, e.g., Sr or Ca. Similarly, a part of Nb may be substituted with a pentavalent metal element, e.g., Ta or V within a range of 20 mol % or less. Further, similarly, a part of Ti may be substituted with Zr or Sn within a range of 20 mol % or less, and a part of Na may be substituted with Li within a range of 15 mol % or less. Further, similarly, at least one kind of element selected from Mn, Ni, and Zn may be added in an amount of 5 mol % or less to 1 mol of the perovskite type metal oxide represented by the general formula (3). Further, similarly, at least one kind of element selected from La, Ce, Pr, Nd, Pm, Sm, Eu, Gd, Tb, Dy, Ho, Er, Tm, and Yb may be added in an amount of 5 mol % or less to 1 mol of the perovskite type metal oxide represented by the general formula (3).

(Drive Control System)

Figure 11:
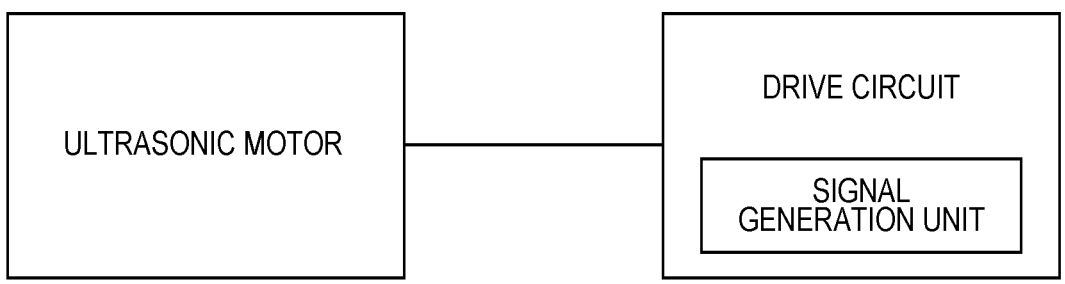
FIG. 11 is a schematic view for illustrating a drive control system according to an embodiment of the present invention.

Next, the drive control system of the present invention is described. FIG. 11 is a schematic view for illustrating the drive control system according to an embodiment of the present invention. The drive control system of the present invention includes at least the ultrasonic motor of the present invention and a drive circuit electrically connected to the ultrasonic motor. The drive circuit includes a signal generation unit configured to generate an electric signal for generating a 7th order bending vibration wave in the ultrasonic motor of the present invention to cause rotation drive.

The drive circuit simultaneously applies alternating voltages having the same frequency and a temporal phase difference of π/2 to each drive phase electrode 10231 (phase A and phase B) of the ultrasonic motor. As a result, standing waves generated in the phase A and the phase B are synthesized to generate a 7th order bending vibration wave (wavelength: λ), which propagates in the circumferential direction, on the second surface of the vibrating plate 101.

In this case, each point on the protrusion regions 1011 in the X portions of the vibrating plate 101 undergoes elliptical motion. Therefore, the moving member 2 rotates due to the friction force in the circumferential direction from the vibrating plate 101. When the 7th order bending vibration wave is generated, the detection phase electrode 10233 generates a detection signal in accordance with the amplitude of vibration of the piezoelectric ceramic piece 1021 in the regions brought into contact with the detection phase electrode 10233 and outputs the detection signal to the drive circuit through wiring. The drive circuit compares the detection signal with the phase of the drive signal input to the drive phase electrode 10231, to thereby grasp a shift from a resonant state. By determining again the frequency of the drive signal input to the drive phase electrode 10231 based on the above-mentioned information, the feedback control of the ultrasonic motor can be performed.

(Optical Apparatus)

Next, the optical apparatus of the present invention is described. The optical apparatus of the present invention includes at least the drive control system of the present invention and an optical element dynamically connected to the ultrasonic motor included in the drive control system. The phrase "dynamic connection" as used herein refers to a state in which elements are directly in contact with each other or a state in which the elements are in contact with each other through intermediation of a third element so that force generated by a coordinate change, a volume change, and a shape change of one element is transmitted to the other element.

Figure 12A:
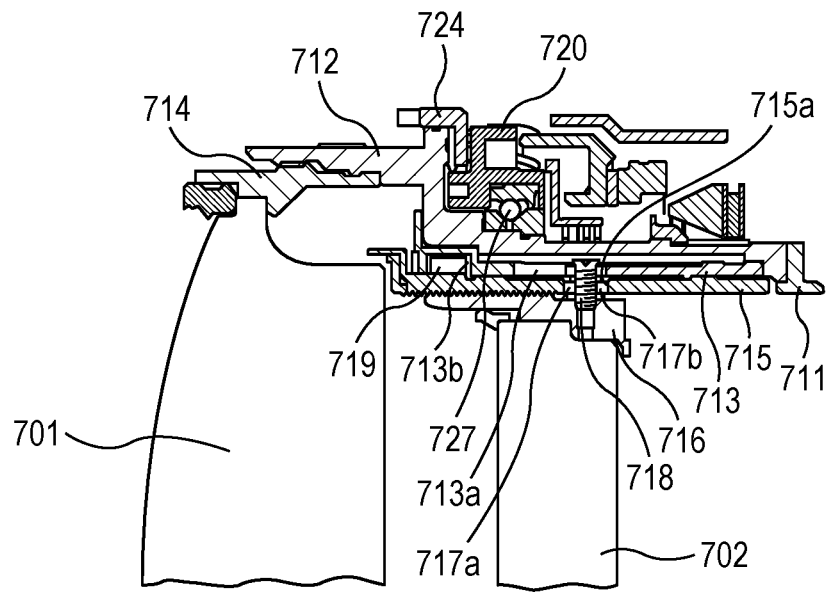
FIG. 12A and FIG. 12B are each a schematic view for illustrating an optical apparatus according to an embodiment of the present invention.
Figure 12B:
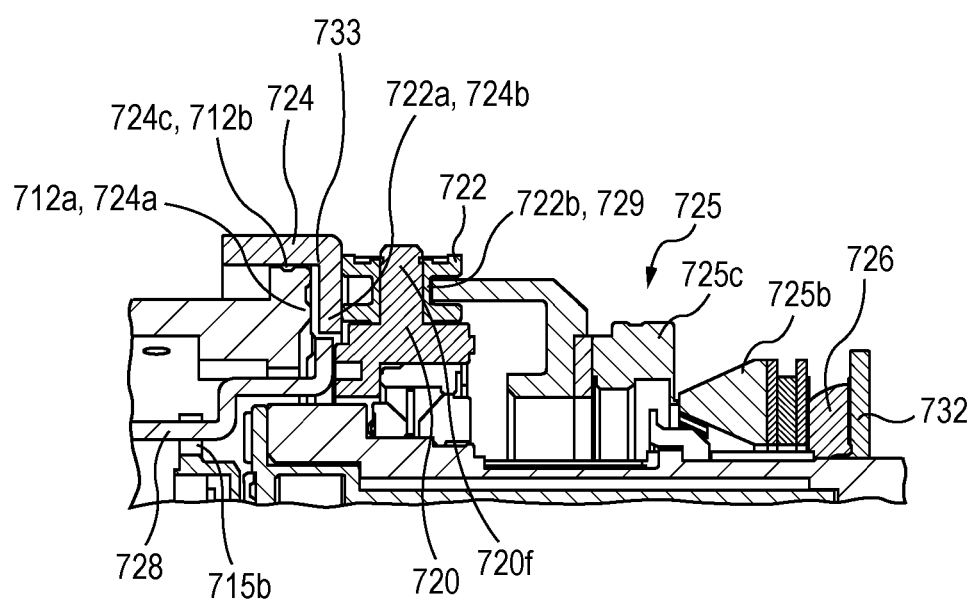

FIG. 12A and FIG. 12B are each a sectional view of main parts of an interchangeable lens barrel for a single-lens reflex camera as an example of an optical apparatus according to an exemplary embodiment of the present invention.

Figure 13:
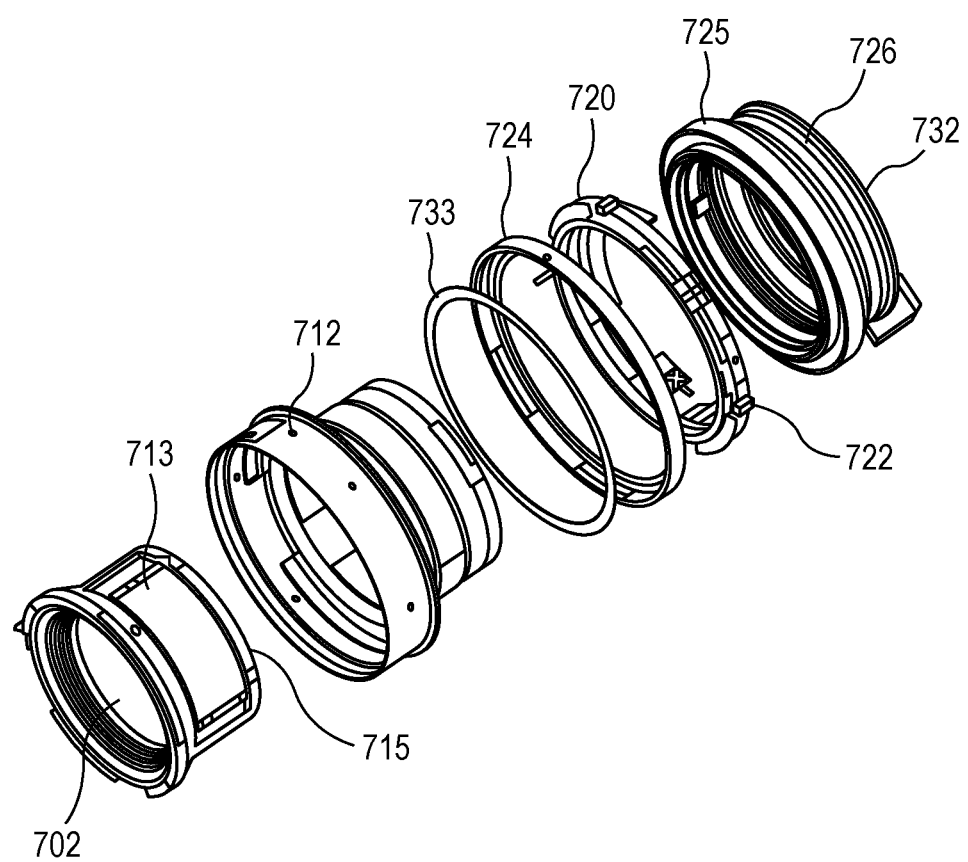
FIG. 13 is a schematic view for illustrating an optical apparatus according to an embodiment of the present invention.

FIG. 13 is an exploded perspective view of the interchangeable lens barrel for the single-lens reflex camera as the example of the optical apparatus according to the exemplary embodiment of the present invention. A fixed barrel 712, a linear guide barrel 713, and a front lens unit barrel 714 holding a front lens group 701 are fixed to a detachable mount 711 for a camera. Those components are fixed elements of the interchangeable lens barrel.

A linear guide groove 713a in an optical axis direction for a focus lens 702 is formed on the linear guide barrel 713. Cam rollers 717a and 717b protruding outward in a radial direction are fixed to a rear lens unit barrel 716 holding the focus lens 702 via axial screws 718, and the cam roller 717a is fitted in the linear guide groove 713a.

A cam ring 715 is fitted on the inner periphery of the linear guide barrel 713 in a rotatable manner. Relative movement between the linear guide barrel 713 and the cam ring 715 in the optical axis direction is restricted due to a roller 719 fixed to the cam ring 715 being fitted in an annular groove 713b of the linear guide barrel 713. A cam groove 715a for the focus lens 702 is formed on the cam ring 715, and the above-mentioned cam roller 717b is simultaneously fitted in the cam groove 715a.

On the outer peripheral side of the fixed barrel 712, there is arranged a rotation transmission ring 720 held by a ball race 727 in a rotatable manner at a predetermined position with respect to the fixed barrel 712. The rotation transmission ring 720 has shafts 720f extending radially from the rotation transmission ring 720, and rollers 722 are held by the shafts 720f in a rotatable manner. A large diameter region 722a of the roller 722 makes contact with a mount side end surface 724b of a manual focus ring 724. In addition, a small diameter part 722b of the roller 722 makes contact with a joining member 729. Six rollers 722 are arranged on the outer periphery of the rotation transmission ring 720 at uniform intervals, and each roller is provided in the relationship as described above.

A low friction sheet (washer member) 733 is arranged on an inner diameter region of the manual focus ring 724, and this low friction sheet is sandwiched between a mount side end surface 712a of the fixed barrel 712 and a front side end surface 724a of the manual focus ring 724. In addition, an outer diameter surface of the low friction sheet 733 is formed into a ring shape so as to be circumferentially fitted on an inner diameter region 724c of the manual focus ring 724. Further, the inner diameter region 724c of the manual focus ring 724 is circumferentially fitted on an outer diameter region 712b of the fixed barrel 712. The low friction sheet 733 has a role of reducing friction in a rotation ring mechanism in which the manual focus ring 724 rotates relatively to the fixed barrel 712 about the optical axis. Note that, the large diameter region 722a of the roller 722 makes contact with the mount side end surface 724b of the manual focus ring under a state in which a pressure is applied by a pressing force of a wave washer 726 pressing an ultrasonic motor 725 to the front of the lens. In addition, similarly, the small diameter region 722b of the roller 722 makes contact with the joining member 729 under a state in which an appropriate pressure is applied by a pressing force of the wave washer 726 pressing the ultrasonic motor 725 to the front of the lens. Movement of the wave washer 726 in the mount direction is restricted by a washer 732 connected to the fixed barrel 712 by bayonet joint. A spring force (biasing force) generated by the wave washer 726 is transmitted to the ultrasonic motor 725, and further to the roller 722, to be a force for the manual focus ring 724 to press the mount side end surface 712a of the fixed barrel 712. In other words, the manual focus ring 724 is integrated under a state in which the manual focus ring 724 is pressed to the mount side end surface 712a of the fixed barrel 712 via the low friction sheet 733.

Therefore, when a drive circuit having a signal generation unit built therein (not shown) drives the ultrasonic motor 725 to rotate with respect to the fixed barrel 712, the rollers 722 rotate about the shafts 720f so that the joining member 729 is brought into contact by friction with the small diameter regions 722b of the rollers 722. As a result of the rotation of the rollers 722 about the shafts 720f, the rotation transmission ring 720 rotates about the optical axis (automatic focus operation).

In addition, when a manual operation input unit (not shown) gives a rotation force about the optical axis to the manual focus ring 724, the components are operated as follows. Specifically, the rollers 722 rotate about the shafts 720f by friction force because the mount side end surface 724b of the manual focus ring 724 is brought into pressure-contact with the large diameter regions 722a of the rollers 722. When the large diameter regions 722a of the rollers 722 rotate about the shafts 720f, the rotation transmission ring 720 rotates about the optical axis. In this case, the ultrasonic motor 725 does not rotate because of a friction retaining force between a moving member 725c and a vibrator 725b (manual focus operation).

Two focus keys 728 are mounted to the rotation transmission ring 720 at opposing positions, and the focus key 728 is fitted to a notch portion 715b formed in the tip of the cam ring 715. Therefore, when the automatic focus operation or the manual focus operation is performed so that the rotation transmission ring 720 is rotated about the optical axis, the rotation force is transmitted to the cam ring 715 via the focus key 728. When the cam ring is rotated about the optical axis, the rear lens unit barrel 716 whose rotation is restricted by the cam roller 717a and the linear guide groove 713a is moved forward and backward along the cam groove 715a of the cam ring 715 by the cam roller 717b. Thus, the focus lens 702 is driven, and the focus operation is performed. That is, the position of the focus lens 702, which is an optical element, is changed by the focus lens 702 being dynamically connected to the ultrasonic motor 725.

In this case, the interchangeable lens barrel for the single-lens reflex camera is described above as the optical apparatus of the present invention, but the present invention can be applied to many kinds of optical apparatus including the ultrasonic motor, regardless of a type of the camera, including a compact camera, an electronic still camera, and the like.

EXAMPLES

Next, the vibrator, the ultrasonic motor, the drive control system, and the optical apparatus of the present invention are specifically described by means of Examples, but the present invention is not limited to the following Examples. The Examples are described with reference to the drawings with use of the reference symbols in the drawings.

(Manufacturing Example of Annular Piezoelectric Ceramic Piece)

An annular piezoelectric ceramic piece containing lead in a content of less than 1,000 ppm and having a Young's modulus at room temperature of 80 GPa or more and 145 GPa or less was manufactured in the following manner. The Young's modulus was measured through use of a test piece cut out from a piezoelectric element.

(Manufacturing Example of KNN-Based Piezoelectric Ceramics)

With intent to add Cu to $[\{Ba_{0.75} (Bi_{0.5}Na_{0.5})_{0.25}\}_{0.08} (Na_{0.49}Li_{0.02}K_{0.49})_{0.92}]_{1.00} \{(Ti_{0.20}Zr_{0.75}Hf_{0.05})_{0.08} (Nb_{0.90}Ta_{0.10})_{0.92}\}O_3$ corresponding to the composition of h of 0.08, j of 0.49, k of 0.02, u of 0.75, v of 0.05, w of 0.10, and m of 0 in the general formula (1), with the metal M being $Ba_{0.75}(Bi_{0.5}Na_{0.5})_{0.25}$, corresponding raw material powders were weighed as follows.

Barium carbonate, bismuth oxide, sodium carbonate, lithium carbonate, potassium carbonate, titanium oxide, zirconium oxide, hafnium oxide, niobium pentoxide, and tantalum pentoxide, each being commercially available with a purity of 99.9% or more, serving as raw material powders, were weighed so that Ba, Bi, Na, Li, K, Ti, Zr, Hf, Nb, and Ta satisfied the composition of $[\{Ba_{0.75} (Bi_{0.5}Na_{0.5})_{0.25}\}_{0.08} (Na_{0.49}Li_{0.02}K_{0.49})_{0.92}]_{1.00}\{(Ti_{0.20}Zr_{0.75}Hf_{0.05})_{0.08} (Nb_{0.90}Ta_{0.10})_{0.92}\}O_3$. The composition was able to be sintered at low temperature, and hence the loading ratio was set as intended without considering the volatilization of alkali metal components during the sintering step. Manganese dioxide was added to the resultant so that the content of Mn was 0.25 part by weight with respect to 100 parts by weight of the composition of $[\{Ba_{0.75}(Bi_{0.5}Na_{0.5})_{0.25}\}_{0.08} (Na_{0.49}Li_{0.02}K_{0.49})_{0.92}]_{1.00}\{(Ti_{0.20}Zr_{0.75}Hf_{0.05})_{0.08} (Nb_{0.90}Ta_{0.10})_{0.92}\}O_3$.

Those weighed powders were mixed by dry blending for 24 hours through use of a ball mill to provide mixed powder. In order to granulate the obtained mixed powder, 3 parts by weight of a PVA binder with respect to the mixed powder was caused to adhere to the surface of the mixed powder through use of a spray dryer.

Next, the obtained granulated powder was supplied to a mold, and a molding pressure of 200 MPa was applied to the granulated powder through use of a press molding machine to produce a disc-shaped molding. The dimensions of the mold used for the disc-shaped molding had a margin of 2 mm, 2 mm, and 0.5 mm with respect to the outer diameter, the inner diameter, and the thickness of intended disc-shaped piezoelectric ceramics, respectively.

The obtained molding was placed in an electric furnace and held at a highest temperature of 1,000° C. for 10 hours, to thereby sinter the molding in an atmospheric atmosphere over a total of 48 hours. Next, the sintered body was ground into an annular shape having a desired outer diameter, inner diameter, and thickness to provide an annular piezoelectric ceramic piece.

Piezoelectric ceramic pieces, which were manufactured so as to have an outer diameter within a range of from 54 mm to 90 mm, an inner diameter within a range of from 38 mm to 84 mm, and a thickness within a range of from 0.3 mm to 1.0 mm, were able to have equivalent piezoelectric characteristics. The vibrator 1 and the ultrasonic motor of the present invention can be manufactured through use of a piezoelectric ceramic piece having any dimensions within the above-mentioned ranges. However, for convenience of description, an annular piezoelectric ceramic piece having an outer diameter of 61.9 mm, an inner diameter of 54.1 mm, and a thickness of 0.5 mm is described as a typical example.

The average circle equivalent diameter and the relative density of crystal grains forming the manufactured piezoelectric ceramic piece were evaluated, and a piezoelectric ceramic piece having an average circle equivalent diameter of from 0.5 μm to 10.0 μm and a relative density of 95% or more was used for manufacturing a piezoelectric element in the next step. For calculation of the average circle equivalent diameter, a polarization microscope and a scanning electron microscope were used. The relative density was evaluated by the Archimedes' method.

It was found from the X-ray diffraction measurement of an annular surface that all the piezoelectric ceramic pieces manufactured by the above-mentioned method had a perovskite structure.

The composition of the piezoelectric ceramic piece was evaluated by ICP emission spectroscopic analysis. As a result, the content of lead of all the piezoelectric ceramic pieces manufactured by the above-mentioned method was less than 5 ppm in each piece. Through the combination of the results of ICP emission spectroscopic analysis and X-ray diffraction measurement, it was found that the composition of the piezoelectric ceramic piece contained, as a main component, a perovskite type metal oxide that can be represented by the composition of $[\{Ba_{0.75} (Bi_{0.5}Na_{0.5})_{0.25}\}_{0.08} (Na_{0.49}Li_{0.02}K_{0.49})_{0.92}]_{1.00} \{(Ti_{0.20}Zr_{0.75}Hf_{0.05})_{0.08}(Nb_{0.90}Ta_{0.10})_{0.92}\}O_3$ and contained 0.25 part by weight of Mn with respect to 100 parts by weight of the main component.

(Manufacturing Example of BCTZ-Based Piezoelectric Ceramics)

With intent to add Mn and Bi to $(Ba_{0.84}Ca_{0.16})_{1.006} (Ti_{0.94}Zr_{0.06}) O_3$ corresponding to the composition of s of 0.16, t of 0.06, and a of 1.006 in the general formula (2), corresponding raw material powders were weighed as follows.

Barium titanate, calcium titanate, and calcium zirconate each having an average particle diameter of 300 nm or less and a perovskite type structure, serving as raw material powders, were weighed so that Ba, Ca, Ti, and Zr satisfied the composition of $(Ba_{0.84}Ca_{0.16})_{1.006} (Ti_{0.94}Zr_{0.06})O_3$. In order to adjust "α" representing the molar ratio of the A-site and the B-site, barium carbonate and titanium oxide were used. Trimanganese tetroxide was added to the resultant so that the content of Mn was 0.18 part by weight in terms of a metal with respect to 100 parts by weight of the composition of $(Ba_{0.84}Ca_{0.16})_{1.006} (Ti_{0.94}Zr_{0.06})O_3$. Similarly, bismuth oxide was added to the resultant so that the content of Bi was 0.26 part by weight in terms of a metal.

Those weighed powders were mixed by dry blending for 24 hours through use of a ball mill to provide mixed powder. In order to granulate the obtained mixed powder, 3 parts by weight of a PVA binder with respect to the mixed powder were caused to adhere to the surface of the mixed powder through use of a spray dryer.

Next, the obtained granulated powder was supplied to a mold, and a molding pressure of 200 MPa was applied to the granulated powder through use of a press molding machine to produce a disc-shaped molding. The dimensions of the mold used for the disc-shaped molding had a margin of 2 mm, 2 mm, and 0.5 mm with respect to the outer diameter, the inner diameter, and the thickness of the intended disc-shaped piezoelectric ceramics, respectively.

The obtained molding was placed in an electric furnace and held at a highest temperature of 1,380° C. for 5 hours, to thereby sinter the molding in an atmospheric atmosphere over a total of 24 hours. Next, the sintered body was ground into an annular shape having a desired outer diameter, inner diameter, and thickness to provide an annular piezoelectric ceramic piece.

Piezoelectric ceramic pieces, which were manufactured so as to have an outer diameter within a range of from 54 mm to 90 mm, an inner diameter within a range of from 38 mm to 84 mm, and a thickness within a range of from 0.3 mm to 1.0 mm, were able to have equivalent piezoelectric characteristics. The vibrator and the ultrasonic motor of the present invention can be manufactured through use of a piezoelectric ceramic piece having any dimensions within the above-mentioned ranges. However, for convenience of description, an annular piezoelectric ceramic piece having an outer diameter of 61.9 mm, an inner diameter of 54.1 mm, and a thickness of 0.5 mm is described as a typical example.

The average circle equivalent diameter and the relative density of crystal grains forming the manufactured piezoelectric ceramic piece were evaluated, and a piezoelectric ceramic piece having an average circle equivalent diameter of from 0.7 µm to 3.0 µm and a relative density of 95% or more was used for manufacturing a piezoelectric element in the next step. For calculation of the average circle equivalent diameter, a polarization microscope and a scanning electron microscope were used. The relative density was evaluated by the Archimedes' method.

It was found from the X-ray diffraction measurement of an annular surface that any of the piezoelectric ceramic pieces manufactured by the above-mentioned method had a perovskite structure of a tetragonal crystal system.

The composition of the piezoelectric ceramic piece was evaluated by ICP emission spectroscopic analysis. As a result, the content of lead of any of the piezoelectric ceramic pieces manufactured by the above-mentioned method was less than 1 ppm. Through the combination of the results of ICP emission spectroscopic analysis and X-ray diffraction measurement, it was found that the composition of the piezoelectric ceramic piece contained, as a main component, a perovskite type metal oxide which can be represented by the composition of $(Ba_{0.84}Ca_{0.16})_{1.006}(Ti_{0.94}Zr_{0.06})O_3$ and contained 0.18 part by weight of Mn and 0.26 part by weight of Bi with respect to 100 parts by weight of the main component.

(Manufacturing Example of BCT-Based Piezoelectric Ceramics)

With intent to add Mn to $(Ba_{0.90}Ca_{0.10})_{1.000}TiO_3$ corresponding to the composition of s of 0.10, t of 0, and a of 1.000 in the general formula (2), corresponding raw material powders were weighed as follows.

Barium titanate and calcium titanate each having an average particle diameter of 300 nm or less and a perovskite type structure, serving as raw material powders, were weighed so that Ba, Ca, and Ti satisfied the composition of $(Ba_{0.90}Ca_{0.10})_{1.000}TiO_3$. In order to adjust "α" representing the molar ratio of the A-site and the B-site, barium carbonate and titanium oxide were used. Manganese carbonate was added to the resultant so that the content of Mn was 0.24 part by weight in terms of a metal with respect to 100 parts by weight of the composition of $(Ba_{0.90}Ca_{0.10})_{1.000}TiO_3$.

Those weighed powders were mixed by wet blending for 16 hours through use of a ball mill to provide mixed powder. The obtained mixed powder was calcined at 1,000° C. for 2 hours to provide calcined powder. The obtained calcined powder was wet pulverized for 8 hours. After that, 3 parts by weight of a PVA binder with respect to the calcined powder was caused to adhere to the surface of the calcined powder through use of a spray dryer.

Next, the obtained granulated powder was supplied to a mold, and a molding pressure of 200 MPa was applied to the granulated powder through use of a press molding machine to produce a disc-shaped molding. The dimensions of the mold used for the disc-shaped molding had a margin of 2 mm, 2 mm, and 0.5 mm with respect to the outer diameter, the inner diameter, and the thickness of intended disc-shaped piezoelectric ceramics, respectively.

The obtained molding was placed in an electric furnace and held at a highest temperature of 1,300° C. for 10 hours, to thereby sinter the molding in an atmospheric atmosphere over a total of 48 hours. Next, the sintered body was ground into an annular shape having a desired outer diameter, inner diameter, and thickness to provide an annular piezoelectric ceramic piece.

Piezoelectric ceramic pieces, which were manufactured so as to have an outer diameter within a range of from 54 mm to 90 mm, an inner diameter within a range of from 38 mm to 84 mm, and a thickness within a range of from 0.3 mm to 1.0 mm, were able to have equivalent piezoelectric characteristics. The vibrator and the ultrasonic motor of the present invention can be manufactured through use of a piezoelectric ceramic piece having any dimensions within the above-mentioned ranges. However, for convenience of description, an annular piezoelectric ceramic piece having an outer diameter of 61.9 mm, an inner diameter of 54.1 mm, and a thickness of 0.5 mm is described as a typical example.

The average circle equivalent diameter and the relative density of crystal grains forming the manufactured piezoelectric ceramic piece were evaluated, and a piezoelectric ceramic piece having an average circle equivalent diameter of from 1.5 µm to 20.0 µm and a relative density of 90% or more was used for manufacturing a piezoelectric element in the next step. For calculation of the average circle equivalent diameter, a polarization microscope and a scanning electron microscope were used. The relative density was evaluated by the Archimedes' method.

It was found from the X-ray diffraction measurement of an annular surface that any of the piezoelectric ceramic pieces manufactured by the above-mentioned method had a perovskite structure of a tetragonal crystal system.

The composition of the piezoelectric ceramic piece was evaluated by ICP emission spectroscopic analysis. As a result, the content of lead of any of the piezoelectric ceramic pieces manufactured by the above-mentioned method was less than 1 ppm. Through the combination of the results of ICP emission spectroscopic analysis and X-ray diffraction measurement, it was found that the composition of the piezoelectric ceramic piece contained, as a main component, a perovskite type metal oxide that can be represented by the composition of $(Ba_{0.90}Ca_{0.10})_{1.000}TiO_3$ and contained 0.24 part by weight of Mn with respect to 100 parts by weight of the main component.

(Manufacturing Example of NN-BT-Based Piezoelectric Ceramics)

With intent to add Cu to $(Na_{0.85}Ba_{0.12})(Nb_{0.88}Ti_{0.12})O_3$ corresponding to the composition of q of 0.85 and r of 0.88 in the general formula (3), corresponding raw material powders were weighed as follows.

Sodium niobate and barium titanate each having an average particle diameter of 300 nm or less and having a perovskite type structure, serving as raw material powders, were weighed so that Na, Ba, Nb, and Ti satisfied the composition of $(Na_{0.88}Ba_{0.12})(Nb_{0.88}Ti_{0.12})O_3$. There is a possibility that a Na component may volatilize during the sintering step, and hence the loading ratio of Na was set to be excessive. Copper oxide (Cu(II)O) was added to the resultant so that the content of Cu was 0.10 part by weight in terms of a metal with respect to 100 parts by weight of the composition of $(Na_{0.88}Ba_{0.12})(Nb_{0.88}Ti_{0.12})O_3$.

Those weighed powders were mixed by dry blending for 24 hours through use of a ball mill to provide mixed powder. The obtained mixed powder was calcined at 1,000° C. for 2 hours to provide calcined powder. The obtained calcined powder was dry pulverized for 8 hours. After that, 3 parts by weight of a PVA binder with respect to the calcined powder was caused to adhere to the surface of the calcined powder through use of a spray dryer.

Next, the obtained granulated powder was supplied to a mold, and a molding pressure of 200 MPa was applied to the granulated powder through use of a press molding machine to produce a disc-shaped molding. The dimensions of the mold used for the disc-shaped molding had a margin of 2 mm, 2 mm, and 0.5 mm with respect to the outer diameter, the inner diameter, and the thickness of intended disc-shaped piezoelectric ceramics, respectively.

The obtained molding was placed in an electric furnace and held at a highest temperature of 1,150° C. for 5 hours, to thereby sinter the molding in an atmospheric atmosphere over a total of 24 hours. Next, the sintered body was ground into an annular shape having a desired outer diameter, inner diameter, and thickness to provide an annular piezoelectric ceramic piece.

Piezoelectric ceramic pieces, which were manufactured so as to have an outer diameter within a range of from 54 mm to 90 mm, an inner diameter within a range of from 38 mm to 84 mm, and a thickness within a range of from 0.3 mm to 1.0 mm, were able to have equivalent piezoelectric characteristics. The vibrator and the ultrasonic motor of the present invention can be manufactured through use of a piezoelectric ceramic piece having any dimensions within the above-mentioned ranges. However, for convenience of description, an annular piezoelectric ceramic piece having an outer diameter of 61.9 mm, an inner diameter of 54.1 mm, and a thickness of 0.5 mm is described as a typical example.

The average circle equivalent diameter and the relative density of crystal grains forming the manufactured piezoelectric ceramic piece were evaluated, and a piezoelectric ceramic piece having an average circle equivalent diameter of from 0.5 μm to 20.0 μm and a relative density of 95% or more was used for manufacturing a piezoelectric element in the next step. For calculation of the average circle equivalent diameter, a polarization microscope and a scanning electron microscope were used. The relative density was evaluated by the Archimedes' method.

It was found from the X-ray diffraction measurement of an annular surface that any of the piezoelectric ceramic pieces manufactured by the above-mentioned method had a perovskite structure.

The composition of the piezoelectric ceramic piece was evaluated by ICP emission spectroscopic analysis. As a result, the content of lead of any of the piezoelectric ceramic pieces manufactured by the above-mentioned method was less than 1 ppm. Through the combination of the results of ICP emission spectroscopic analysis and X-ray diffraction measurement, it was found that the composition of the piezoelectric ceramic piece contained, as a main component, a perovskite type metal oxide which can be represented by the composition of $(Na_{0.85}Ba_{0.12})(Nb_{0.88}Ti_{0.12})O_3$ and contained 0.10 part by weight of Cu with respect to 100 parts by weight of the main component.

Figure 14A:
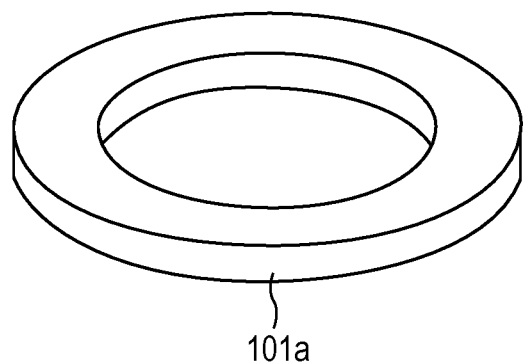
FIG. 14A and FIG. 14B are each a schematic step view for illustrating an example of a manufacturing process of the annular vibrating plate to be used in the ultrasonic motor and the vibrator of the present invention.
Figure 14B:
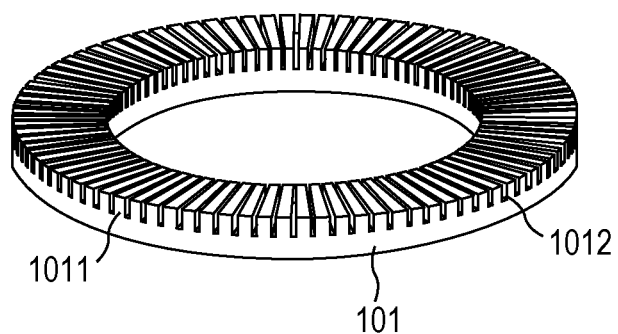

Manufacturing Example 1 of Vibrating Plate in which Arrangement of Protrusion Regions and Groove Regions is Non-Uniform FIG. 14A and FIG. 14B are each a schematic step view for illustrating an example of a method of manufacturing an annular vibrating plate to be used in the ultrasonic motor and the vibrator of the present invention.

In order to manufacture a vibrating plate to be used in the present invention, an annular metal plate 101a as illustrated in FIG. 14A was prepared. The metal plate 101a is formed of magnetic stainless steel SUS420J2 of JIS. SUS420J2 is martensite stainless steel that is an alloy containing 70 mass % or more of steel and 12 mass % to 14 mass % of chromium.

The outer diameter, inner diameter, and maximum thickness of the metal plate 101a were set to intended values of the outer diameter 2R, the inner diameter $2R_{in}$, and the maximum thickness $T_{dia}$ of the vibrating plate 101 illustrated in FIG. 14B. A vibrating plate applicable to the vibrator and the ultrasonic motor of the present invention was able to be manufactured with the metal plate 101a having an outer diameter within a range of from 56 mm to 90 mm, an inner diameter within a range of from 40 mm to 84 mm, and a thickness within a range of from 4 mm to 6 mm. In this manufacturing example, for convenience of description, the metal plate 101a having the outer diameter 2R of 62.2 mm, the inner diameter $2R_{in}$ of 54.0 mm, and the maximum thickness $T_{dia}$ of 5.0 mm is described as a typical example.

Next, 63 (X=63) groove regions 1012 were mechanically formed in a radial manner by grinding one surface (second surface) of the annular metal plate 101a (grooving). In this case, a corner of a metal at a top end of each groove region 1012 was chamfered by 0.3 mm, to thereby form 63 (X=63) protrusion regions 1011 each having a vibrating plate thickness at a center position larger than the vibrating plate thickness at a border position. The wall surface of each groove region 1012 was set to be perpendicular when viewed from the first surface of the vibrating plate 101 that was not subjected to grooving. A groove bottom portion of each groove region 1012 was formed into an inclined shape that is deepest at a center thereof as illustrated in FIG. 6C. The radius of a corner portion of the groove bottom of each groove region 1012 was from 0.2 mm or more and 0.4 mm or less. The metal plate 101a after grooving was subjected to barrel treatment, lapping, and electroless nickel plating, to thereby provide the vibrating plate 101 to be used in the vibrator 1 of the present invention.

The groove region 1012 of the vibrating plate 101 was formed into a rectangular parallelepiped shape having a width of 1.0 mm when viewed from the second surface side. Therefore, the protrusion region 1011 was formed into a fan shape having a width enlarged on the annular outer diameter side. As a result, the average value $L_{top}$ of the length of the protrusion region 1011 in the circumferential direction on the outer diameter side and the average value $L_{btm}$ of the length of the groove region 1012 in the circumferential direction on the outer diameter side had a relationship: $L_{top}/L_{btm}=2.10$.

The arrangement of the protrusion regions 1011 and the groove regions 1012 in the vibrating plate 101 was set to be non-uniform as illustrated in FIG. 10A. That is, a procedure for determining the lengths of the protrusion regions 1011 in a non-uniform manner was used. Specifically, the arrangement in which an angle between the groove regions 1012 adjacent to each other was about 6° when viewed from the center of the annular ring was provided in 30 portions, and the arrangement in which an angle between the groove regions 1012 adjacent to each other was about 5.45° when viewed from the center of the annular ring was provided in 33 portions. Actually, the angles were finely adjusted so that a total angle became 360°. As a result, when the maximum value of the lengths was represented by $L_{max}$ and the minimum value thereof was represented by $L_{min}$ in the lengths of the 63 protrusion regions 1011 in the circumferential direction on the outer diameter side, a relationship: $L_{max}/L_{min}=1.10$ was satisfied.

Center depths $D_1$ to $D_{63}$ of the 63 groove regions 1012 of the vibrating plate 101 were set to depths as shown in FIG. 7B. That is, the center depths $D_1$ to $D_{63}$ change so as to follow a curve obtained by superimposing four sine waves on one another. As is understood from FIG. 7B and FIG. 7A corresponding to FIG. 7B, the numbers of local maximum regions and local minimum regions of the change were 12, respectively. The local maximum regions and the local minimum regions of the change were not adjacent to each other. The maximum absolute value of the center depths $D_1$ to $D_{63}$ was 2.15 mm, and the minimum absolute value thereof was 1.55 mm. Therefore, a difference therebetween was 0.60 mm, which was 12.0% with respect to the maximum thickness $T_{dia}$ (5.0 mm) of the vibrating plate 101. The average of the absolute values of the center depths $D_1$ to $D_{63}$ was 1.85 mm, which was 37.0% with respect to the maximum thickness $T_{dia}$ (5.0 mm) of the vibrating plate 101.

A vibrating plate having 2R of 62.2 mm, $2R_{in}$ of 54.0 mm, $T_{dia}$ of 5.0 mm, X of 63, $L_{top}/L_{btm}$ of 2.10, and $L_{max}/L_{min}$ regarding the protrusion region of 1.10, manufactured in this manufacturing example, was defined as a vibrating plate V1A.

The number and shapes of the protrusion regions 1011 and the groove regions 1012 of FIG. 14B, the heights of the protrusion regions 1011, and the center depths of the groove regions 1012 are schematically illustrated, and the present invention is not limited to the shapes of FIG. 14B.

Manufacturing Example 2 of Vibrating Plate in which Arrangement of Protrusion Regions and Groove Regions is Non-Uniform A vibrating plate V1B was manufactured through use of the same raw materials and manufacturing method as those of the vibrating plate V1A.

The arrangement of the protrusion regions 1011 and the groove regions 1012 in the vibrating plate 101 was set to be non-uniform as illustrated in FIG. 10B. That is, a procedure for determining the lengths of the groove regions 1012 in a non-uniform manner was used.

Specifically, the arrangement in which an angle between the protrusion regions 1011 adjacent to each other was about 6° when viewed from the center of the annular ring was provided in 30 portions, and the arrangement in which an angle between the protrusion regions 1011 adjacent to each other was about 5.45° when viewed from the center of the annular ring was provided in 33 portions. Actually, the angles were finely adjusted so that a total angle became 360°.

A central coordinate of the groove region 1012 in the vibrating plate V1B was different from that in the vibrating plate V1A. Therefore, the center depths $D_1$ to $D_{63}$ of the 63 groove regions 1012 of the vibrating plate 101 were set to those shown in FIG. 7D. The number of local maximum regions of the change and the number of local minimum regions of the change were 12, respectively.

When the maximum value of the lengths was represented by $L_{max}$ and the minimum value thereof was represented by $L_{min}$ in the lengths of the 63 groove regions 1012 in the circumferential direction on the outer diameter side, a relationship: $L_{max}/L_{min}=1.10$ was satisfied.

Through the above-mentioned steps, the vibrating plate V1B having 2R of 62.2 mm, $2R_{in}$ of 54.0 mm, $T_{dia}$ of 5.0 mm, X of 63, $L_{top}/L_{btm}$ of 2.10, and $L_{max}/L_{min}$ regarding the groove region of 1.10 was obtained.

The local maximum regions and the local minimum regions of the change of the center depths $D_1$ to $D_{63}$ of the vibrating plate V1B were not adjacent to each other. The maximum absolute value of the center depths $D_1$ to $D_{63}$ was 2.14 mm, and the minimum absolute value thereof was 1.56 mm. Therefore, a difference therebetween was 0.58 mm, which was 11.6% with respect to the maximum thickness $T_d$, (5.0 mm) of the vibrating plate V1B. The average of the absolute values of the center depths $D_1$ to $D_{63}$ was 1.85 mm, which was 37.0% with respect to the maximum thickness $T_d$, (5.0 mm) of the vibrating plate 101.

(Manufacturing Example of Vibrating Plate in which Arrangement of Protrusion Regions and Groove Regions is Uniform)

A vibrating plate V2 having 2R of 62.2 mm, $2R_{in}$ of 54.0 mm, $T_{dia}$ of 5.0 mm, X of 63, $L_{top}/L_{btm}$ of 2.10, and $L_{max}/L_{min}$ regarding the protrusion region and the groove region of 1.00 was manufactured through use of the same raw materials and manufacturing method as those of the vibrating plates V1A and V1B except that the arrangement of the protrusion regions and the groove regions was uniform.

A central coordinate of the groove region 1012 in the vibrating plate V2 was different from those in the vibrating plates V1A and V1B. Therefore, the center depths $D_1$ to $D_{63}$ of the 63 groove regions 1012 of the vibrating plate 101 were set to those shown in FIG. 8B. The number of local maximum regions of the change and the number of local minimum regions of the change were 12, respectively.

Through the above-mentioned steps, the vibrating plate V2 having 2R of 62.2 mm, $2R_{in}$ of 54.0 mm, $T_{dia}$ of 5.0 mm, X of 63, $L_{top}/L_{btm}$ of 2.10, and $L_{max}/L_{min}$ regarding the groove region of 1.00 was obtained.

The local maximum regions and the local minimum regions of the change of the center depths $D_1$ to $D_{63}$ of the vibrating plate V2 were not adjacent to each other. The maximum absolute value of the center depths $D_1$ to $D_{63}$ was 2.14 mm, and the minimum absolute value thereof was 1.56 mm. Therefore, a difference therebetween was 0.58 mm, which was 11.6% with respect to the maximum thickness $T_d$, (5.0 mm) of the vibrating plate V2. The average of the absolute values of the center depths $D_1$ to $D_{63}$ was 1.85 mm, which was 37.0% with respect to the maximum thickness $T_{dia}$ (5.0 mm) of the vibrating plate 101.

(Manufacturing Example of Vibrating Plate in which Arrangement of Protrusion Regions and Groove Regions is Uniform)

A vibrating plate V3 having 2R of 88.0 mm, $2R_{in}$ of 78.0 mm, $T_{dia}$ of 6.0 mm, X of 90, $L_{top}/L_{btm}$ of 1.45, and $L_{max}/L_{min}$ regarding the protrusion region and the groove region of 1.00 was manufactured through use of the same raw materials and manufacturing method as those of the vibrating plate V2.

The center depths $D_1$ to $D_{90}$ of the 90 groove regions 1012 of the vibrating plate 101 were set to those shown in FIG. 8D. The number of local maximum regions of the change and the number of local minimum regions of the change were 16, respectively.

The local maximum regions and the local minimum regions of the change of the center depths $D_1$ to $D_{90}$ of the vibrating plate V3 were not adjacent to each other. The maximum absolute value of the center depths $D_1$ to $D_{90}$ was 2.39 mm, and the minimum absolute value thereof was 1.50 mm. Therefore, a difference therebetween was 0.89 mm, which was 14.8% with respect to the maximum thickness $T_d$, (6.0 mm) of the vibrating plate V3. The average of the absolute values of the center depths $D_1$ to $D_{90}$ was 1.95 mm, which was 32.5% with respect to the maximum thickness $T_{dia}$ (6.0 mm) of the vibrating plate 101.

The magnitude relationship of the center depths $D_1$ to $D_{45}$ and the magnitude relationship of the center depths $D_{46}$ to $D_{90}$ were as shown in Table 1. In Table 1, a suffix of $D_X$ is shown in a large size so that the suffix can be easily recognized visually. As is understood from Table 1, in the vibrating plate V3 in which X was 90, that is, X was an even number, of the center depths $D_1$ to $D_{90}$, the change of the center depths $D_1$ to $D_{90/2}$ was matched with the change of the center depths $D_{90/2+1}$ to $D_{90}$. With such configuration, the unnecessary vibration waves other than the 7th order vibration wave can be further suppressed.

TABLE 1

| Symbol of center depth of groove region | Actually measured depth [mm] | Symbol of center depth of groove region | Actually measured depth [mm] |
| --- | --- | --- | --- |
| D30 | 2.392 | D75 | 2.392 |
| D18 | 2.363 | D63 | 2.363 |
| D40 | 2.337 | D85 | 2.337 |
| D1  | 2.311 | D46 | 2.311 |
| D29 | 2.298 | D74 | 2.298 |
| D19 | 2.273 | D64 | 2.273 |
| D2  | 2.250 | D47 | 2.250 |
| D41 | 2.237 | D86 | 2.237 |
| D31 | 2.175 | D76 | 2.175 |
| D8  | 2.159 | D53 | 2.159 |
| D7  | 2.126 | D52 | 2.126 |
| D39 | 2.122 | D84 | 2.122 |
| D17 | 2.106 | D62 | 2.106 |
| D12 | 2.103 | D57 | 2.103 |
| D11 | 2.081 | D56 | 2.081 |
| D24 | 2.077 | D69 | 2.077 |
| D23 | 2.073 | D68 | 2.073 |
| D9  | 2.055 | D54 | 2.055 |
| D45 | 2.015 | D90 | 2.015 |
| D10 | 2.012 | D55 | 2.012 |
| D20 | 1.974 | D65 | 1.974 |
| D28 | 1.926 | D73 | 1.926 |
| D13 | 1.926 | D58 | 1.926 |
| D3  | 1.895 | D48 | 1.895 |
| D32 | 1.894 | D77 | 1.894 |
| D35 | 1.889 | D80 | 1.899 |
| D22 | 1.881 | D67 | 1.881 |
| D6  | 1.879 | D51 | 1.879 |
| D42 | 1.876 | D87 | 1.876 |
| D34 | 1.847 | D79 | 1.847 |
| D38 | 1.835 | D83 | 1.835 |
| D25 | 1.826 | D70 | 1.826 |
| D36 | 1.809 | D81 | 1.809 |
| D21 | 1.792 | D66 | 1.792 |
| D33 | 1.786 | D78 | 1.786 |
| D37 | 1.728 | D82 | 1.728 |
| D16 | 1.704 | D61 | 1.704 |
| D44 | 1.654 | D89 | 1.654 |
| D14 | 1.632 | D59 | 1.632 |
| D5  | 1.606 | D50 | 1.606 |
| D4  | 1.591 | D49 | 1.591 |
| D43 | 1.587 | D88 | 1.587 |
| D27 | 1.586 | D72 | 1.586 |
| D26 | 1.562 | D71 | 1.562 |
| D15 | 1.499 | D60 | 1.499 |

(Manufacturing Example of Vibrating Plate for Comparison in which Arrangement of Protrusion Regions and Groove Regions and Center Depth of Each Groove Region are Uniform)

For comparison with the present invention, a vibrating plate V1R having 2R of 62.2 mm, $2R_{in}$ of 54.0 mm, $T_{dia}$ of 5.0 mm, X of 63, $L_{top}/L_{btm}$ of 2.10, and $L_{max}/L_{min}$ regarding the protrusion region and the groove region of 1.00 was manufactured through use of the same raw materials and manufacturing method as those of the vibrating plate V2. The center depths $D_1$ to $D_{63}$ of the 63 groove regions of the vibrating plate V1R were all set to 1.85 mm.

Separately, also for comparison with the present invention, a vibrating plate V3R having 2R of 88.0 mm, $2R_{in}$ of 78.0 mm, $T_{dia}$ of 6.0 mm, X of 90, $L_{top}/L_{btm}$ of 1.45, and $L_{max}/L_{min}$ regarding the protrusion region and the groove region of 1.00 was manufactured through use of the same raw materials and manufacturing method as those of the vibrating plate V3. The center depths $D_1$ to $D_{90}$ of the 90 groove regions of the vibrating plate V3R were all set to 1.95 mm.

(Verification of Change in Center Depth of Groove Region of Vibrating Plate)

The vibrating plates V1A, V1B, V2, and V3 to be used in the vibrator and the ultrasonic motor of the present invention and the vibrating plates V1R and V3R for comparison were measured for the center depth of each groove region. Rows of values of those center depths were subjected to fast Fourier transformation to be converted into a function with a spatial frequency having one round of a vibrating body as one cycle being a variable. The calculation results are shown in FIG. 15A to FIG. 15C.

Figure 15A:
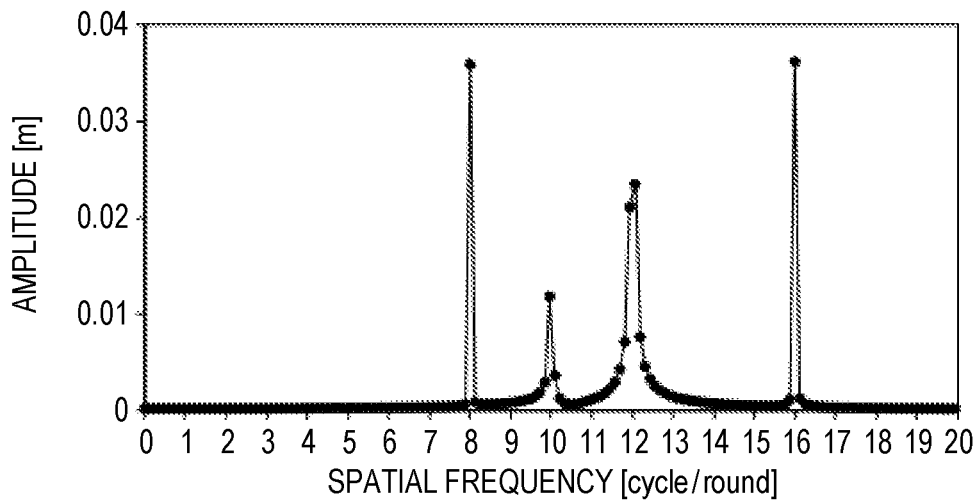
FIG. 15A, FIG. 15B, and FIG. 15C are each a graph for verifying a change in center depth of the groove region in a manufacturing example of the vibrating plate.

FIG. 15A is a graph for showing the calculation results of the vibrating plate V2. Substantially the same plot was obtained also in the vibrating plates V1A and V1B. It is understood from FIG. 15A that the center depth of the groove region of the vibrating plate changes along a synthetic wave of four sine waves having spatial frequencies of 8, 10, 12, and 16.

Figure 15B:
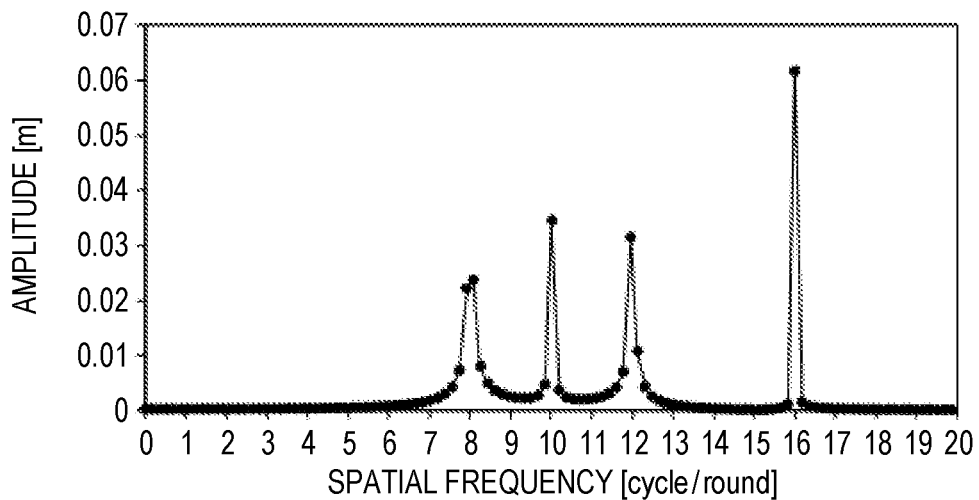

FIG. 15B is a graph for showing the calculation results of the vibrating plate V3. It is understood from FIG. 15B that the center depth of the groove region of the vibrating plate changes along a synthetic wave of four sine waves having spatial frequencies of 8, 10, 12, and 16.

Figure 15C:
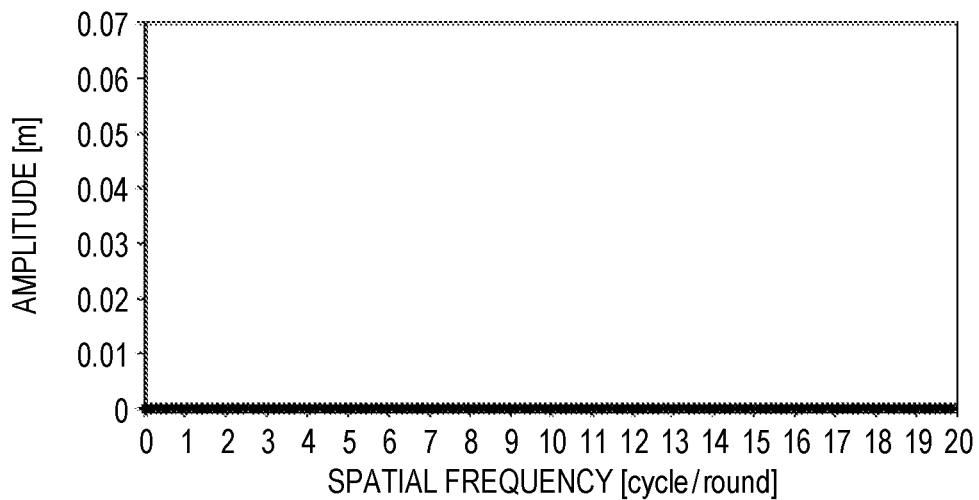

FIG. 15C is a graph for showing the calculation results of the vibrating plate V3R. Substantially the same plot was obtained also in the vibrating plate V1R. There was no change in center depth of the groove region, and hence the amplitude represented by the vertical axis of the plot does not change.

(Manufacturing Example and Comparative Example of Vibrator)

FIG. 16A to FIG. 16E are each a schematic step view for illustrating an example of a method of manufacturing the vibrator and the ultrasonic motor of the present invention.

The KNN-based piezoelectric ceramics, the BCTZ-based piezoelectric ceramics, the BCT-based piezoelectric ceramics, and the NN-BT-based piezoelectric ceramics described in the manufacturing examples, and the vibrating plates V1A, V1B, V2, and V3 were combined to manufacture a plurality of vibrators and ultrasonic motors.

Vibrators and ultrasonic motors for comparison were manufactured through use of the vibrating plates V1R and V3R for comparison.

Figure 16A:
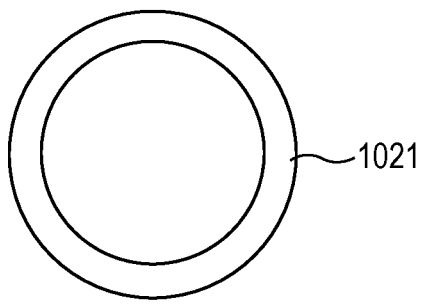
FIG. 16A, FIG. 16B, FIG. 16C, FIG. 16D, and FIG. 16E are each a schematic step view for illustrating an example of a manufacturing process of the ultrasonic motor of the present invention.
Figure 16B:
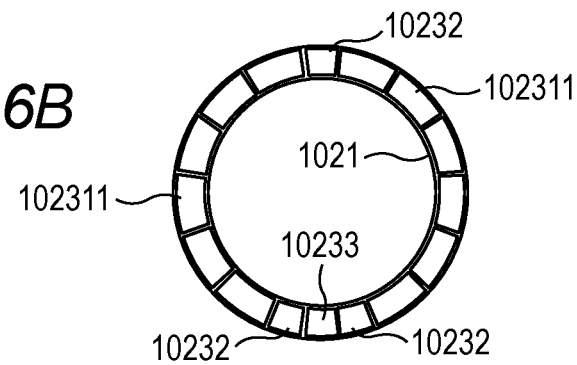
Figure 16C:
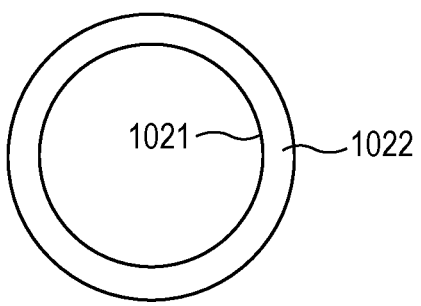

First, the annular piezoelectric ceramic piece 1021 illustrated in FIG. 16A was subjected to screen printing of a silver paste, to thereby form the common electrode 1022 on one surface as illustrated in FIG. 16C and the polarizing electrodes 102311 in 12 portions, the non-drive phase electrodes 10232 in 3 portions, and the detection phase electrode 10233 in 1 portion on the other surface as illustrated in FIG. 16B. In this case, the distance between the respective adjacent electrodes illustrated in FIG. 16B was set to 0.5 mm.

Next, polarization treatment was performed between the common electrode 1022, and the polarizing electrodes 102311, the non-drive phase electrodes 10232, and the detection phase electrode 10233 in air through use of a DC power source so that the expansion and contraction polarity of the piezoelectric element became as illustrated in FIG. 4A. The voltage was set to a value at which an electric field of 1.0 kV/mm was applied, and the temperature and the voltage application time were set to 100° C. and 60 minutes, respectively. The voltage was applied during a decrease in temperature until the temperature reached 40° C.

Figure 16D:
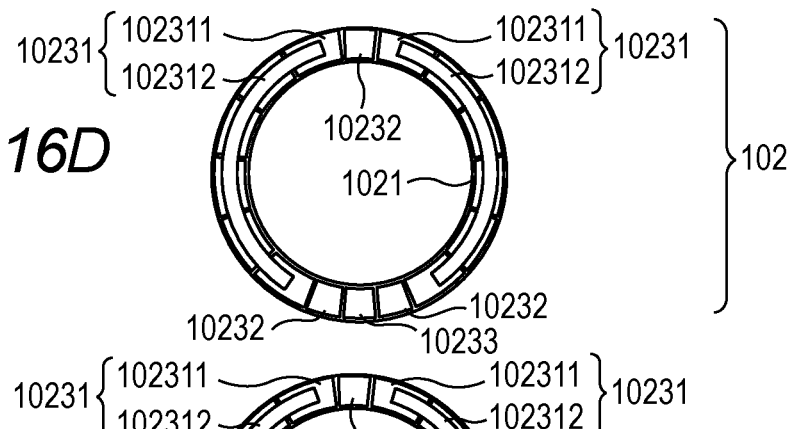

Next, as illustrated in FIG. 16D, in order to connect the polarizing electrodes 102311, the connecting electrode 102312 was formed through use of a silver paste, and both kinds of the electrodes were combined to form the drive phase electrodes 10231 in 2 portions, to thereby provide the piezoelectric element 102. The silver paste was dried at temperature sufficiently lower than the depolarization temperature of the piezoelectric ceramic piece 1021. A resistance of the drive phase electrode 10231 was measured with a circuit tester (electric tester). One side of the circuit tester was brought into contact with the surface of a portion of the polarizing electrodes 102311 closest to the detection phase electrode 10233, and the other side thereof was brought into contact with the surface of a portion of the polarizing electrodes 102311 farthest from the detection phase electrode 10233 in the circumferential direction of the annular shape in the drive phase electrode 10231. As a result, the resistance of the drive phase electrode 10231 was 0.6Ω.

In this stage, as a sampling inspection of the piezoelectric element 102, a test piece was cut out and various characteristics of the piezoelectric ceramic piece 1021 were evaluated. Specifically, in the piezoelectric element 102, a rectangular strip having, for example, a length of 10 mm, a width of 2.5 mm, and a thickness of 0.05 mm was cut out from a region of one polarizing electrode 102311. The strip was measured by the resonance-antiresonance method at room temperature (20° C.), to thereby obtain the piezoelectric constant $d_{31}$, the mechanical quality factor $Q_m$, and the Young's modulus $Y_{11}$. The results are shown in Table 2.

TABLE 2

| Composition of piezoelectric ceramics | Piezoelectric constant $|d_{31}|$ [pm/V] | Mechanical quality factor $Q_m$ [—] | Young's modulus $Y_{11}$ [$10^9$Pa] |
|---|---|---|---|
| KNN-based | 100 | 100 | 95 |
| BCTZ-based | 95 | 1,100 | 120 |
| BCT-based | 50 | 2,000 | 140 |
| NN-BT-based | 50 | 450 | 145 |

(Note)
Measurement results at room temperature (20° C.)

Figure 16E:
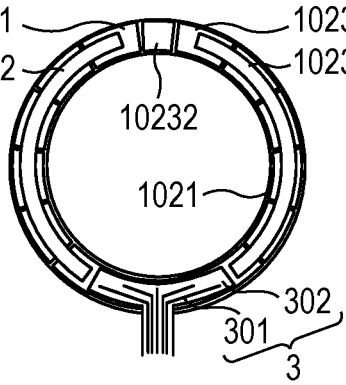

Next, as illustrated in FIG. 16E, a flexible printed board 3 was pressure-bonded onto a region extending across the drive phase electrodes 10231 in 2 portions, the non-drive phase electrodes 10232 in 2 portions, and the detection phase electrode 10233 of the piezoelectric element 102 in a room temperature process through use of a moisture-curable epoxy resin adhesive. The flexible printed board 3 is an element to be arranged for the purpose of supplying electricity to the electrode group and taking out a detection signal, and includes electric wiring 301, an insulating base film 302, and a connector region (not shown) to be connected to an external drive circuit.

Next, as illustrated in FIG. 1A, the piezoelectric element 102 was pressure-bonded onto the first surface of the vibrating plate 101 (any of V1A, V1B, V2, V3, V1R, and V3R) in a room temperature process through use of a moisture-curable epoxy resin adhesive, and the vibrating plate 101 and the non-drive phase electrodes 10232 in 3 portions were connected to each other through short-circuited wiring (not shown) formed of a silver paste, to thereby manufacture the vibrator 1 of the present invention or a vibrator for comparison. The silver paste was dried at temperature sufficiently lower than the depolarization temperature of the piezoelectric ceramic piece 1021. The Young's modulus at room temperature of the epoxy adhesive after curing was measured in accordance with JIS K6911 to be about 2.5 GPa.

In the vibrator 1 using the vibrating plate V1A, pressure bonding was performed so that the 60th groove region of FIG. 7A was arranged so as to be closest to the detection phase electrode 10233. In this case, the relationship of the center depths of the 59th, 60th, and 61st groove regions was $|D_{61}-D_{59}|/D_{60}=1.9\%$.

In the vibrator 1 using the vibrating plate V1B, pressure bonding was performed so that the 33rd groove region of FIG. 7C was arranged so as to be closest to the detection phase electrode 10233. In this case, the relationship of the center depths of the 32nd, 33rd, and 34th groove regions was $|D_{34}-D_{32}|/D_{33}=0.2\%$.

In the vibrator 1 using the vibrating plate V2, pressure bonding was performed so that the 1st groove region of FIG. 8A was arranged so as to be closest to the detection phase electrode 10233. In this case, the relationship of the center depths of the 63rd, 1st, and 2nd groove regions was $|D_2-D_{63}|/D_1=0.5\%$.

In the vibrator 1 using the vibrating plate V3, pressure bonding was performed so that the 55th groove region of FIG. 8C was arranged so as to be closest to the detection phase electrode 10233. In this case, the relationship of the center depths of the 54th, 55th, and 56th groove regions was $|D_{56}-D_{54}|/D_{55}=1.3\%$.

(Evaluation of Unnecessary Vibration Wave at Resonant Frequency of Vibrator)

The resonant frequency of the vibrator 1 of the present invention obtained in each of the above-mentioned manufacturing examples was measured, to thereby determine the number of bending vibration waves to be generated, and a difference from the vibrator for comparison was evaluated.

The resonant frequency was measured for each drive phase electrode (phase A and phase B) 10231. First, in order to apply an alternating voltage to only the phase A electrode, the phase B electrode and the detection phase electrode 10233 were short-circuited to the non-drive phase electrode 10232 through use of the connector region of the flexible printed board 3, and the short-circuited region was connected through wiring to a ground side of an external power source for evaluation. An alternating voltage having a variable frequency and an amplitude of 1 V was applied to the phase A electrode, to thereby measure an impedance at room temperature. The frequency was changed from a high frequency side, for example, 50 kHz to a low frequency side, for example, 1 Hz. Then, the phase A electrode and the detection phase electrode 10233 were short-circuited to the non-drive phase electrode 10232, and an alternating voltage was applied to only the phase B electrode. Then, frequency dependence of an impedance was similarly measured.

Figure 17A:
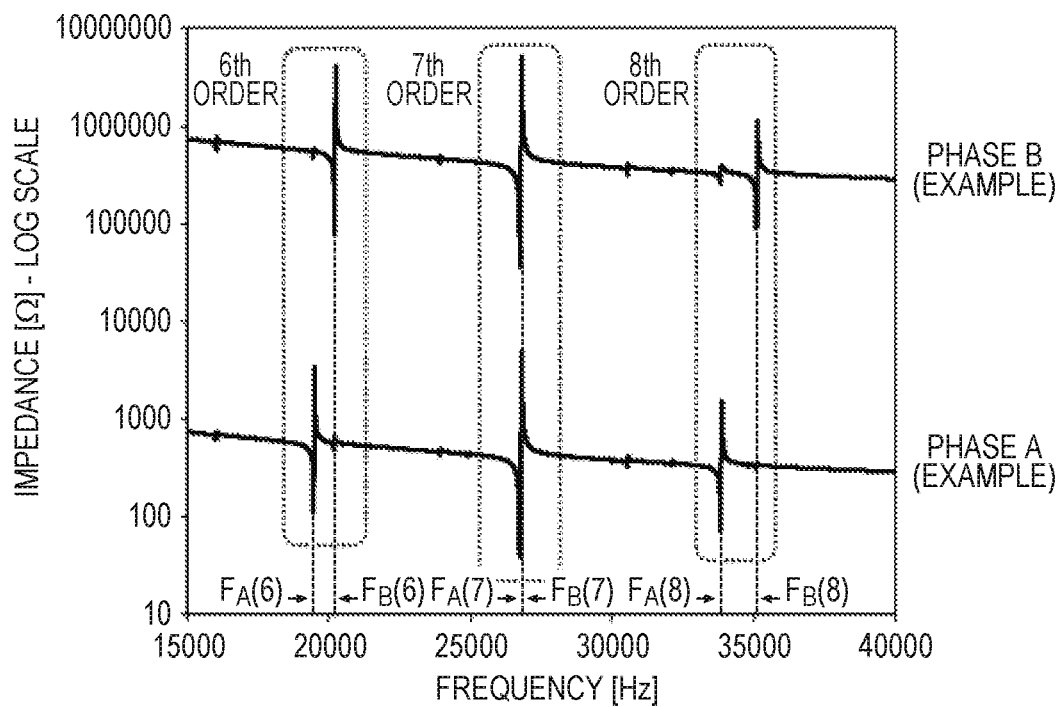
FIG. 17A and FIG. 17B are each a graph for showing an example of an impedance curve obtained by performing measurement in a phase A and a phase B in a vibrator according to Example of the present invention and a vibrator according to Comparative Example of the present invention.
Figure 17B:
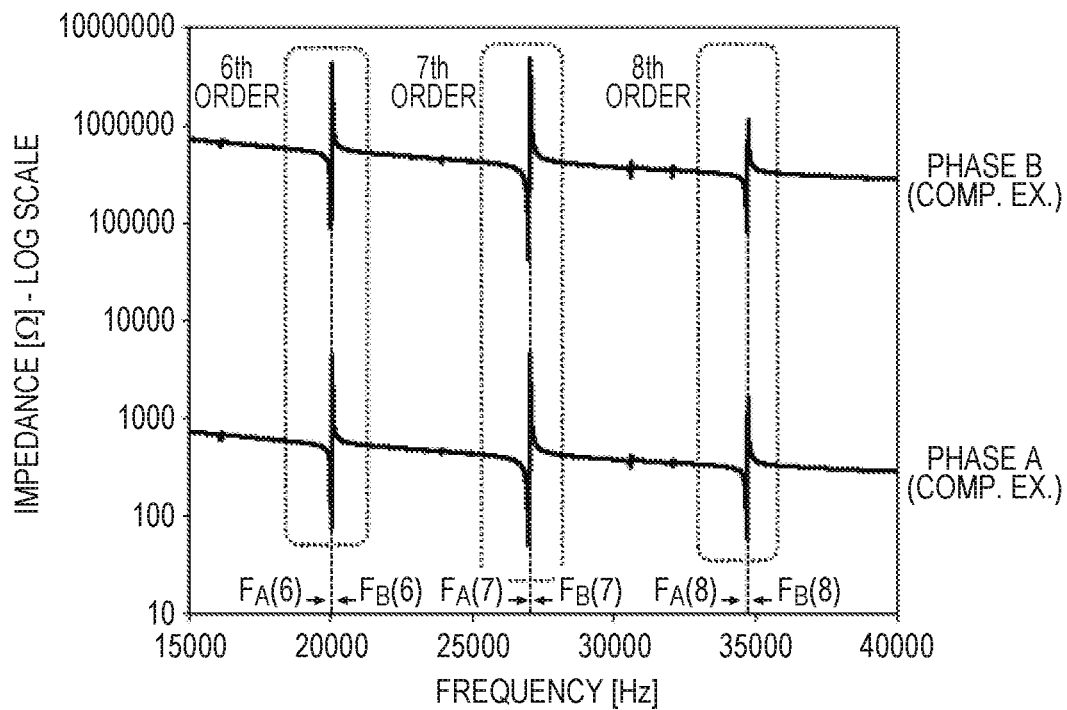

FIG. 17A is a graph for showing an example of an impedance curve at room temperature of the vibrator 1 of the present invention, and FIG. 17B is a graph for showing an example of an impedance curve at room temperature of the vibrator for comparison. FIG. 17A is a graph for showing impedance measurement results of the vibrator 1 using the vibrating plate V1A in the BCTZ-based piezoelectric ceramics, and FIG. 17B is a graph for showing impedance measurement results of the vibrator for comparison using the vibrating plate V1R in the BCTZ-based piezoelectric ceramics. In the vibrators 1 of the present invention obtained by the other combinations, an impedance curve having a shape similar to that of FIG. 17A was obtained. In the vibrators for comparison obtained by the other combinations, an impedance curve having a shape similar to that of FIG. 17B was obtained.

The impedance measurement was performed from 50 kHz to 1 Hz, but in FIG. 17A and FIG. 17B, the results from 15 kHz to 40 kHz at which characteristic peaks appear are shown in an enlarged manner. In order to eliminate the overlapping of the curves, the impedance of the phase B is corrected by 1,000 times. A plurality of steep peaks observed in the impedance curves of FIG. 15A and FIG. 15B are peaks corresponding to the generation of the 6th order, 7th order, and 8th order standing waves caused by resonance. A local minimum value of the downward peak is defined as a resonant frequency. The number of waves corresponding to each peak is understood by observing a displacement of the surface of the annular vibrator 1 actually through use of a laser displacement gauge.

In the vibrators for comparison using the vibrating plate V1R or V3R in which the center depth of the groove regions did not change as in FIG. 17B, the 6th order, 7th order, and 8th order resonant frequencies were matched between the impedance curves measured respectively in the phase A and the phase B. That is, it was found that, when the phase A standing wave and the phase B standing wave are combined, the 6th order and 8th order unnecessary propagating waves other than the desired 7th order propagating wave are also generated.

Meanwhile, in the vibrators of the present invention using the vibrating plates V1A, V1B, V2, and V3 in which the center depth of the groove regions changed in accordance with the present invention as shown in FIG. 17A, the desired 7th order resonant frequency was matched between the impedance curves measured respectively in the phase A and the phase B, but the 6th order and 8th order unnecessary resonant frequencies indicated different peak positions. That is, it was found that, when the phase A standing wave and the phase B standing wave are combined, the generation of the 6th order and 8th order unnecessary propagating waves is suppressed with respect to the generation of the desired 7th order propagating wave.

Here, a separation degree $F_{res}(n)$ (unit: %) of the frequencies in the phase A and the phase B with respect to the n-th order resonant frequency is defined by the following expression (2).

$$F_{res}(n) = \left| \frac{2(F_A(n) - F_B(n))}{F_A(n) + F_B(n)} \right| \times 100 \quad \text{Expression 2}$$

In the expression (2), $F_A(n)$ represents the n-th order resonant frequency in the impedance curve obtained by applying an alternating voltage to only the phase A electrode. Similarly, $F_B(n)$ represents the n-th order resonant frequency in the impedance curve measured in the phase B electrode.

The results of $F_{res}(n)$ in the vibrator 1 of the present invention and the vibrator for comparison are shown in Table 3.

TABLE 3

| Implementation number | Vibrating plate | Composition of piezoelectric ceramics | $F_{res}(6)$ [%] | $F_{res}(7)$ [%] | $F_{res}(8)$ [%] |
|---|---|---|---|---|---|
| 1 | V1A | KNN-based | 3.6 | 0 | 3.6 |
| 2 | V1A | BCTZ-based | 3.8 | 0 | 3.7 |
| 3 | V1A | BCT-based | 3.7 | 0 | 3.7 |
| 4 | V1A | NN-BT-based | 3.8 | 0 | 3.8 |
| 5 | V1B | KNN-based | 3.6 | 0 | 3.6 |
| 6 | V1B | BCTZ-based | 3.7 | 0 | 3.8 |
| 7 | V1B | BCT-based | 3.7 | 0 | 3.7 |
| 8 | V1B | NN-BT-based | 3.8 | 0 | 3.8 |
| 9 | V2 | KNN-based | 3.5 | 0 | 3.5 |
| 10 | V2 | BCTZ-based | 3.7 | 0 | 3.7 |
| 11 | V2 | BCT-based | 3.6 | 0 | 3.6 |
| 12 | V2 | NN-BT-based | 3.7 | 0 | 3.7 |
| 13 | V3 | KNN-based | 3.5 | 0 | 3.5 |
| 14 | V3 | BCTZ-based | 3.6 | 0 | 3.6 |
| 15 | V3 | BCT-based | 3.5 | 0 | 3.5 |
| 16 | V3 | NN-BT-based | 3.6 | 0 | 3.6 |
| *1 | V1R | KNN-based | 0 | 0 | 0 |
| *2 | V1R | BCTZ-based | 0 | 0 | 0 |
| *3 | V1R | BCT-based | 0 | 0 | 0 |
| *4 | V1R | NN-BT-based | 0 | 0 | 0 |
| *5 | V3R | KNN-based | 0 | 0 | 0 |
| *6 | V3R | BCTZ-based | 0 | 0 | 0 |
| *7 | V3R | BCT-based | 0 | 0 | 0 |
| *8 | V3R | NN-BT-based | 0 | 0 | 0 |

(Note)
Measurement results at room temperature (20° C.) Implementation numbers denoted with a star mark (*) represent comparative examples.

(Manufacturing Example of Moving Member)

The annular moving member 2 was manufactured so as to be used in the ultrasonic motor of the present invention and the ultrasonic motor for comparison.

An annular moving member having an outer diameter of 60 mm, an inner diameter of 56 mm, and a thickness of 5 mm was manufactured for the vibrating plates V1A, V1B, V2, and V1R.

An annular moving member having an outer diameter of 86 mm, an inner diameter of 81 mm, and a thickness of 5 mm was manufactured for the vibrating plates V3 and V3R.

An aluminum metal was used as a material for the moving member, and was shaped by block machining. Then, the surface was subjected to alumite treatment.

(Manufacturing Example and Comparative Example of Ultrasonic Motor)

As illustrated in FIG. 1A and FIG. 2, the moving member 2 adjusted to the size of the vibrating plate 101 was brought into pressure-contact with the second surface of the vibrator 1 of the present invention, to thereby manufacture the ultrasonic motor of the present invention. Similarly, the ultrasonic motor for comparison was manufactured.

(Manufacturing Example and Comparative Example of Drive Control System)

The drive phase electrodes 10231, the non-drive phase electrodes 10232 short-circuited to the common electrode 1022, and the detection phase electrode 10233 in the ultrasonic motor of the present invention were electrically connected to an external drive circuit through use of the connector region of the flexible printed board 3, to thereby manufacture the drive control system of the present invention having the configuration as illustrated in FIG. 11. The external drive circuit includes a control unit configured to drive the ultrasonic motor and a signal generation unit configured to output an alternating voltage for generating a 7th order bending vibration wave in response to an instruction of the control unit.

Similarly, a drive control system for comparison was manufactured.

The drive control system of the present invention and the drive control system for comparison were subjected to a drive test. A load of 150 gf·cm was applied to the moving member 2, and an alternating voltage having an amplitude of 70 V was applied to the phase A and the phase B. The frequency was changed from 50 kHz to 15 kHz so that the same frequency was applied with a temporal phase difference of π/2 in any of the drive control systems in the phase A and the phase B. As a result, equivalent rotation drive was observed in any rotation direction, and abnormal noise was not generated during rotation drive. After the test, the moving member 2 was removed, and the shapes of the protrusion regions 1011 of the vibrating plate 101 were checked. No loss caused by abrasion was observed.

Meanwhile, in the drive control system for comparison, abnormal noise was generated during rotation drive.

(Manufacturing Example of Optical Apparatus)

The optical apparatus illustrated in FIG. 12A, FIG. 12B, and FIG. 13 was manufactured through use of the drive control system of the present invention, and an autofocus operation in accordance with the application of an alternating voltage was confirmed.

According to the present invention, there can be provided an ultrasonic motor configured to rotate a moving member with a 7th order bending vibration wave, in which a sufficient drive speed is exhibited even when lead-free piezoelectric ceramics having high environmental safety is used, and generation of abnormal noise is suppressed, a drive control system and an optical apparatus that use the ultrasonic motor, and a vibrator to be used in the ultrasonic motor.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2015-231915, filed Nov. 27, 2015, which is hereby incorporated by reference herein in its entirety.

What is claimed is:

1. An ultrasonic motor, comprising:
an annular vibrator; and
an annular contact member,
wherein the annular vibrator comprises:
an annular vibrating plate brought into contact with the annular contact member; and
a piezoelectric element including a piezoelectric ceramic piece,
wherein the annular vibrating plate includes groove regions extending radially in X portions, and when an outer diameter of the annular vibrating plate is set to 2R in units of mm, X is a natural number satisfying 2R−10≤X≤2R+5,
wherein a ratio between an average value $L_{top}$ of a length in a circumferential direction on an outer diameter side of a wall region that separates the adjacent groove regions from each other and an average value $L_{btm}$ of a length in a circumferential direction on an outer diameter side of the groove regions falls within a range of 1.45≤$L_{top}$/$L_{btm}$≤2.86, and
wherein, when center depths of the groove regions in the X portions are represented by $D_1$ to $D_X$ in order in the circumferential direction, $D_1$ to $D_X$ take five or more different values.

2. An ultrasonic motor according to claim 1, wherein the piezoelectric ceramic piece has a Young's modulus at room temperature of 80 GPa or more and 145 GPa or less.

3. An ultrasonic motor according to claim 1, wherein $D_1$ to $D_X$ have a difference between a maximum center depth and a minimum center depth of 5% or more and 25% or less with respect to a maximum thickness $T_{dia}$ of the annular vibrating plate.

4. An ultrasonic motor according to claim 1, wherein $D_1$ to $D_X$ have a standard center depth $D_{ave}$ of 25% or more and 50% or less with respect to a maximum thickness $T_{dia}$ of the annular vibrating plate.

5. An ultrasonic motor according to claim 1,
wherein the piezoelectric ceramic piece has an annular shape and the piezoelectric element further includes:
a common electrode arranged on a surface of the annular piezoelectric ceramic piece opposed to the annular vibrating plate so as to be sandwiched between the annular piezoelectric ceramic piece and the annular vibrating plate; and
a plurality of electrodes arranged on a surface of the annular piezoelectric ceramic piece on a side opposite to the surface on which the common electrode is arranged, the plurality of electrodes comprising two drive phase electrodes, one or more non-drive phase electrodes, and one or more detection phase electrodes, and
wherein, when a length of one arc, which is obtained by dividing a circumference of a circle that passes through an arbitrary position on a surface of the piezoelectric element and shares a center with the piezoelectric element by seven, is represented by λ and a circumferential length of the circle is represented by 7λ, the two drive phase electrodes each have a circumferential length of 3λ, and are separated from each other in the circumferential direction by two spacing regions respectively having lengths of λ/4 and 3λ/4 in the circumferential direction, the annular piezoelectric ceramic piece in a region in contact with each of the drive phase electrodes comprises six polarized regions in which polarity is reversed alternately in the circumferential direction, and the one or more non-drive phase electrodes and the one or more detection phase electrodes are arranged in the two spacing regions.

6. An ultrasonic motor according to claim 5, wherein the annular piezoelectric ceramic piece has an outer diameter smaller than the outer diameter of the annular vibrating plate, and the annular piezoelectric ceramic piece has an inner diameter larger than an inner diameter of the annular vibrating plate.

7. An ultrasonic motor according to claim 5, wherein, when a center depth of the groove region closest to the one or more detection phase electrodes is represented by $D_{sen}$, where sen represents a natural number and 1≤sen≤X, |$D_{sen+1}$−$D_{sen-1}$|/$D_{sen}$ is 5% or less.

8. An ultrasonic motor according to claim 1, wherein the outer diameter 2R of the annular vibrating plate is 90 mm or less.

9. An ultrasonic motor according to claim 1, wherein the annular vibrating plate has an inner diameter $2R_{in}$ in units of mm, which satisfies 2R−16≤$2R_{in}$≤2R−6.

10. An ultrasonic motor according to claim 1, wherein the annular vibrating plate has a maximum thickness $T_{dia}$ of 4 mm or more and 6 mm or less.

11. An ultrasonic motor according to claim 1, wherein the annular vibrating plate is made of an alloy containing 50 mass % or more of steel and 10.5 mass % or more of chromium.

12. An ultrasonic motor according to claim 1, wherein X satisfies a relationship: $50 \leq X \leq 70$.

13. An ultrasonic motor according to claim 1, wherein a corner of a top surface of at least one of the wall regions at a border position in the circumferential direction is cut off.

14. An ultrasonic motor according to claim 1, wherein, when a maximum length is represented by $L_{max}$ and a minimum length is represented by $L_{min}$ in the circumferential direction on an outer peripheral side of the groove regions or an outer peripheral side of the wall regions,
a ratio of the maximum length $L_{max}$ to the minimum length $L_{min}$ satisfies a relationship: $1 < L_{max}/L_{min} \leq 2$.

15. An ultrasonic motor according to claim 1,
wherein the piezoelectric ceramic piece comprises a perovskite type metal oxide represented by any of the following general formulae (1) to (3) as a main component, and a content of metal components other than the main component contained in the piezoelectric ceramic piece is 1 part by weight or less in terms of a metal with respect to 100 parts by weight of the perovskite type metal oxide:

$$\{M_h(Na_jLi_kK_{1-j-k})_{1-h}\}_{1-m}\{(Ti_{1-u-v}Zr_uHf_v)_h(Nb_{1-w}Ta_w)_{1-h}\}O_3 \quad (1)$$

where M represents at least one kind selected from the group consisting of $(Bi_{0.5}K_{0.5})$, $(Bi_{0.5}Na_{0.5})$, $(Bi_{0.5}Li_{0.5})$, Ba, Sr, and Ca, and $0 \leq h \leq 0.3$, $0 \leq j \leq 1$, $0 \leq k \leq 0.3$, $0 \leq j+k \leq 1$, $0 < u \leq 1$, $0 \leq v \leq 0.75$, $0 \leq w \leq 0.2$, $0 < u+v \leq 1$, $-0.06 \leq m \leq 0.06$;

$$(Ba_{1-s}Ca_s)_\alpha(Ti_{1-t}Zr_t)O_3 \quad (2)$$

where $0.986 \leq \alpha \leq 1.100$, $0.02 \leq s \leq 0.30$, $0 \leq t \leq 0.095$;

$$(Na_qBa_{1-r})(Nb_rTi_{1-r})O_3 \quad (3)$$

where $0.80 \leq q \leq 0.95$, $0.85 \leq r \leq 0.95$.

16. An ultrasonic motor according to claim 1, wherein the center depths of the groove regions change so as to follow a curve obtained by superimposing one or more sine waves on one another, the groove regions reaching a local maximum depth in 12 or more and 16 or less regions and the center depths of the groove regions reaching a local minimum depth in 12 or more and 16 or less regions.

17. An ultrasonic motor according to claim 16, wherein X represents an even number, and of $D_1$ to $D_X$, a center depth change of $D_1$ to $D_{X/2}$ and a center depth change of $D_{X/2+1}$ to $D_X$ are matched with each other.

18. An ultrasonic motor according to claim 16, wherein the groove regions reaching the local maximum depth and the groove regions reaching the local minimum depth are not adjacent to each other.

19. An ultrasonic motor according to claim 1, wherein the outer diameter 2R is greater than 55 mm and equal to or less than 90 mm.

20. An ultrasonic motor according to claim 1, wherein the piezoelectric ceramic piece contains lead in a content of less than 1,000 ppm.

21. A drive control system, comprising at least an ultrasonic motor and a drive circuit electrically connected to the ultrasonic motor, the ultrasonic motor comprising:
an annular vibrator; and
an annular contact member,
wherein the annular vibrator comprises:
an annular vibrating plate brought into contact with the contact member; and
a piezoelectric element including a piezoelectric ceramic piece,
wherein the annular vibrating plate includes groove regions extending radially in X portions, and when an outer diameter of the annular vibrating plate is set to 2R in units of mm, X is a natural number satisfying $2R-10 \leq X \leq 2R+5$,
wherein a ratio between an average value $L_{top}$ of a length in a circumferential direction on an outer diameter side of a wall region that separates the adjacent groove regions from each other and an average value $L_{btm}$ of a length in a circumferential direction on an outer diameter side of the groove regions falls within a range of $1.45 \leq L_{top}/L_{btm} \leq 2.86$, and
wherein, when center depths of the groove regions in the X portions are represented by $D_1$ to $D_X$ in order in the circumferential direction, $D_1$ to $D_X$ take five or more different values.

22. A drive control system according to claim 21, wherein the drive circuit comprises a signal generation unit configured to generate a 7th order bending vibration wave in the annular vibrator.

23. An optical apparatus comprising at least an ultrasonic motor, a drive circuit electrically connected to the ultrasonic motor, and an optical element dynamically connected to the ultrasonic motor, the ultrasonic motor comprising:
an annular vibrator; and
an annular contact member,
wherein the annular vibrator comprises:
an annular vibrating plate brought into contact with the contact member; and
a piezoelectric element including a piezoelectric ceramic piece,
wherein the annular vibrating plate includes groove regions extending radially in X portions, and when an outer diameter of the annular vibrating plate is set to 2R in units of mm, X is a natural number satisfying $2R-10 \leq X \leq 2R+5$,
wherein a ratio between an average value $L_{top}$ of a length in a circumferential direction on an outer diameter side of a wall region that separates the adjacent groove regions from each other and an average value $L_{btm}$ of a length in a circumferential direction on an outer diameter side of the groove regions falls within a range of $1.45 \leq L_{top}/L_{btm} \leq 2.86$,
wherein, when center depths of the groove regions in the X portions are represented by $D_1$ to $D_X$ in order in the circumferential direction, $D_1$ to $D_X$ take five or more different values, and
wherein the drive circuit comprises a signal generation unit configured to generate a 7th order bending vibration wave in the annular vibrator.

24. An annular vibrator, comprising:
an annular vibrating plate; and
a piezoelectric element including a piezoelectric ceramic piece,
wherein the annular vibrating plate includes groove regions extending radially in X portions, and when the outer diameter of the annular vibrating plate is set to 2R in units of mm, X is a natural number satisfying $2R-10 \leq X \leq 2R+5$,
wherein a ratio between an average value $L_{top}$ of a length in a circumferential direction on an outer peripheral side of a wall region that separates the adjacent groove regions from each other and an average value $L_{btm}$ of a length in a circumferential direction on an outer peripheral side of the groove regions falls within a range of $1.45 \leq L_{top}/L_{btm} \leq 2.86$, and wherein, when center depths of the groove regions in the X portions are represented by $D_1$ to $D_X$ in order in the circumferential direction, $D_1$ to $D_X$ take five or more different values.

* * * * *